(12) United States Patent
Erchak et al.

(10) Patent No.: US 8,426,872 B2
(45) Date of Patent: Apr. 23, 2013

(54) LIGHT EMITTING DIODE SYSTEMS INCLUDING OPTICAL DISPLAY SYSTEMS HAVING A MICRODISPLAY

(75) Inventors: Alexei A. Erchak, Cambridge, MA (US); Elefterios Lidorikis, Newton, MA (US)

(73) Assignee: Luminus Devices, Inc., Billerica, MA (US)

( * ) Notice: Subject to any disclaimer, the term of this patent is extended or adjusted under 35 U.S.C. 154(b) by 0 days.

(21) Appl. No.: 13/155,795

(22) Filed: Jun. 8, 2011

(65) Prior Publication Data

US 2011/0303926 A1 Dec. 15, 2011

Related U.S. Application Data

(63) Continuation of application No. 11/208,419, filed on Aug. 19, 2005, now abandoned.

(60) Provisional application No. 60/603,087, filed on Aug. 20, 2004, provisional application No. 60/605,733, filed on Aug. 31, 2004.

(51) Int. Cl.
*H01L 33/20* (2010.01)

(52) U.S. Cl.
USPC ............... 257/79; 257/13; 257/80; 257/82; 257/89; 257/93; 257/777; 257/778

(58) Field of Classification Search ........ 257/13, 257/79, 80, 82, 89, 93, 777, 778
See application file for complete search history.

(56) References Cited

U.S. PATENT DOCUMENTS

| | | |
|---|---|---|
| 3,293,513 A | 12/1966 | Biard et al. |
| 3,739,217 A | 6/1973 | Bergh |
| 3,922,706 A | 11/1975 | Kaiser |
| 4,864,370 A | 9/1989 | Gaw et al. |
| 5,126,231 A | 6/1992 | Levy |
| 5,132,751 A | 7/1992 | Shibata et al. |
| 5,162,878 A | 11/1992 | Sasagawa et al. |
| 5,359,345 A | 10/1994 | Hunter et al. |
| 5,363,009 A | 11/1994 | Monto |
| 5,376,580 A | 12/1994 | Kish et al. |
| 5,426,657 A | 6/1995 | Vakhshoori |
| 5,491,350 A | 2/1996 | Unno et al. |
| 5,528,057 A | 6/1996 | Yanagase |
| 5,631,190 A | 5/1997 | Negley et al. |

(Continued)

FOREIGN PATENT DOCUMENTS

| | | |
|---|---|---|
| WO | WO 98/14986 | 4/1998 |
| WO | WO 02/41406 | 5/2002 |
| WO | WO 02/089221 | 7/2002 |
| WO | WO 02/071450 | 9/2002 |

OTHER PUBLICATIONS

Boroditsky et al. "Light extraction from optically pumped light-emitting diode by thin-slab photonic crystals," Appl. Phys. Lett. 75 (8), Aug. 23, 1999, pp. 1036-1038.

(Continued)

*Primary Examiner* — Marc Armand
(74) *Attorney, Agent, or Firm* — Wolf, Greenfield & Sacks, P.C.

(57) ABSTRACT

Light emitting diode systems are disclosed.

18 Claims, 41 Drawing Sheets

U.S. PATENT DOCUMENTS

| | | | |
|---|---|---|---|
| 5,633,527 A | 5/1997 | Lear | |
| 5,724,062 A | 3/1998 | Hunter et al. | |
| 5,779,924 A | 7/1998 | Krames et al. | |
| 5,814,839 A | 9/1998 | Hosoba | |
| 5,831,708 A | 11/1998 | Hiraishi et al. | |
| 5,834,331 A | 11/1998 | Razeghi | |
| 5,932,327 A | 8/1999 | Inoguchi et al. | |
| 5,955,749 A * | 9/1999 | Joannopoulos et al. | 257/98 |
| 6,071,795 A | 6/2000 | Cheung et al. | |
| 6,072,628 A | 6/2000 | Sarayeddine | |
| 6,091,085 A | 7/2000 | Lester | |
| 6,122,103 A | 9/2000 | Perkins et al. | |
| 6,222,207 B1 | 4/2001 | Carter-Coman et al. | |
| 6,265,820 B1 | 7/2001 | Ghosh et al. | |
| 6,287,882 B1 | 9/2001 | Chang et al. | |
| 6,288,840 B1 | 9/2001 | Perkins et al. | |
| 6,291,339 B1 | 9/2001 | Avanzino et al. | |
| 6,303,405 B1 | 10/2001 | Yoshida et al. | |
| 6,335,548 B1 | 1/2002 | Roberts et al. | |
| 6,340,824 B1 | 1/2002 | Komoto | |
| 6,388,264 B1 | 5/2002 | Pace | |
| 6,410,348 B1 | 6/2002 | Chen et al. | |
| 6,410,942 B1 | 6/2002 | Thibeault et al. | |
| 6,420,242 B1 | 7/2002 | Cheung et al. | |
| 6,426,515 B2 | 7/2002 | Ishikawa et al. | |
| 6,465,808 B2 | 10/2002 | Lin | |
| 6,468,824 B2 | 10/2002 | Chem | |
| 6,469,324 B1 | 10/2002 | Wang | |
| 6,504,180 B1 | 1/2003 | Heremans et al. | |
| 6,522,063 B2 | 2/2003 | Chen et al. | |
| 6,534,798 B1 | 3/2003 | Scherer et al. | |
| 6,559,075 B1 | 5/2003 | Kelly et al. | |
| 6,573,537 B1 | 6/2003 | Steigerwald et al. | |
| 6,574,383 B1 | 6/2003 | Erchak et al. | |
| 6,593,160 B2 | 7/2003 | Carter-Coman et al. | |
| 6,614,056 B1 | 9/2003 | Tarsa et al. | |
| 6,627,521 B2 | 9/2003 | Furukawa | |
| 6,642,618 B2 | 11/2003 | Yagi | |
| 6,649,437 B1 | 11/2003 | Yang et al. | |
| 6,657,236 B1 | 12/2003 | Thibeault et al. | |
| 6,661,028 B2 | 12/2003 | Chen | |
| 6,661,084 B1 | 12/2003 | Peterson et al. | |
| 6,690,268 B2 | 2/2004 | Schofield et al. | |
| 6,740,906 B2 | 5/2004 | Slater, Jr. et al. | |
| 6,742,907 B2 | 6/2004 | Funamoto et al. | |
| 6,762,069 B2 | 7/2004 | Huang et al. | |
| 6,778,746 B2 | 8/2004 | Charlton et al. | |
| 6,784,027 B2 | 8/2004 | Streubel et al. | |
| 6,784,463 B2 | 8/2004 | Camras et al. | |
| 6,791,117 B2 | 9/2004 | Yoshitake | |
| 6,791,119 B2 | 9/2004 | Slater, Jr. et al. | |
| 6,791,259 B1 | 9/2004 | Stokes | |
| 6,794,684 B2 | 9/2004 | Slater, Jr. et al. | |
| 6,800,500 B2 | 10/2004 | Carter-Coman | |
| 6,812,503 B2 | 11/2004 | Lin et al. | |
| 6,818,531 B1 | 11/2004 | Yoo | |
| 6,825,502 B2 | 11/2004 | Okazaki et al. | |
| 6,828,597 B2 | 12/2004 | Wegleiter | |
| 6,828,724 B2 | 12/2004 | Burroughes | |
| 6,831,302 B2 | 12/2004 | Erchak et al. | |
| 6,847,057 B1 | 1/2005 | Gardner et al. | |
| 6,849,558 B2 | 2/2005 | Schaper | |
| 6,873,093 B2 | 3/2005 | Yu et al. | |
| 6,878,969 B2 | 4/2005 | Tanaka | |
| 6,885,035 B2 | 4/2005 | Bhat et al. | |
| 6,891,203 B2 | 5/2005 | Kozawa | |
| 6,900,587 B2 | 5/2005 | Suehiro | |
| 6,924,136 B2 | 8/2005 | Takada et al. | |
| 6,943,379 B2 | 9/2005 | Suehiro | |
| 6,946,683 B2 | 9/2005 | Sano et al. | |
| 6,956,982 B1 | 10/2005 | Heideman et al. | |
| 6,958,494 B2 | 10/2005 | Lin | |
| 6,992,718 B1 | 1/2006 | Takahara | |
| 7,152,977 B2 | 12/2006 | Ruda et al. | |
| 7,450,311 B2 | 11/2008 | Erchak et al. | |
| 7,535,645 B2 | 5/2009 | Erchak et al. | |
| 2002/0110172 A1 | 8/2002 | Hasnain et al. | |
| 2003/0111959 A1 | 6/2003 | Van de Ven et al. | |
| 2003/0117595 A1 | 6/2003 | Li et al. | |
| 2003/0141507 A1 | 7/2003 | Krames et al. | |
| 2003/0141563 A1 | 7/2003 | Wang | |
| 2003/0143772 A1 | 7/2003 | Chen | |
| 2003/0206328 A1 | 11/2003 | Evans | |
| 2003/0209714 A1 | 11/2003 | Taskar et al. | |
| 2003/0222263 A1 | 12/2003 | Choi | |
| 2004/0027062 A1 | 2/2004 | Shiang et al. | |
| 2004/0043524 A1 | 3/2004 | Huang et al. | |
| 2004/0080938 A1 | 4/2004 | Holman et al. | |
| 2004/0110856 A1 | 6/2004 | Young et al. | |
| 2004/0130263 A1 | 7/2004 | Horng | |
| 2004/0144985 A1 | 7/2004 | Zhang et al. | |
| 2004/0182914 A1 | 9/2004 | Venugopalan | |
| 2004/0206962 A1 | 10/2004 | Erchak et al. | |
| 2004/0206971 A1 | 10/2004 | Erchak et al. | |
| 2004/0207310 A1 | 10/2004 | Erchak et al. | |
| 2004/0207319 A1 | 10/2004 | Erchak et al. | |
| 2004/0207320 A1 | 10/2004 | Erchak | |
| 2004/0207323 A1 | 10/2004 | Erchak et al. | |
| 2004/0218390 A1 | 11/2004 | Holman et al. | |
| 2004/0259279 A1 | 12/2004 | Erchak et al. | |
| 2004/0259285 A1 | 12/2004 | Erchak et al. | |
| 2005/0019971 A1 | 1/2005 | Slater | |
| 2005/0040424 A1 | 2/2005 | Erchak et al. | |
| 2005/0051785 A1 | 3/2005 | Erchak et al. | |
| 2005/0051787 A1 | 3/2005 | Erchak et al. | |
| 2005/0059178 A1 | 3/2005 | Erchak et al. | |
| 2005/0059179 A1 | 3/2005 | Erchak et al. | |
| 2005/0082545 A1 | 4/2005 | Wierer | |
| 2005/0083696 A1 * | 4/2005 | Chiang et al. | 362/268 |
| 2005/0087754 A1 | 4/2005 | Erchak | |
| 2005/0087757 A1 | 4/2005 | Erchak et al. | |
| 2005/0112886 A1 | 5/2005 | Asakawa | |
| 2005/0127375 A1 | 6/2005 | Erchak et al. | |
| 2005/0205883 A1 | 9/2005 | Wierer | |
| 2006/0027815 A1 * | 2/2006 | Wierer et al. | 257/79 |

OTHER PUBLICATIONS

Bulu et al. "Highly directive radiation from sources embedded inside photonic crystals," Appl. Phys. Lett. 83 (16), Oct. 20, 2003, pp. 3263-3265.

Chen et al. "Fabrication of 50-100 nm Patterned InGaN Blue Light Emitting Heterostructures," Phys. Stat. Sol. (a), 188 (1), 2001, pp. 135-138.

Erchak et al. "Enhanced coupling to vertical radiation using a two-dimensional photonic crystal in a semiconductor light-emitting diode," Appl. Phys. Lett. 78 (5), Jan. 29, 2001, pp. 563-565.

Gourley et al. "Optical Bloch waves in a semiconductor photonic lattice," Appl. Phys. Lett_ 60 (22), Jun. 1, 1992, pp. 2714-2716.

Gourley et al. "Optical properties of two-dimensional photonic lattices fabricated as honeycomb nanostructures in compound semiconductors," Appl. Phys. Lett. 64 (6), Feb. 7, 1994, pp. 687-689.

Kelly et al. "Optical patterning of GaN films," Appl. Phys. Lett 68 (12), Sep. 16, 1996, pp. 1749-1751.

Kelly et al. "Optical process for liftoff of Group III-nitride films," Physica Status Solidi; Rapid Research Note, Nov. 28, 1996, 2 pages.

Koch et al. "1.55-μ InGaAsP distributed feedback vapor phase transported buried heterostructure lasers," Appl. Phys. Lett. 47 (1), Jul. 1, 1985, pp. 12-14.

Köck et al., "Novel surface emitting GaAs/AlGaAs laser diodes based on surface mode emission," Appl. Phys. Lett. 63 (9), Aug. 30, 1993, pp. 1164-1166.

Köck et al. "Strongly directional emission from AlGaAs/GaAs light-emitting diodes," Appl. Phys. Lett. 57 (22), Nov. 26, 1990, pp. 2327-2329.

Krames et al. "Introduction to the Issue on High-Efficiency Light-Emitting Diodes," IEEE Journal on selected topic in quantum electronics, vol. 8, No. 2 Mar./Apr. 2002, pp. 185-188.

Lee et al. "A high-extraction-efficiency nanopatterned organic light-emitting diode," Appl. Phys. Lett. 82(21), May 26, 2003, pp. 3779-3781.

Oder et al. "III-nitride photonic crystals", Appl. Phys. Lett. 83 (6), Aug. 11, 2003, pp. 1231-1233.

Okai et al. "Novel method to fabricate corrugation for a X/4-shifted distributed feedback laser using a grinting photomask," Appl. Phys. Left. 55(5), Jul. 31, 1989, pp. 415-417.

Rattier et al. "Omnidirectional and compact guided light extraction from Archimedean photonic lattices," Appl. Phys. Lett. 83 (7), Aug. 18, 2003, pp. 1283-1285.

Schnitzer et al. "30% external quantum efficiency from surface textured, thin-film light-emitting diodes," Appl. Phys. Left. 63 (18), Oct. 18, 1993, pp. 2174-2176.

Streubel et al.. "High Brightness AlGaInP Light-Emitting Diodes," IEEE Journal on selected topic in quantum electronics, vol. 8, No. 2, Mar./Apr. 2002, pp. 321-332.

Tsang et al. "Semiconductor distributed feedback lasers with quantum well or superlattice grating for index or gain-coupled optical feedback," Appl. Phys. Lett. 60 (21), May 25, 1992, pp. 258-2582.

Wendt et al. "Nanofabrication of photonic lattice structures in GaAs/AlGaAs," J.Vac. Sci. Technol. B 11(6), Nov./Dec. 1993, pp. 2637-2640.

Wong et al. "Damage-free separation of GaN thin films from sapphire substrates," Appl. Phys. Lett. 72 (5), Feb. 2, 1998, pp. 599-601.

Zelsmann et al. "Seventy-fold enhancement of light extraction from a defectless photonic crystal made on silicon-on-insulator," Appl. Phys. Lett. 83 (13), Sep. 29, 2003, pp. 2542-2544.

* cited by examiner

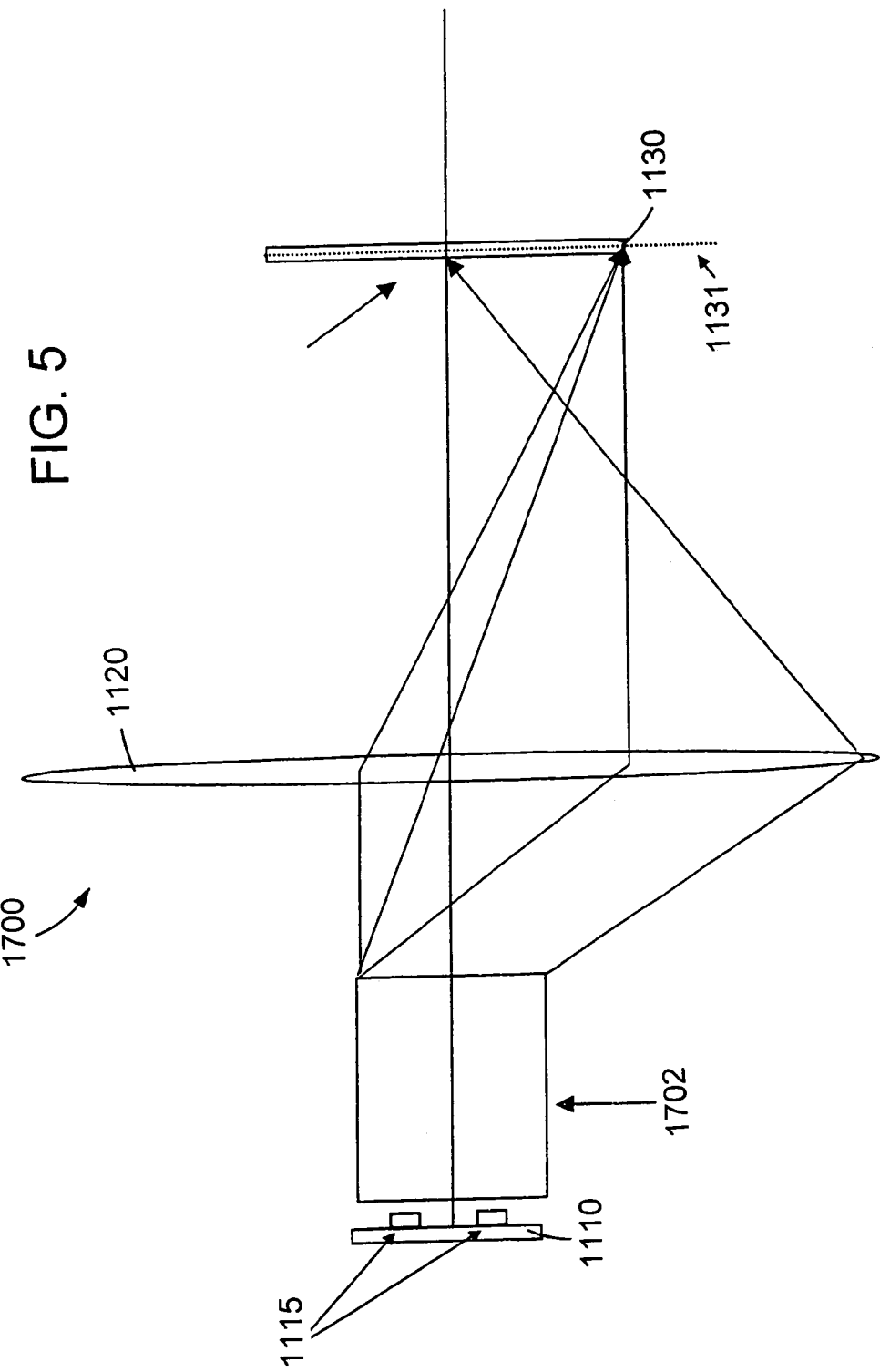

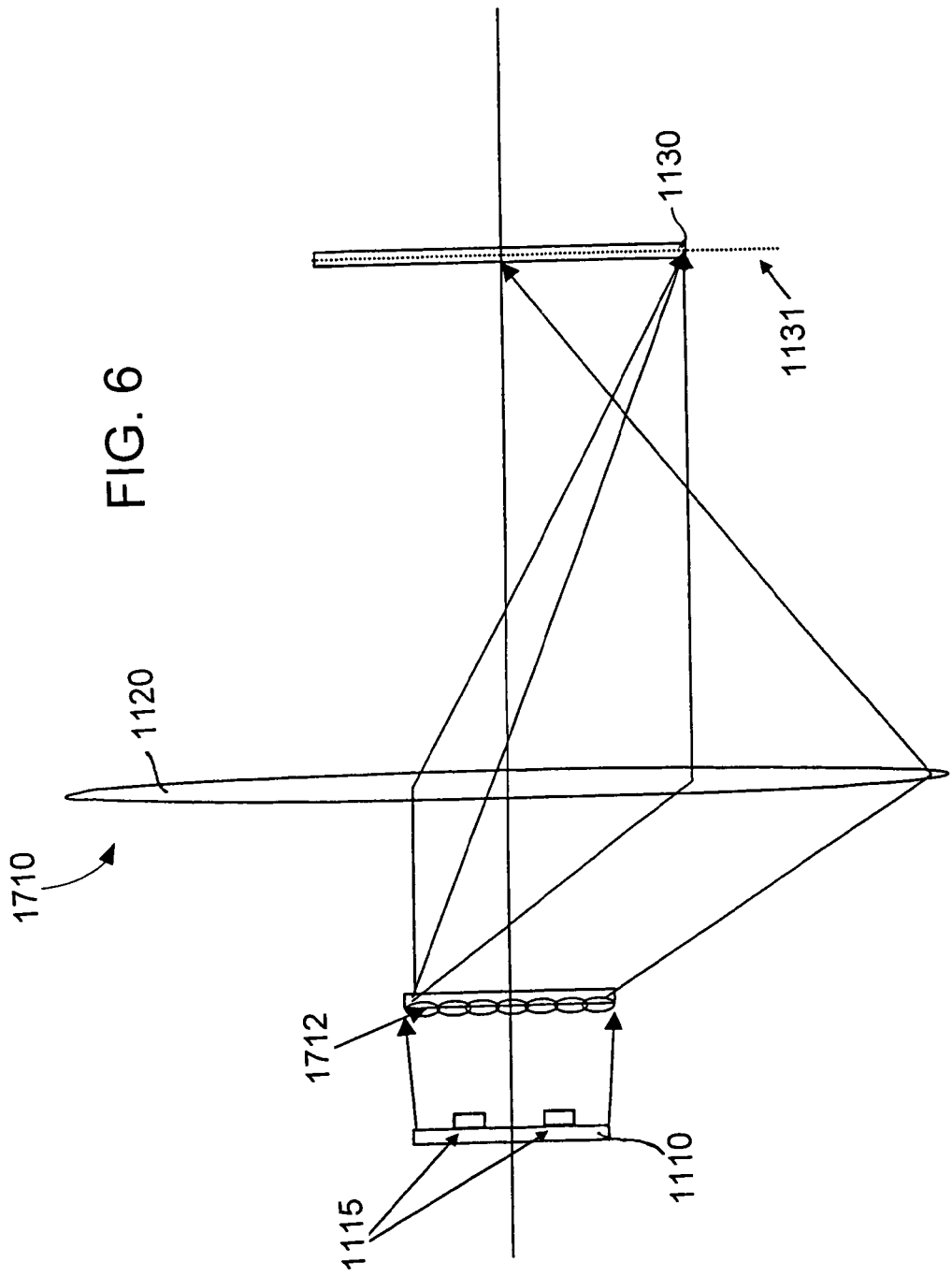

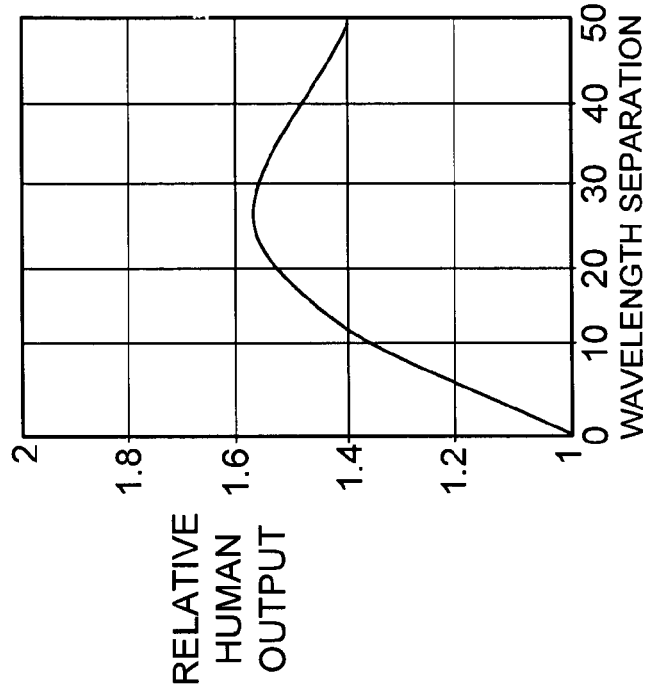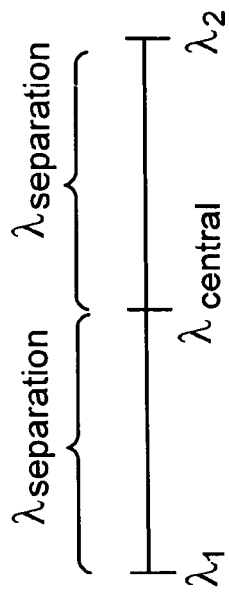
FIG. 12A    FIG. 12B
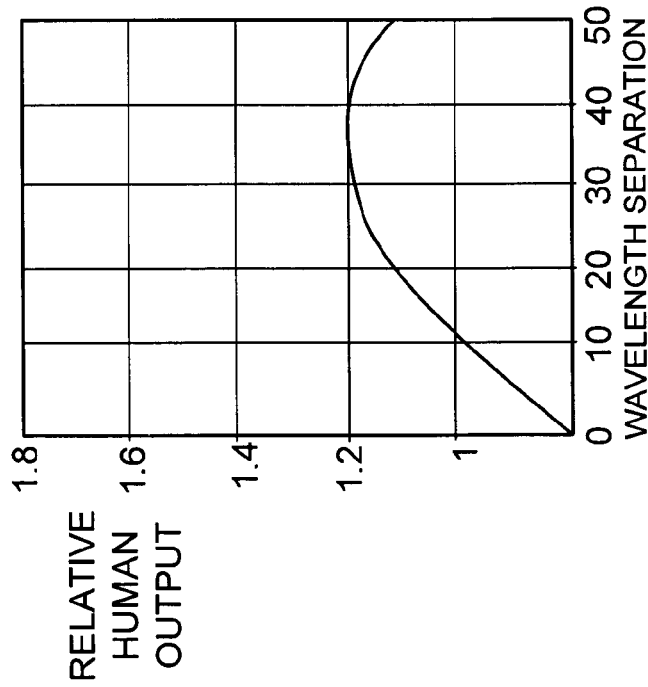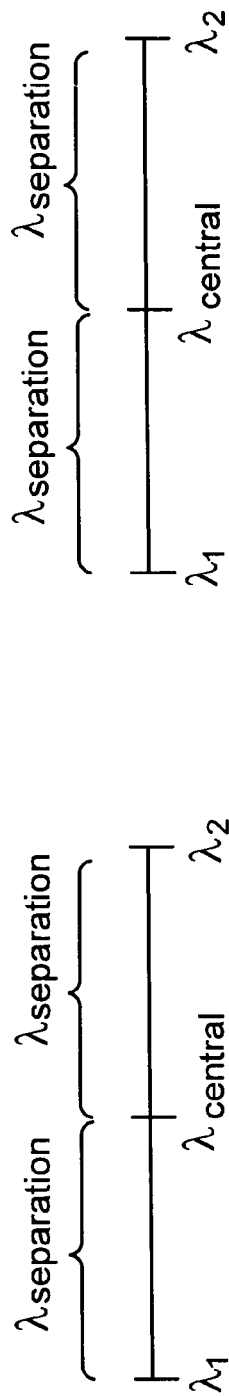
FIG. 11A    FIG. 11B

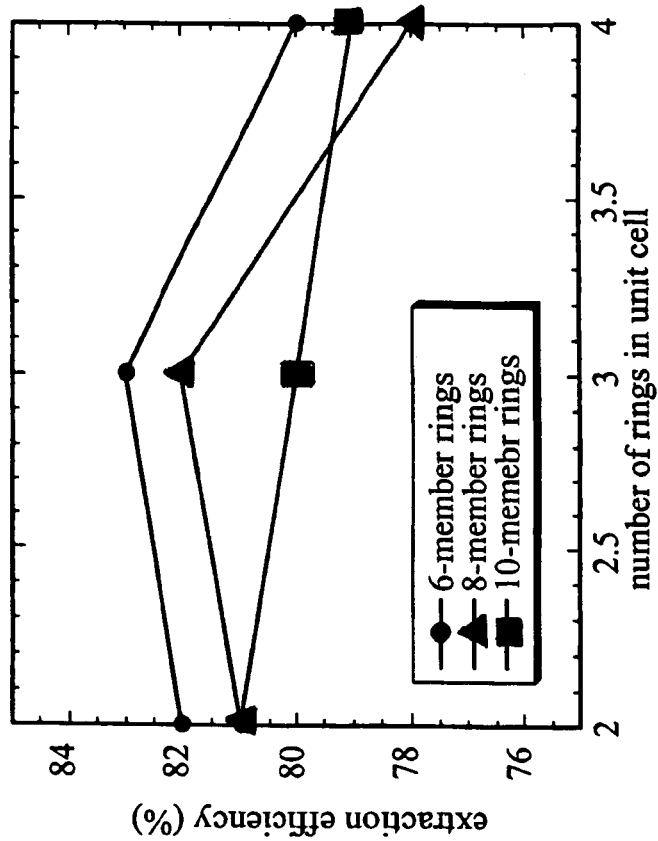
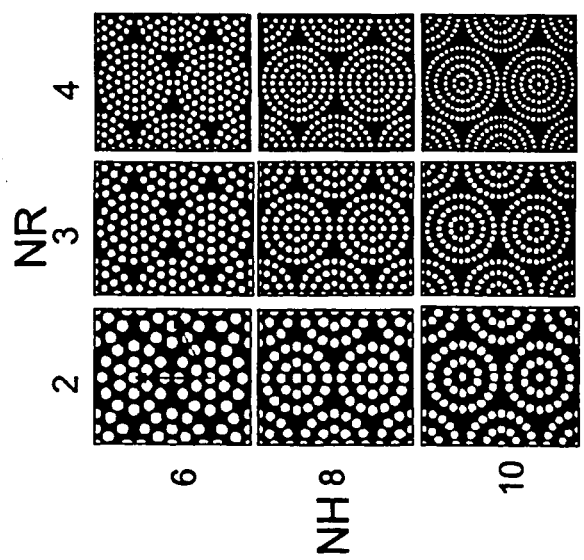
FIG. 24

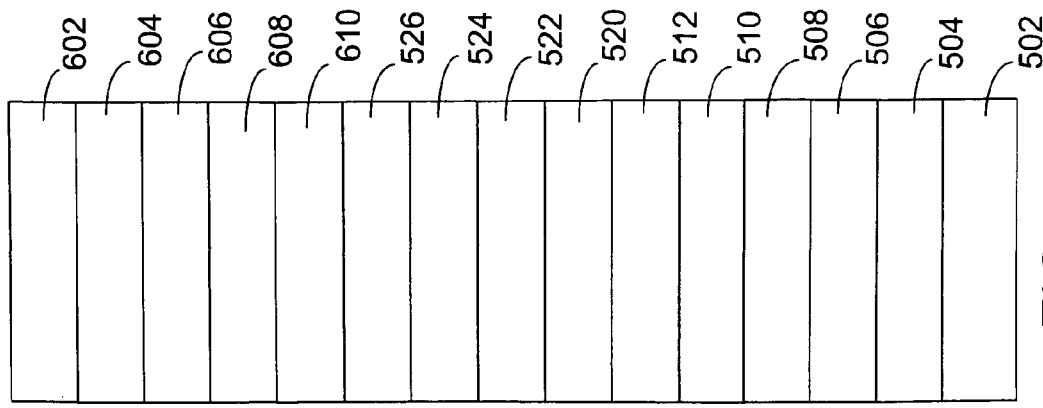
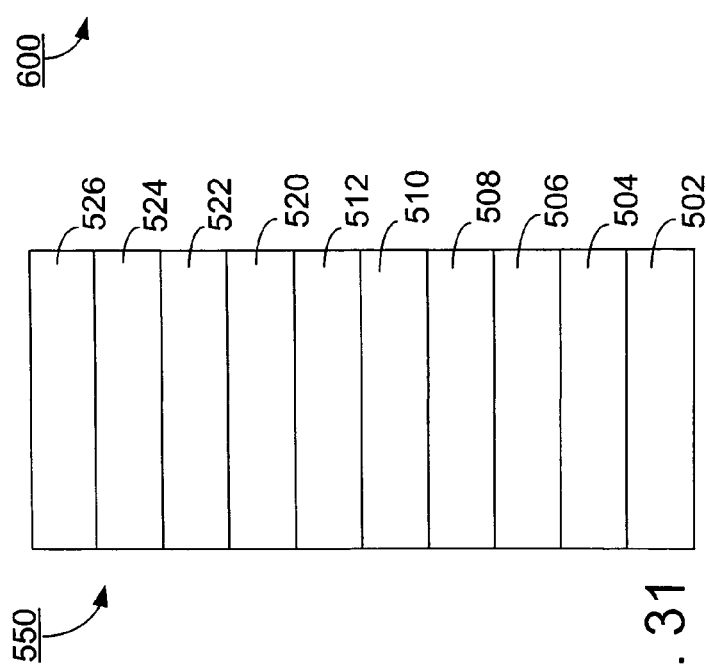
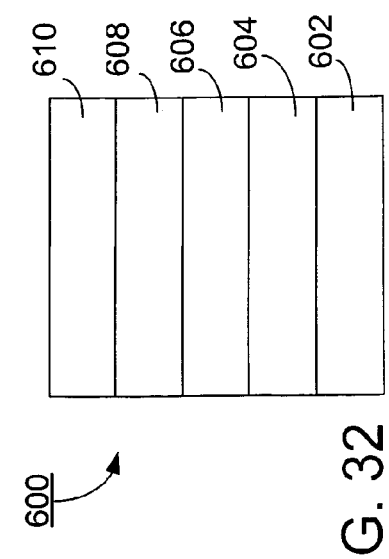
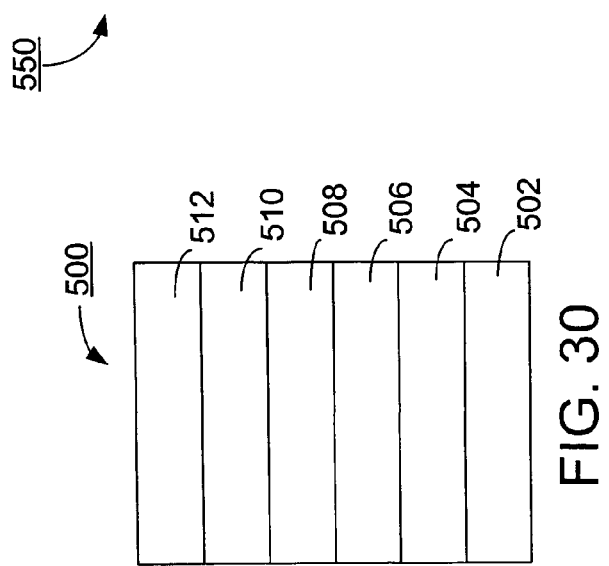
FIG. 33
FIG. 31
FIG. 32
FIG. 30

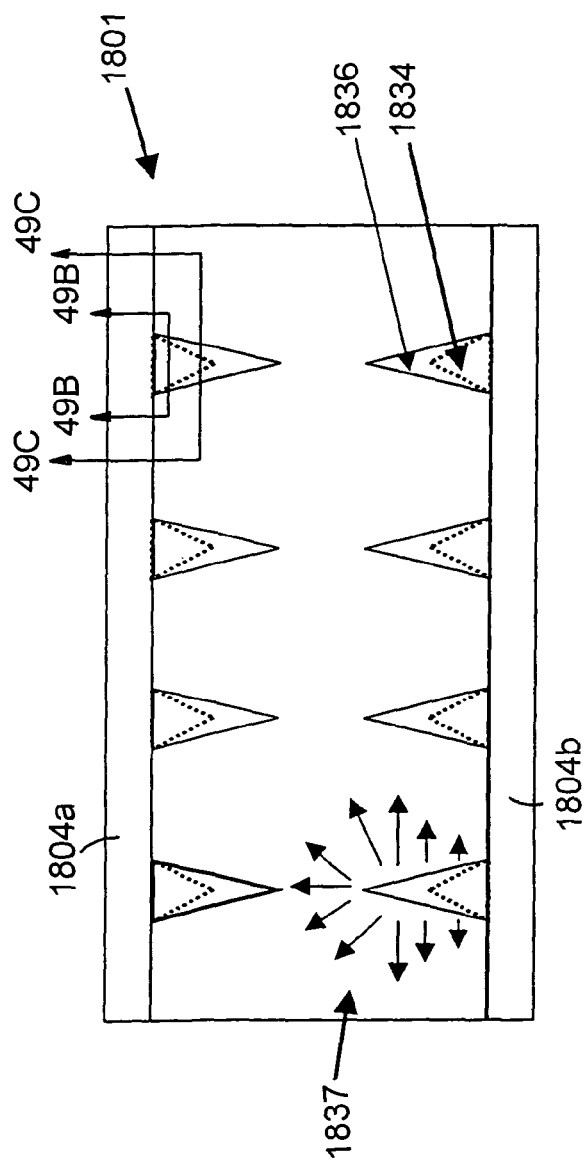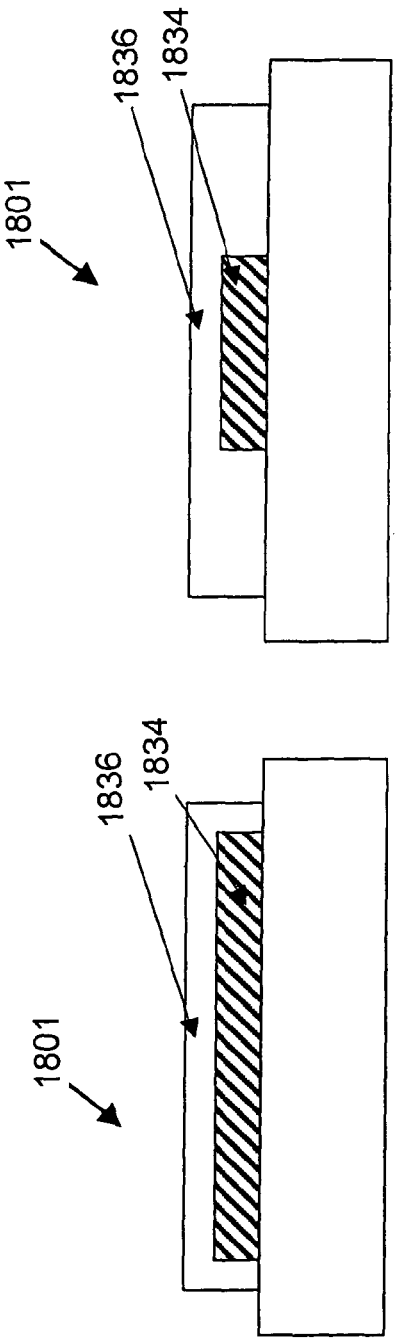

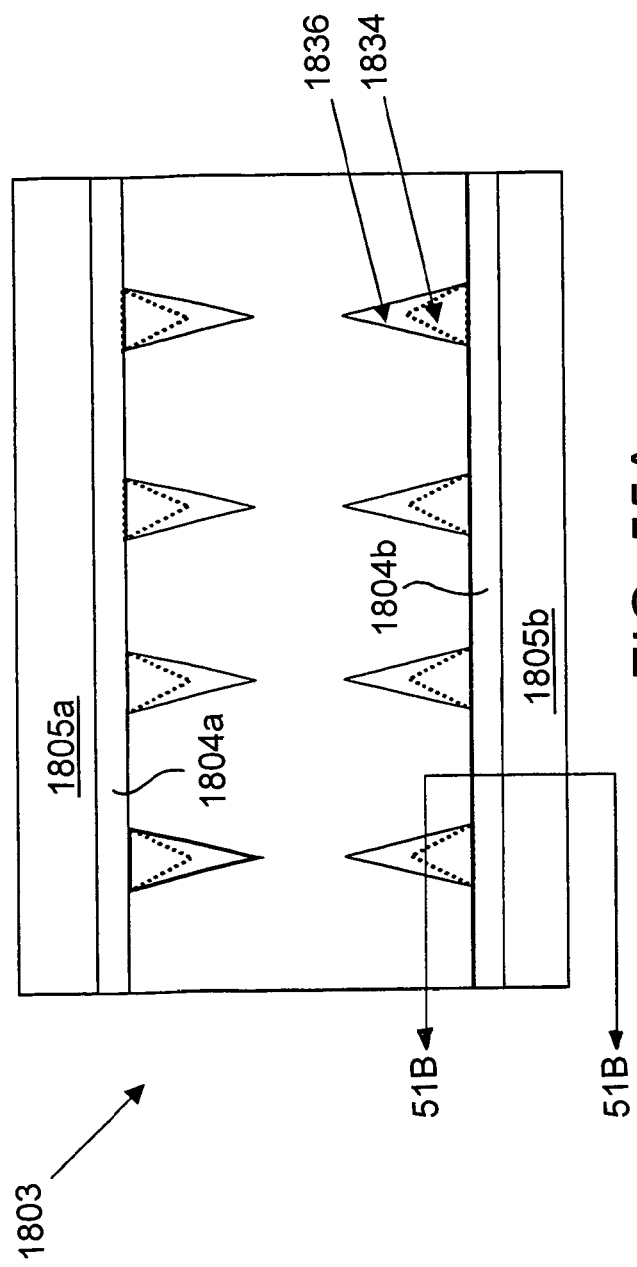
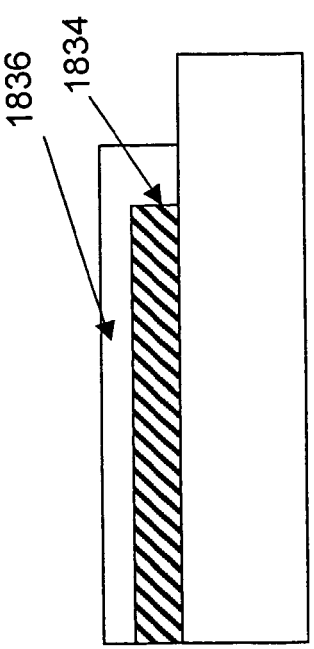
FIG. 55A
FIG. 55B

LIGHT EMITTING DIODE SYSTEMS INCLUDING OPTICAL DISPLAY SYSTEMS HAVING A MICRODISPLAY

CROSS-REFERENCE TO RELATED APPLICATIONS

This application is a continuation of U.S. patent application Ser. No. 11/208,419, filed Aug. 19, 2005, which claims priority under 35 U.S.C. §119 to U.S. Provisional Patent Application Ser. No. 60/603,087, filed Aug. 20, 2004, and entitled "LIGHT EMITTING DIODE SYSTEMS" and U.S. Provisional Patent Application Ser. No. 60/605,733, filed Aug. 31, 2004, and entitled "DIE ATTACH PROCESSES", the entire contents of each of these applications are hereby incorporated by reference.

INCORPORATION BY REFERENCE

This application incorporates by reference the following U.S. Provisional Patent Applications: 60/553,894, filed Mar. 16, 2004, 60/462,889, filed Apr. 15, 2003; 60/474,199, filed May 29, 2003; 60/475,682, filed Jun. 4, 2003; 60/503,653, filed Sep. 17, 2003; 60/503,654 filed Sep. 17, 2003; 60/503,661, filed Sep. 17, 2003; 60/503,671, filed Sep. 17, 2003; 60/503,672, filed Sep. 17, 2003; 60/513,807, filed Oct. 23, 2003; 60/514,764, filed Oct. 27, 2003; 60/603,087, filed Aug. 20, 2004; 60/605,733, filed Aug. 31, 2004; 60/645,720 filed Jan. 21, 2005; 60/645,721 filed Jan. 21, 2005; 60/659,861 filed Mar. 8, 2005; 60/660,921 filed Mar. 11, 2005; 60/659,810 filed Mar. 8, 2005; and 60/659,811 filed Mar. 8, 2005. This application also incorporates by reference the following U.S. Patent Applications: U.S. Ser. No. 10/723,987 entitled "Light Emitting Devices," and filed Nov. 26, 2003; U.S. Ser. No. 10/724,004, entitled "Light Emitting Devices," and filed Nov. 26, 2003; U.S. Ser. No. 10/724,033, entitled "Light Emitting Devices," and filed Nov. 26, 2003; U.S. Ser. No. 10/724,006, entitled "Light Emitting Devices," and filed Nov. 26, 2003; U.S. Ser. No. 10/724,029, entitled "Light Emitting Devices," and filed Nov. 26, 2003; U.S. Ser. No. 10/724,015, entitled "Light Emitting Devices," and filed Nov. 26, 2003; U.S. Ser. No. 10/724,005, entitled "Light Emitting Devices," and filed Nov. 26, 2003; U.S. Ser. No. 10/735,498, filed Dec. 12, 2003, and entitled "Light Emitting Systems", U.S. Ser. No. 10/794,244, filed Mar. 5, 2004, and entitled "Light Emitting Device Methods", U.S. Ser. No. 10/794,452, filed Mar. 5, 2004, and entitled "Light Emitting Device Methods", U.S. Ser. No. 10/872,335, entitled "Optical Display Systems and Methods" and filed Jun. 18, 2004; U.S. Ser. No. 10/871,877, entitled "Electronic Device Contact Structures" and filed Jun. 18, 2004; and U.S. Ser. No. 10/872,336, entitled "Light Emitting Diode Systems" and filed Jun. 18, 2004.

TECHNICAL FIELD

The invention relates to light emitting diode systems.

BACKGROUND

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED.

SUMMARY

The invention relates to optical display systems and methods.

In one aspect, the invention features a system that includes a light emitting device, at least one electrical contact pad disposed along an edge of the surface of the light emitting device, and a package. The package can include a plurality of plated regions for providing electrical contact to the light emitting device and a plurality of wire bonds connected between the plated regions and the at least one electrical contact pad.

Embodiments can include one or more of the following.

The light emitting device can include a multi-layer stack of materials that includes a light generating region and a first layer supported by the light generating region. The surface of the first layer can be configured so that light generated by the light generating region can emerge from the light emitting device via a surface of the first layer, a shape of a surface of the multi-layer stack being rectangular and the surface of the first layer having a dielectric function that varies spatially according to a pattern.

The plurality of wire bonds can include at least about 5 wire bonds. The plurality of wire bonds can include at least about 10 wire bonds. The plurality of wire bonds can include at least about 25 wire bonds. The plurality of wire bonds can include at least about 50 wire bonds.

An aspect ratio of the surface of the multi-layer stack can be about 4×3. An aspect ratio of the surface of the multi-layer stack can be about 16×9. The package can include a light emitting panel. The package can be mounted on a heat sink device. The package can be mounted on a core board.

The light emitting device can be a light emitting diode. The light emitting device can be a photonic lattice light emitting diode. The light emitting device can be a surface emitting laser.

An aspect ratio of the surface of the first layer can be about 4×3. An aspect ratio of the surface of the first layer can be about 16×9.

In an additional aspect, the invention features an optical display system that includes a plurality of light emitting diodes, a microdisplay, at least one optical component disposed along an optical path from the microdisplay to the light emitting diode, and a beam aggregation device disposed along an optical path from the microdisplay to the light emitting diodes. The beam aggregation device can be configured to combine light generated by the plurality of light emitting diodes.

Embodiments can include one or more of the following. The plurality of light emitting diodes can include at least one light emitting diode that includes a multi-layer stack of materials. The multi-layer stack of materials can include a light generating region, and a first layer supported by the light generating region. A surface of the first layer can be configured so that light generated by the light generating region can emerge from the light emitting device via a surface of the first layer, and the surface of the first layer having a dielectric function that varies spatially according to a pattern.

The beam aggregation device can be an x-cube. The beam aggregation device can be a prism, dichroic mirror, x-cube, holographic grating, and/or combinations thereof. The plurality of light emitting diodes can include red light emitting diodes, blue light emitting diodes, and green light emitting diodes. The plurality of light emitting diodes can include a red light emitting diode, a blue light emitting diode, and a green light emitting diode.

The light emitting diodes can be photonic lattice light emitting diodes. The light emitting diodes can be rectangular in shape.

An aspect ratio of a surface of the light emitting diodes can be about 4×3. An aspect ratio of a surface of the light emitting diodes can be about 16×9. The microdisplay can have a cross sectional area defined by a perimeter of the microdisplay and the light emitting diodes can have a cross sectional area defined by a perimeter of the light emitting diodes. A ratio of the cross sectional area of the microdisplay to the cross sectional area of the light emitting diodes can be from about 0.9 to about 1.1.

At least one of the plurality of light emitting diodes can be a non-lambertian light emitting diode. At least one of the plurality of the light emitting diodes can be more collimated in the forward emitting direction than a lambertian light emitting diode. The light emitting diode can be a photonic lattice light emitting diode.

The optical display system can include at least one liquid crystal on silicon (LCOS) panel. The LCOS panel can be included in a high definition light engine. The high definition light engine can be included in a television system. The television system can be a rear projection television system. Each light emitting diode of the plurality of light emitting diodes can have a corresponding LCOS panel.

The at least one optical component can include a device for filtering the polarization of the light emitted from the light emitting diodes. The device for filtering the polarization can include a polarizing beam splitter. The optical display system can include a device configured to change the polarization of light emitted by at least one of the plurality of LEDs. The device for changing the polarization can include a half-wave plate. The optical display system can include at least one digital light processor (DLP) panel.

The plurality of light emitting diodes can include a first light emitting diode having a first emission wavelength and a second light emitting diode having a second emission wavelength. The second emission wavelength can be between about 5 nm and about 100 nm greater than the first emission wavelength. The second emission wavelength can be between about 5 nm and about 50 nm greater than the first emission wavelength. The second emission wavelength can be between about 5 nm and about 40 nm greater than the first emission wavelength. The second emission wavelength can be between about 5 nm and about 30 nm greater than the first emission wavelength. The second emission wavelength can be between about 50 nm and about 100 nm greater than the first emission wavelength. The second emission wavelength can be between about 50 nm and about 100 nm greater than the first emission wavelength.

The system can also include a package. The plurality of light emitting diodes can include a first light emitting diode and a second light emitting diode. The first and the second light emitting diodes can be contained in the package.

The system can include a first package and a second package. A first light emitting diode of the plurality of light emitting diodes can be contained in the first package and a second light emitting diode of the plurality of light emitting diodes can be contained in the second package.

The plurality of light emitting diodes can include at least one red light emitting diode. The plurality of light emitting diodes can include at least one a blue light emitting diode. The plurality of light emitting diodes can include at least one green light emitting diode. The plurality of light emitting diodes can include at least one red light emitting diode, at least one a blue light emitting diode, and a plurality of green light emitting diodes.

In an additional aspect, the invention features an optical display system that includes a light emitting device and a cooling system configured so that, during use, the cooling system regulates a temperature of the light emitting device. The light emitting device can include a multi-layer stack of materials that includes a light generating region and a first layer supported by the light generating region. The surface of the first layer can be configured so that light generated by the light generating region can emerge from the light emitting device via a surface of the first layer, a shape of a surface of the multi-layer stack being rectangular and the surface of the first layer having a dielectric function that varies spatially according to a pattern.

Embodiments can feature one or more of the following advantages.

In certain embodiments, a light-emitting system can include an LED and/or a relatively large LED chip that can exhibit relatively high light extraction.

In some embodiments, a light-emitting system can include an LED and/or a relatively large LED chip that can exhibit relatively high surface brightness, relatively high average surface brightness, relatively low need for heat dissipation or relatively high rate of heat dissipation, relatively low etendue and/or relatively high power efficiency.

In certain embodiments, a light-emitting system can include an LED and/or a relatively large LED chip that can be designed so that relatively little light emitted by the LED chip is absorbed by packaging.

In some embodiments, a light-emitting system can include a packaged LED (e.g., a relatively large packaged LED) that can be prepared without using an encapsulant material. This can result in a packaged LED that avoids certain problems associated with the use of certain encapsulant materials, such as reduced performance and/or inconsistent performance as a function of time, thereby providing a packaged LED that can exhibit relatively good and/or reliable performance over a relatively long period of time.

In certain embodiments, a light-emitting system can include an LED (e.g., a packaged LED, which can be a relatively large packaged LED) that can have a relatively uniform coating of a phosphor material.

In some embodiments, a light-emitting system can include an LED (e.g., a packaged LED, which can be a relatively large packaged LED) that can be designed to provide a desired light output within a particular angular range (e.g., within a particular angular range relative to the LED surface normal).

In some embodiments, a light-emitting system can include an LED and/or a relatively large LED chip that can be prepared by a process that is relatively inexpensive.

In certain embodiments, a light-emitting system can include an LED and/or a relatively large LED chip that can be prepared by a process that can be conducted on a commercial scale without incurring costs that render the process economically unfeasible.

In some embodiments, using a rectangular shape for an LED (compared, for example, to a square) can provide certain advantages. The advantages can include one or more of the following. The rectangular LED can allow a greater number of wire bonds per unit area increasing the power that can be input into the LED. The rectangular shape can be chosen to match a particular aspect ratio of a pixel or microdisplay, thus, eliminating the need for complex beam shaping optics. The rectangular shape can also improve heat dissipation from the LED and reduce the likelihood of failure due to the device overheating. Also, because the cross section of an individual LEDs cut from a wafer is only slightly larger than the light-emitting surface area of the LED, many individual, and separately addressable LEDs can be packed closely together in an array. If one LED does not function (e.g., due to a large defect), then it does not significant diminish the performance of the array because the individual devices are closely packed.

Features and advantages of the invention are in the description, drawings and claims.

DESCRIPTION OF DRAWINGS

FIG. 5 is a schematic representation of an optical display system.
FIG. 6 is a schematic representation of an optical display system.
FIG. 11A is a graph of lumen increase versus wavelength separation.
FIG. 11B is a graph of wavelength separation.
FIG. 12A is a graph of lumen increase versus wavelength separation.
FIG. 12B is a graph of wavelength separation.
FIG. 24 is a graph of an extraction efficiency of LEDs with different surface patterns.
FIG. 30 is a cross-sectional view of a multi-layer stack.
FIG. 31 is a cross-sectional view of a multi-layer stack.
FIG. 32 is a cross-sectional view of a multi-layer stack.
FIG. 33 is a cross-sectional view of a multi-layer stack.

FIG. 53A is a top view of an LED.
FIG. 53B is a partial cross-sectional view of an LED.
FIG. 53C is a partial cross-sectional view of an LED.
FIG. 55A is a top view of a multi-layer stack.
FIG. 55B is a partial cross-sectional view of an LED.

DETAILED DESCRIPTION

Figure 1:
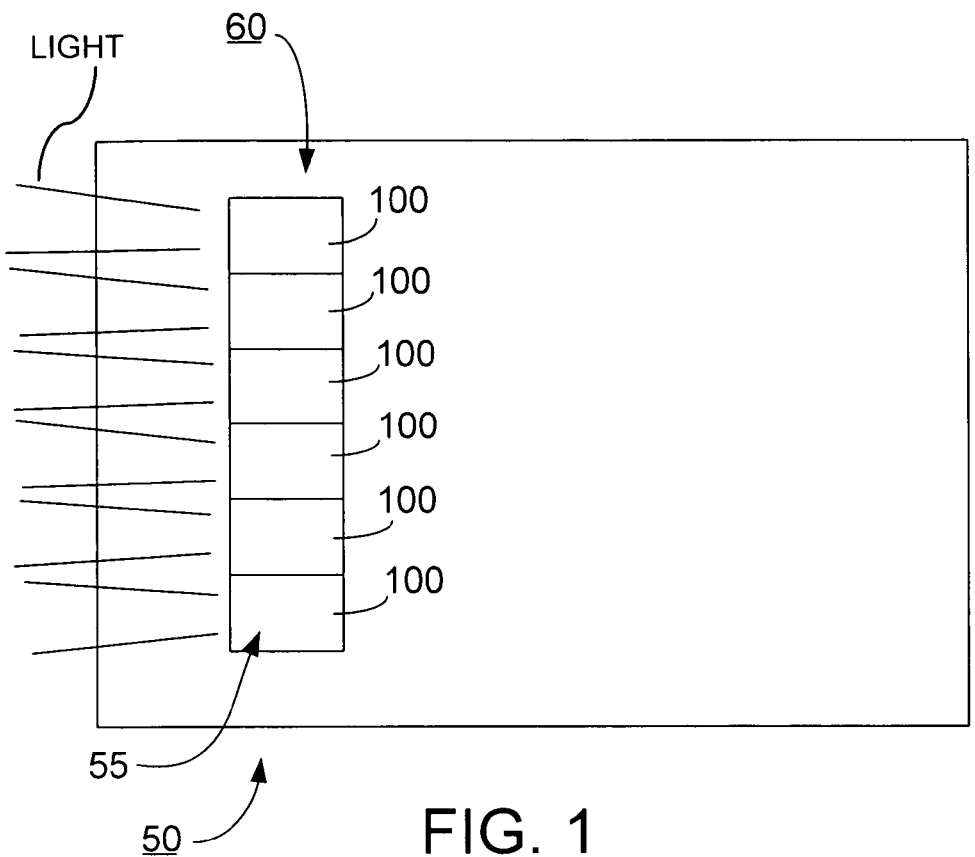
FIG. 1 is a schematic representation of a light emitting system.

FIG. 1 is a schematic representation of a light-emitting system 50 that has an array 60 of LEDs 100 incorporated therein. Array 60 is configured so that, during use, light that emerges from LEDs 100 (see discussion below) emerges from system 50.

Examples of light-emitting systems include projectors (e.g., rear projection projectors, front projection projectors), portable electronic devices (e.g., cell phones, personal digital assistants, laptop computers), computer monitors, large area signage (e.g., highway signage), vehicle interior lighting (e.g., dashboard lighting), vehicle exterior lighting (e.g., vehicle headlights, including color changeable headlights), general lighting (e.g., office overhead lighting), high brightness lighting (e.g., streetlights), camera flashes, medical devices (e.g., endoscopes), telecommunications (e.g. plastic fibers for short range data transfer), security sensing (e.g. biometrics), integrated optoelectronics (e.g., intrachip and interchip optical interconnects and optical clocking), military field communications (e.g., point to point communications), biosensing (e.g. photo-detection of organic or inorganic substances), photodynamic therapy (e.g. skin treatment), night-vision goggles, solar powered transit lighting, emergency lighting, airport runway lighting, airline lighting, surgical goggles, wearable light sources (e.g. life-vests). An example of a rear projection projector is a rear projector television. An example of a front projection projector is a projector for displaying on a surface, such as a screen or a wall. In some embodiments, a laptop computer can include a front projection projector.

Typically, surface 55 is formed of a material that transmits at least about 20% (e.g., at least about 30%, at least about 40%, at least about 50%, at least about 60%, at least about 70%, at least about 80%, at least about 90%, at least about 95%) of the light that emerges from LEDs 100 and impinges on surface 55. Examples of materials from which surface 55 can be formed include glass, silica, quartz, plastic, sapphire, and polymers.

In some embodiments, it may be desirable for the light that emerges (e.g., total light intensity, light intensity as a function of wavelength, and/or peak emission wavelength) from each LED 100 to be substantially the same. An example is time-sequencing of substantially monochromatic sources (e.g. LEDs) in display applications (e.g., to achieve vibrant full-color displays). Another example is in telecommunications where it can be advantageous for an optical system to have a particular wavelength of light travel from the source to the light guide, and from the light guide to the detector. A further example is vehicle lighting where color indicates signaling. An additional example is in medical applications (e.g., photosensitive drug activation or biosensing applications, where wavelength or color response can be advantageous).

In certain embodiments, it may be desirable for the light that emerges (e.g., total light intensity, light intensity as a function of wavelength, and/or peak emission wavelength) from at least some of LEDs 100 to be different from the light that emerges (e.g., total light intensity, light intensity as a function of wavelength, and/or peak emission wavelength) from different LEDs 100. An example is in general lighting (e.g., where multiple wavelengths can improve the color rendering index (CRI)). CRI is a measurement of the amount of color shift that objects undergo when lighted by the light-emitting system as compared with the color of those same objects when seen under a reference lighting system (e.g., daylight) of comparable correlated temperature. Another example is in camera flashes (e.g., where substantially high CRI, such as substantially close to the CRI of noontime sunlight, is desirable for a realistic rendering of the object or subject being photographed). A further example is in medical devices (e.g., where substantially consistent CRI is advantageous for tissue, organ, fluid, etc. differentiation and/or identification). An additional example is in backlighting displays (e.g., where certain CRI white light is often more pleasing or natural to the human eye).

Although depicted in FIG. 1 as being in the form of an array, LEDs 100 can be configured differently. As an example, in some embodiments, system 50 includes a single LED 100. As another example, in certain embodiments, the array is curved to help angularly direct the light from various sources onto the same point (e.g., an optic such as a lens). As a further example, in some embodiments, the array of devices is hexagonally distributed to allow for close-packing and high effective surface brightness. As an additional example, in certain embodiments, the devices are distributed around a mirror (e.g., a dichroic mirror) that combines or reflects light from the LEDs in the array.

In FIG. 1, the light that emerges from LEDs 100 is shown as traveling directly from LEDs 100 to surface 55. However, in some embodiments, the light that emerges from LEDs 100 can travel an indirect path from LEDs 100 to surface 55. As an example, in some embodiments, system 50 includes a single LED 100. As another example, in certain embodiments, light from LEDs 100 is focused onto a microdisplay (e.g., onto a light valve such as a digital light processor (DLP) or a liquid crystal display (LCD)). As a further example, in some embodiments, light is directed through various optics, mirrors or polarizers (e.g., for an LCD). As an additional example, in certain embodiments, light is projected through primary or secondary optics, such as, for example, a lens or a set of lenses.

Figure 2A:
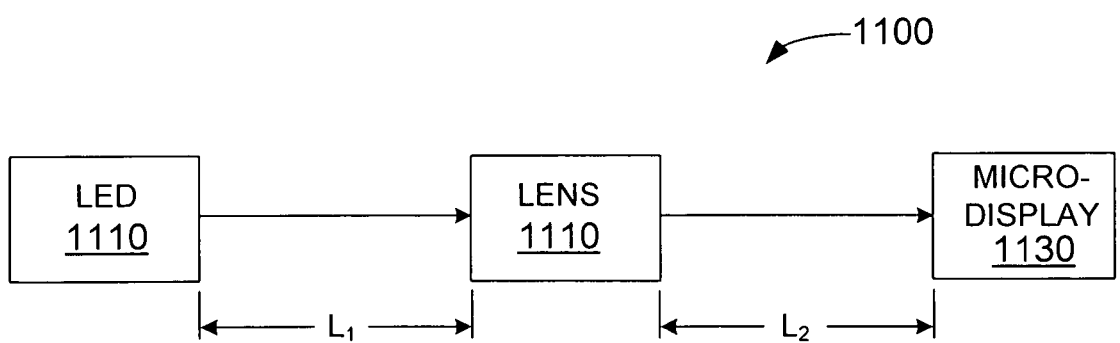
FIG. 2A-2D are schematic representations of optical display systems.

FIG. 2A shows an optical display system 1100 (see discussion above) including a non-Lambertian LED 1110 (see discussion below), a lens 1120 and a microdisplay 1130. LED 1110 is spaced a distance L1 from lens 1120, and microdisplay 1130 is spaced a distance L2 from lens 1120. Distances L1 and L2 are selected so that, for light emitted by LED 1110 that impinges on lens 1120, the image plane of lens 1120 coincides with the surface of microdisplay 1130 on which the light emitted by LED 1110 impinges.

With this arrangement, system 1100 can use the light emitted by LED 1110 to relatively efficiently illuminate the surface of microdisplay 1130 with the shape of the surface of LED 1110 that emits light being about the same as the shape of the surface of 1130 that is illuminated by the light emitted by LED 1110. For example, in some embodiments, the ratio the aspect ratio of LED 1110 to the aspect ratio of microdisplay 1130 can be from about 0.5 to about 2 (e.g., from about 9/16 to about 16/9, from about 3/4 to about 4/3, about 1). The aspect ratio of microdisplay 1130 can be, for example, 1920× 1080, 640×480, 800×600, 1024×700, 1024×768, 1024×720, 1280×720, 1280×768, 1280×960, or 1280×1064.

In general, the surface of microdisplay 1130 and/or the surface of LED 1110 can have any desired shape. Examples of such shapes include square, circular, rectangular, triangular, trapezoidal, and hexagonal.

Figure 2B:
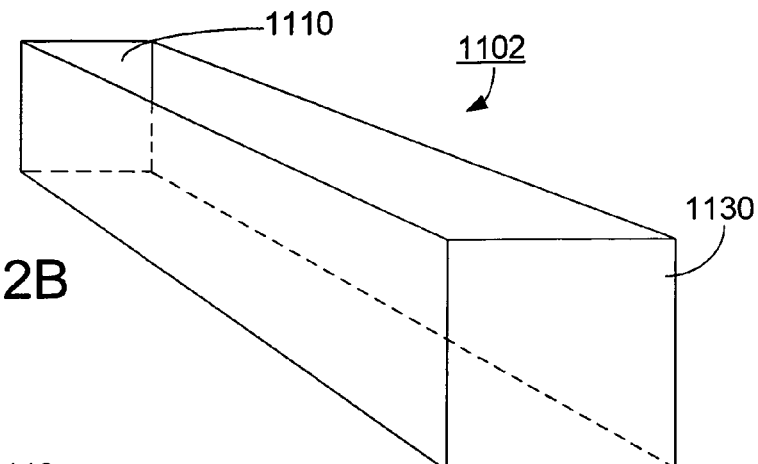
Figure 2C:
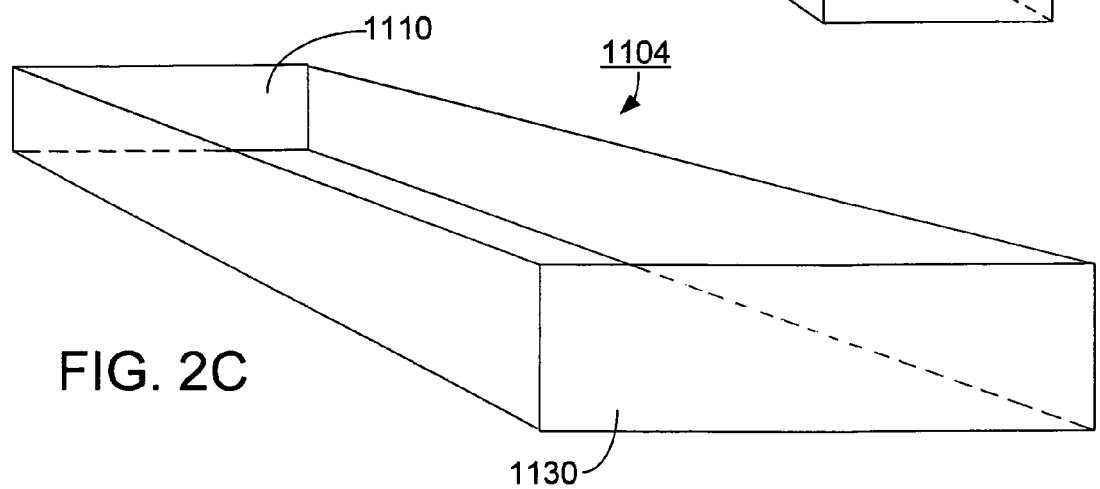

In some embodiments, an optical display system can relatively efficiently illuminate the surface of microdisplay 1130 without a lens between LED 1110 and microdisplay 1130 while still having the shape of the surface of LED 1110 that emits light being about the same as the shape of the surface of 1130 that is illuminated by the light emitted by LED 1110. For example, FIG. 2B shows a system 1102 in which a square LED 1110 is imaged onto a square microdisplay 1130 without having a lens between LED 1110 and microdisplay 1130. As another example, FIG. 2C shows an optical display system 1104 in which a rectangular LED 1110 can be imaged onto a rectangular microdisplay 1130 (with a similarly proportioned aspect ratio) without having a lens between LED 1110 and microdisplay 1130.

Figure 2D:
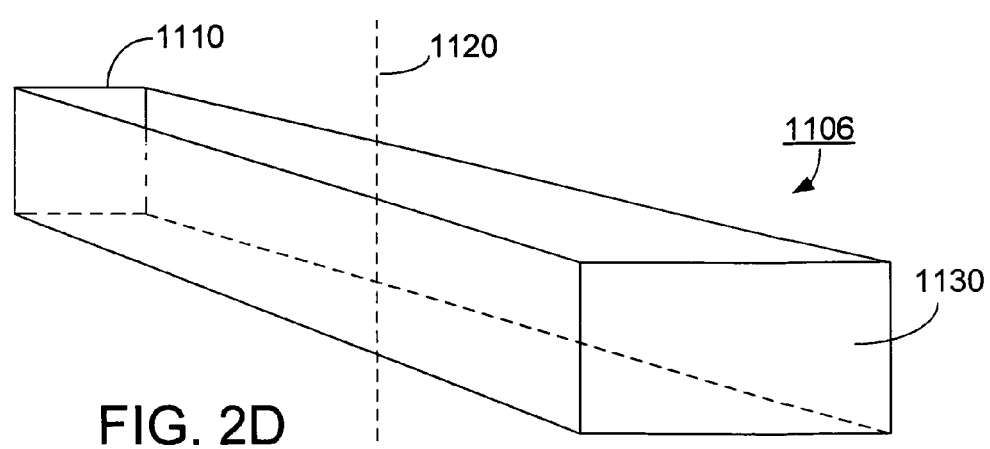

In certain embodiments, an anamorphic lens can be disposed between LED 1110 and microdisplay 1130. This can be desirable, for example, when the aspect ratio of LED 1110 is substantially different from the aspect ratio of microdisplay 1130. As an example, FIG. 2D shows a system 1106 that includes LED 1110 having a substantially square shaped surface, microdisplay 1130 having a substantially rectangular shaped surface (e.g., an aspect ratio of about 16:9 or about 4:3), and an anamorphic lens 1120 disposed between LED 1110 and microdisplay 1130. In this example, anamorphic lens 1120 can be used to convert the shape of the light emitted by LED 1110 to substantially match the shape of the surface of microdisplay 1130. This can enhance the efficiency of the system by increasing the amount of light emitted by the surface of LED 1110 that impinges upon the surface of microdisplay 1130.

Figure 3:
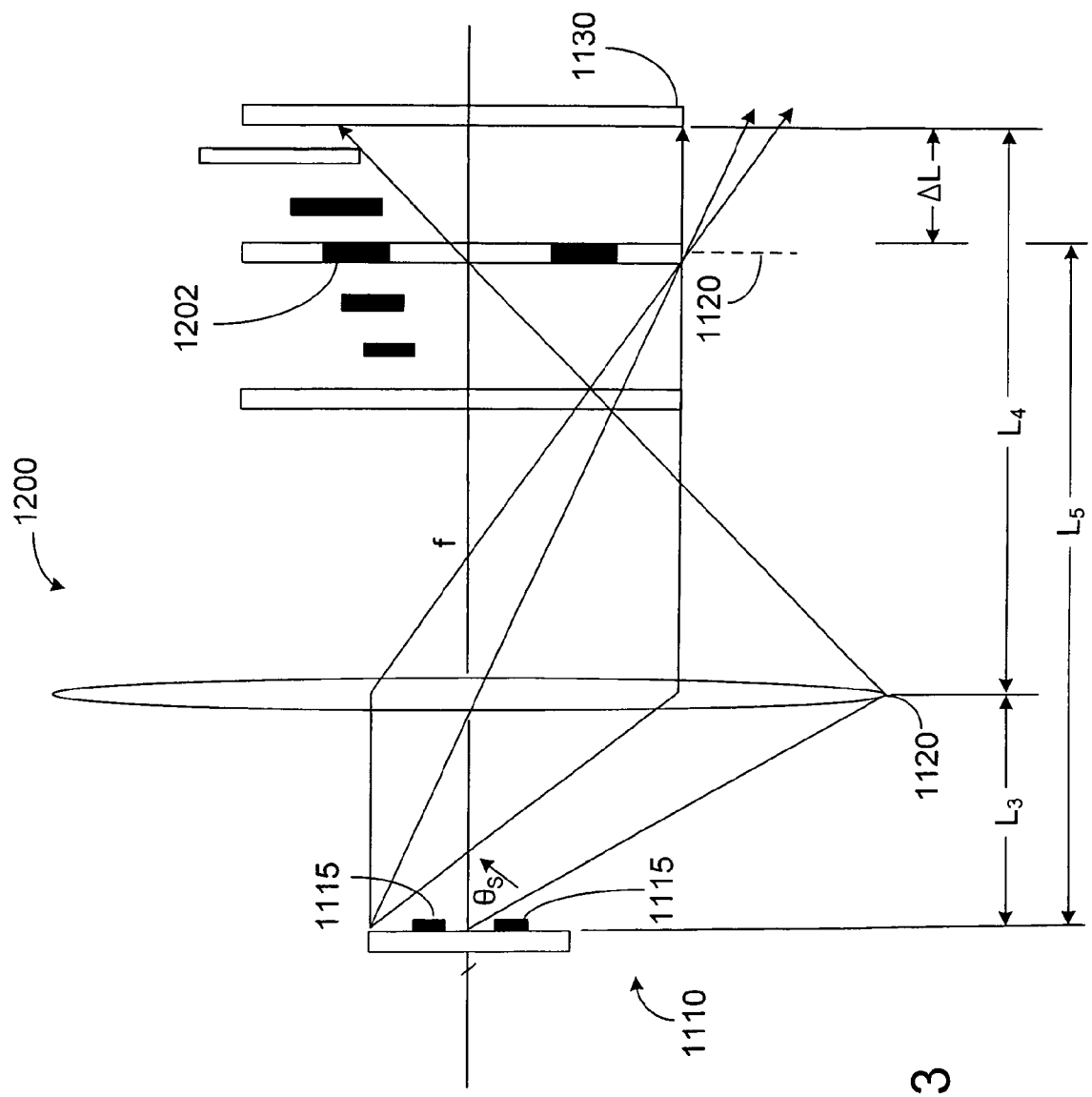
FIG. 3 is a schematic representation of an optical display system.

FIG. 3 shows an optical display system 1200 including LED 1110, lens 1120, and microdisplay 1130. The light emitting surface of LED 1110 has contact regions to which electrical leads 1115 are attached (see discussion below). LED 1110 is spaced a distance L3 from lens 1120, and microdisplay 1130 is spaced a distance L4 from lens 1120. Leads 1115 block light from being emitted from the contact regions of LED 1110. If the plane of the surface of microdisplay 1130 on which the light emitted by LED 1110 impinges coincides with the image plane of lens 1120, a set of dark spots 1202 corresponding to the contact region of the light emitting surface of LED 1110 can appear on this surface of microdisplay 1130. To reduce the area of this surface of microdisplay 1130 that is covered by the dark spots, distances L3 and L4 are selected so that, for light emitted by LED 1110 that impinges on lens 1120, the image plane of lens 1120 does not coincide with the plane of the surface of microdisplay 1130 on which the light emitted by LED 1110 impinges (i.e., there exists a distance, ΔL, between the image plane of lens 1120 and the plane of the surface of microdisplay 1130 on which the light emitted by LED 1110 impinges). With this arrangement, the light from LED 1110 is defocused in the plane of the surface of microdisplay 1130 on which the light emitted by LED 1110 impinges, and the resulting intensity of light is more uniform on this surface of microdisplay 1130 than in the image plane of lens 1120. The total distance between the LED and the microdisplay 1130 can be represented as the distance between the LED 1110 and the image plane 1120 (L5) plus the distance, ΔL. In general, as ΔL is increased by increasing the distance between the LED 1110 and the microdisplay 1130, the intensity of dark spots decreases but the intensity of light emitted by LED 1110 that impinges on the surface of microdisplay 1130 decreases. Alternately, when the microdisplay is translated such that the distance between the LED 1110 and the microdisplay 1130 is decreased, the intensity is greater than the intensity at the image plane, but the microdisplay may be only partially illuminated. In some embodiments, the absolute value of ΔL/L5 is from about 0.00001 to about 1 (e.g., from about 0.00001 to about 0.1, from about 0.00001 to about 0.01, from about 0.00001 to about 0.001), or from about 0.00001 to about 0.0001) In some embodiments, multiple LEDs may be used to illuminate a single microdisplay (e.g., a 3×3 matrix of LEDs). Such a system can be desirable because, when multiple LEDs are arranged to illuminate a single microdisplay, if one LEDs fails, the system would still be usable (however a dark spot may occur due to the absence of light from the particular LED). If multiple LEDs are used to illuminate a single microdisplay, the optical system can be configures so that dark spots do not appear on the surface of the microdisplay. For example, the microdisplay can be translated outside of the image plane such that the area between the LEDs does not result in a dark spot.

Figure 4A:
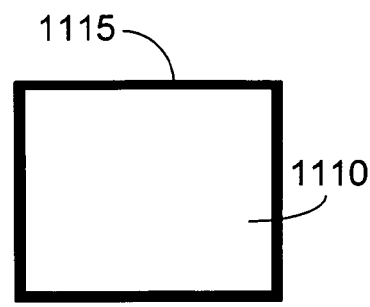
FIG. 4A is a schematic representation of a top view of an LED.

In some embodiments, the intensity of dark spots on the surface of microdisplay 1130 can be reduced by appropriately configuring the contact region of the surface of LED 1110. For example, FIG. 4A shows a top view of an LED 1110 with a contact region disposed around the perimeter of LED 1110. With this arrangement, with or without the presence of a lens (with or without defocusing), the optical display system can be configured (e.g., by properly sizing the area of the surface of microdisplay 1130) so that the intensity of the dark spots created by the contact region of the surface of LED 1110 on surface 1130 is relatively small. This approach may be used with systems that include multiple LEDs (e.g., a 3×3 matrix of LEDs).

Figure 4B:
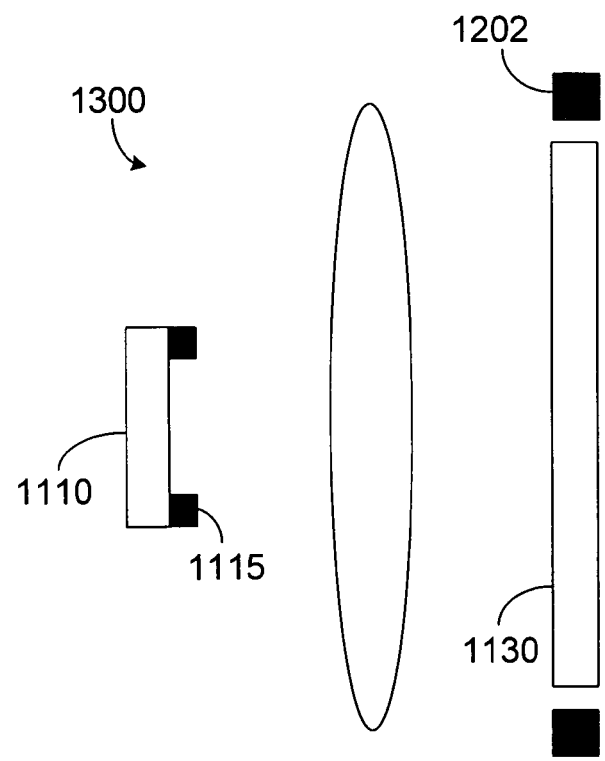
FIG. 4B is a schematic representation of an optical display system.

As another example, FIG. 4B shows an optical display system 300 that includes LED 1110 and microdisplay 1130. LED 1110 includes a contact region formed by leads 1115 that is selected so that dark spots 1202 appear at a region not imaged on the surface of microdisplay 1130. In this example, the surface of microdisplay 1130 can be located at the image plane of lens 1120 because the dark spots fall outside of the area imaged on the microdisplay at the image plane of lens 1120. If the shape of LED 1110 is matched to the shape of microdisplay 1130, leads 1115 can be disposed, for example, on the surface of LED 1110 around its perimeter. In this example, the area inside the contact region of surface 1110 matches (e.g., the aspect ratio is similar) to the surface of microdisplay 1130. This approach may be used with systems that include multiple LEDs (e.g., a 3×3 matrix of LEDs).

As a further example, FIG. 5 shows an optical display system 1700 that includes LED 1110 and microdisplay 1130. LED 1110 also includes a contact region formed by leads 1115 and a homogenizer 1702 (also referred to as a light tunnel or light pipe) that guides light emitted from LED 1110 to a lens 1120. Total internal reflection of the light emitted by LED 1110 off the inside surfaces of homogenizer 1702 can generate a substantially uniform output distribution of light and can reduce the appearance of dark spots caused by leads 1115 so that microdisplay 1130 is substantially uniformly illuminated by LED 1110 (e.g., an image generated in an image plane 1131 is substantially uniform).

Optionally, system 1700 can include one or more additional optical components. For example, in some embodiments, optical display system 1700 can also include a lens disposed in the path prior to the homogenizer to focus light into the homogenizer. In certain embodiments, the aspect ratio of the aperture of homogenizer 1702 matches that of LED 1110 such that when LED 1110 is mounted in close proximity to homogenizer 1702, additional lenses may not be necessary or such that more efficient coupling of light into homogenizer 1702 is possible with a lens prior to homogenizer 1702.

As an additional example, FIG. 6 shows an optical display system 1710 that includes LED 1110 and microdisplay 1130. LED 1110 also includes a contact region formed by leads 1115 and a set of multiple lenses 1712 that are disposed between LED 1110 and lens 1120. Lenses 1712 can vary in size, shape, and number. For example, the number and size of lenses 1712 can be proportional to the cross-sectional area of LED 1110. In some embodiments, lenses 1712 include a set of between about 1 and about 100 lenses with sizes varying of, for example, from about 1 mm to about 10 cm. The light emitted by LED 1110, enters lenses 1712 and is refracted. Since the surfaces of lenses 1712 are curved, the light refracts at different angles causing the beams emerging from lenses 1712 to overlap. The overlapping of the beams reduces the appearance of dark spots caused by leads 1115 so that microdisplay 1130 is substantially uniformly illuminated by LED 1110 (e.g., an image generated in an image plane 1131 is substantially uniform).

While optical display systems have been described as including a single lens, in some embodiments, multiple lenses can be used. Further, in certain embodiments, one or more optical components other than lens(es) can be used. Examples of such optical components include mirrors, reflectors, collimators, beam splitters, beam combiners, dichroic mirrors, holographic gratings, filters, polarizers, polarizing beam splitters, prisms, total internal reflection prisms, optical fibers, light guides and beam homogenizers. The selection of appropriate optical components, as well as the corresponding arrangement of the components in the system, is known to those skilled in the art.

Figure 7:
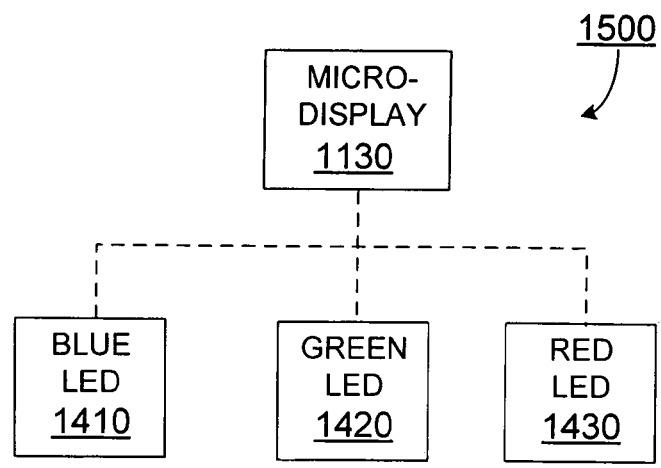
FIG. 7 is a schematic representation of an optical display system.

Moreover, although optical display systems have been described as including one non-Lambertian LED, in some embodiments, more than one non-Lambertian LED can be used to illuminate microdisplay 1130. For example, FIG. 7 shows a system 1500 that includes a blue LED 1410 (an LED with a dominant output wavelength from about 450 to about 480 nm), a green LED 1420 (an LED with a dominant output wavelength from about 500 to about 550 nm), and a red LED 1430 (an LED with a dominant output wavelength from about 610 to about 650 nm) which are in optical communication with the surface of microdisplay 1130. LEDS 1410, 1420, and 1430 can be arranged to be activated simultaneously, in sequence or both. In other embodiments, at least some of the LEDs may be in optical communication with separate microdisplay surfaces.

In some embodiments, LEDs 1410, 1420, and 1430 are activated in sequence. In such embodiments, a viewer's eye generally retains and combines the images produced by the multiple colors of LEDs. For example, if a particular pixel (or set of pixels) or microdisplay (or portion of a microdisplay) of a frame is intended to be purple in color, the surface of the microdisplay can be illuminated with red LED 1430 and blue LED 1410 during the appropriate portions of a refresh cycle. The eye of a viewer combines the red and the blue and "sees" a purple microdisplay. In order for a human not to notice the sequential illumination of the LEDs, a refresh cycle having an appropriate frequency (e.g., a refresh rate greater than 120 Hz) can be used.

LEDs 1410, 1420 and 1430 may have varying intensities and brightness. For example, green LED 1420 may have a lower efficiency than red LED 1430 or blue LED 1410. Due to a particular LED (e.g., green LED 1420) having a lower efficiency, it can be difficult to illuminate the surface of the microdisplay with a sufficiently high brightness of the color of light (e.g., green) emitted by the relatively low efficiency LED (e.g., LED 1420). To compensate for this disparity in efficiency (to produce an image that is not distorted due to the difference in light brightness), the activation cycles for the multiple LEDs can be adjusted. For example, the least efficient LED may be allocated a longer activation time (i.e., on for a longer period of time) than the more efficient LEDs. In a particular example, for a red/green/blue projection system instead of a 1/3:1/3:1/3 duty cycle allocation, the cycle may be in the ratio of 1/6:2/3:1/6 (red:green:blue). In another example, the cycle may be in the ratio of 0.25:0.45:0.30 (red:green:blue). In other examples, the duty cycle dedicated to the activation of the green LED may be further increased. For example, the duty cycle dedicated to imaging the green LED 1420 can be greater than about 40% (e.g., greater than about 45%, greater than about 50%, greater than about 60%, greater than about 70%, greater than about 80%, greater than about 90%). In some embodiments, the duty cycle for each LED is different. As an example, the duty cycle for red LED 1430 can be greater than the duty cycle for blue LED 1410. While systems have been described in which the activation cycle is selected based on the intensity and/or brightness of an LED, in some systems the activation time of an LED may be selected based on one or more other parameters. In some examples, the activation time of the least efficient light emitting device is at least about 1.25 times (e.g., at least about 1.5 times, at least about 2 times, at least about 3 times) the activation time of another light emitting device.

Figure 8B:
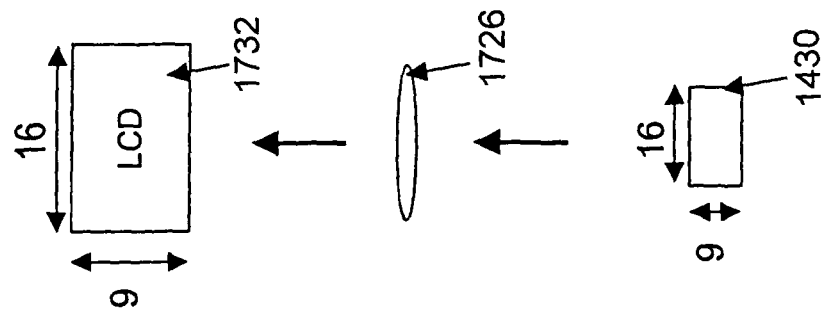
FIGS. 8A and 8B are schematic representations of an optical display system.
Figure 8A:
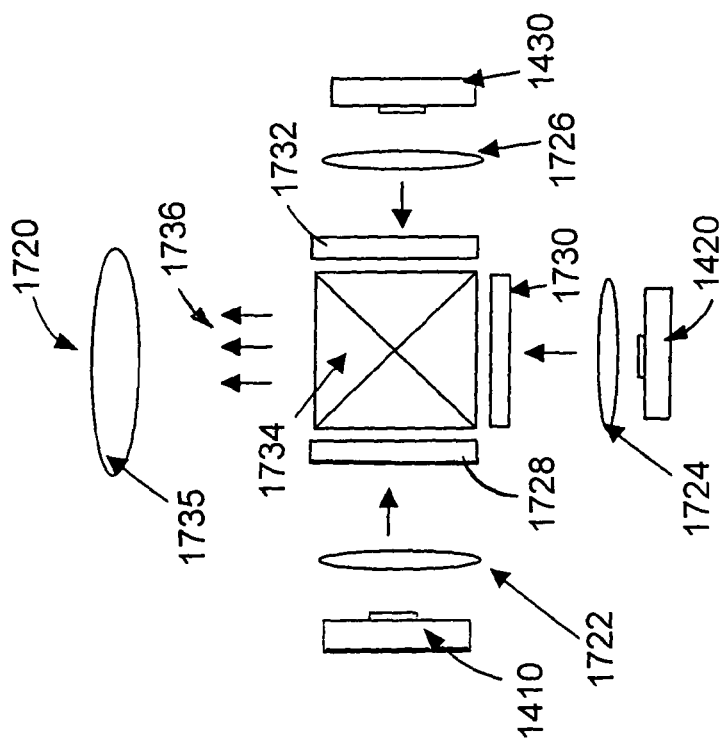

FIG. 8A shows an embodiment of a liquid crystal display (LCD) based optical display system 1720 including blue LED 1410, green LED 1420, and red LED 1430 (e.g., as described above) which are in optical communication with the surface of associated LCD panels 1728, 1730, and 1732. Optical display system 1720 also includes lenses 1722, 1724, and 1726 in a corresponding optical path between LEDs 1410, 1420, and 1430 and associated LCD panels 1728, 1730, and 1732. Lenses 1722, 1724, and 1726 focus the light onto associated LCD panels 1728, 1730, and 1732. Optical display system 1720 further includes a device 1734 (e.g., an x-cube) that combines multiple beams of light from LCD panels 1728, 1730, and 1732 into a single beam 1736 (indicated by arrows) that can be directed to a projection lens 1735 or other display Optionally, optical display system 1720 can include a polarizer that transmits a desired polarization (e.g. the 'p' polarization) while reflecting another polarization (e.g. the 's' polarization). The polarizer can be disposed in the path between LEDs 1410, 1420, and 1430 and associated lenses 1722, 1724, and 1726, between lenses 1722, 1724, and 1726 and the associated LCD panels 1728, 1730, and 1732, or in other locations along the optical path. As shown in FIG. 8B, in some embodiments the aspect ratio of an LED (e.g., LED 1430) can be matched to the aspect ratio of the microdisplay (e.g., microdisplay 1732) as described above.

Figure 9:
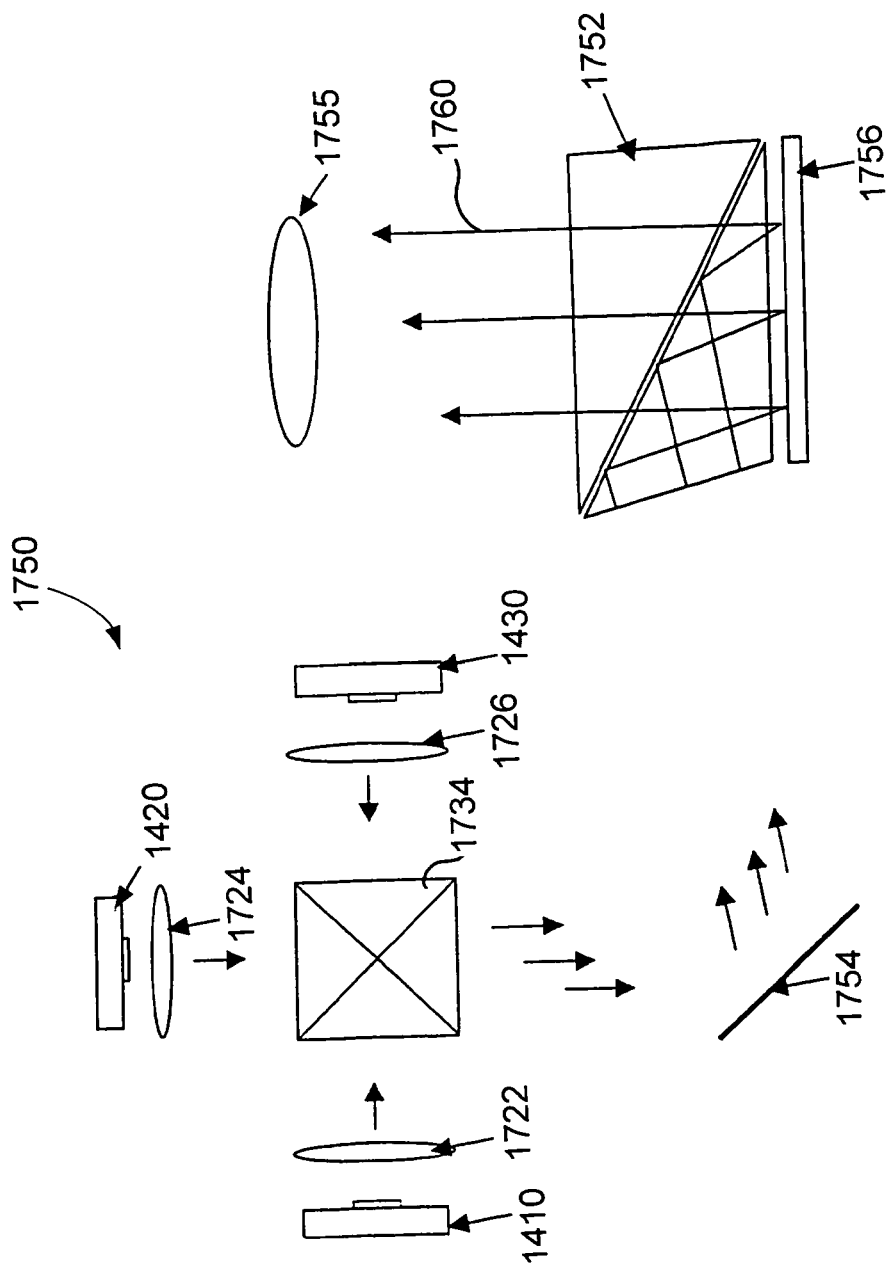
FIG. 9 is a schematic representation of an optical display system.

FIG. 9 shows an embodiment of a digital light processor (DLP) based optical display system 1750 including blue LED 1410, green LED 1420, and red LED 1430 (as described above) which are each in optical communication with associated lenses 1722, 1724, and 1726 (as described above). Light emitted from LEDs 1410, 1420, and 1430 passes through the associated lenses 1722, 1724, and 1726 and is collected by a device 1734 (e.g., an x-cube) that combines multiple beams of light emitted by LEDs 1410, 1420, and 1430 into a single beam that can be directed to a total internal reflection (TIR) prism 1752. For example, the light emerging from x-cube 1734 can be directed to TIR prism 1752 by a mirror 1754 or other device such as a light guide. TIR prism 1752 reflects light and directs the light to a DLP panel 1756. DLP panel 1756 includes a plurality of mirrors that can be actuated to generate a particular image. For example, a particular mirror can either reflect light 1760 (indicated by arrows) such that the light is directed to a projection 1755 or can cause the light to be reflected away from projection lens 1755. The combination of the LEDs 1410, 1420, and 1430 and DLP panel 1756 allow greater control of the signal. For example, the amount of data sent to DLP panel 1756 can be reduced (allowing greater switching frequency) by switching on and off LEDs 1410, 1420, and 1430 in addition to the mirrors in DLP panel 1756. For example, if no red is needed in a particular image, red LED 1430 can be switched off eliminating the need to send a signal to DLP 1752 to switch the associated mirror. The ability to modulate the LEDs can improve for example color quality, image quality, or contrast.

Figure 10:
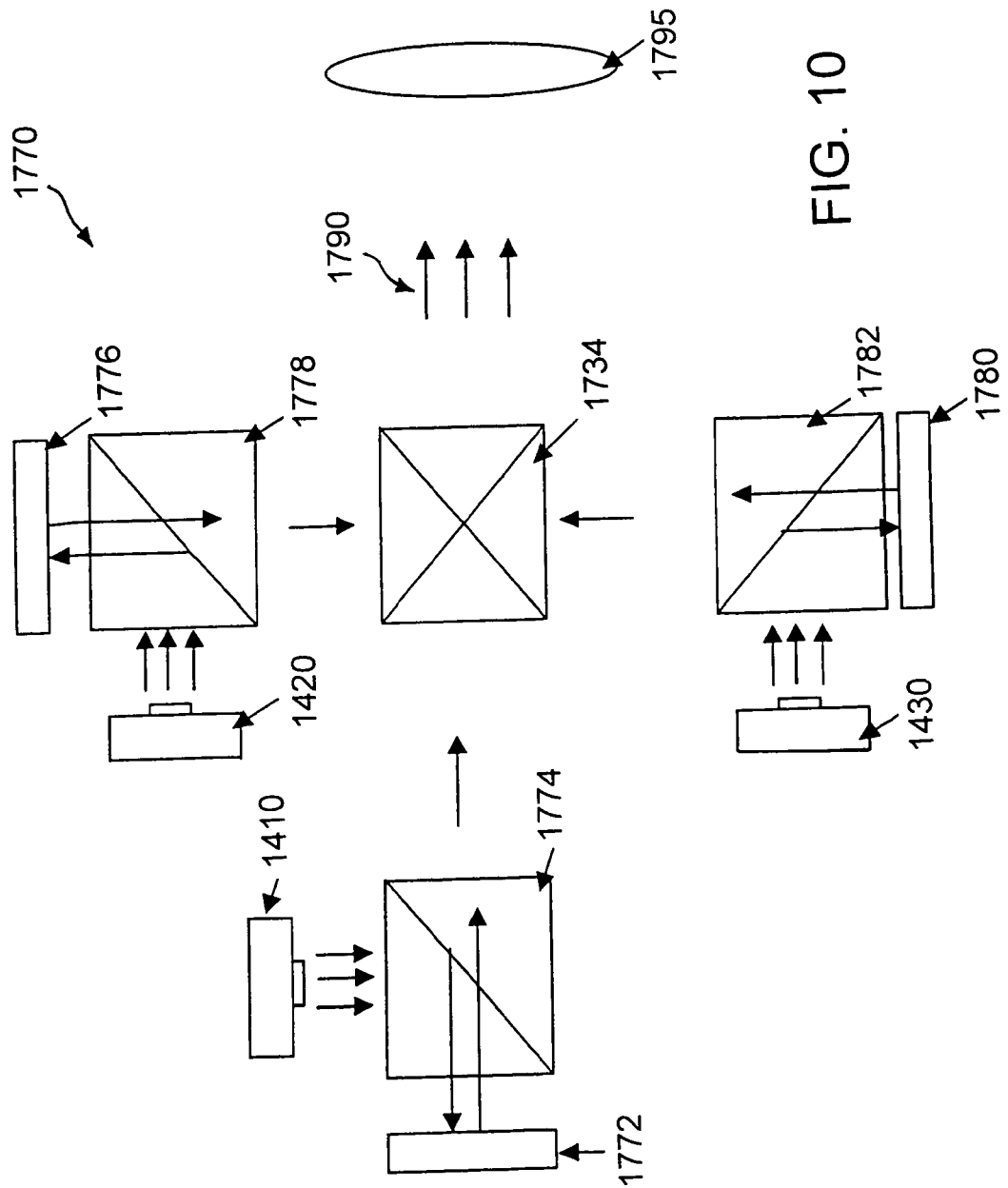
FIG. 10 is a schematic representation of an optical display system.

FIG. 10 shows a particular embodiment of a liquid crystal on silicon (LCOS) based optical display system 1770 including blue LED 1410, green LED 1420, and red LED 1430 (as described above) which are each in optical communication with an associated polarizing beam splitter 1774, 1778, and 1782. Light emitted from LEDs 1410, 1420, and 1430 passes through the associated polarizing beam splitters 1774, 1778, and 1782 and is projected onto an associated LCOS panel 1772, 1776, or 1780. Since LCOS panels 1772, 1776, and 1780 are not sensitive to all polarizations of light, the polarizing beam splitters 1774, 1778, and 1782 polarize the light to a particular polarization (e.g., by transmitting a desired polarization (e.g., the 'p' polarization) while reflecting another polarization (e.g., the 's' polarization) the polarization of some light and pass other polarizations) based on the sensitivity of LCOS panels 1772, 1776, and 1780. The light reflected from LCOS panels 1772, 1776, and 1780 is collected by a device 1734 (e.g., an x-cube) that combines the beams of light from the multiple LCOS panels 1772, 1776, and 1780 to generate a beam 1790 (indicated by arrows) that is directed to a projection lens 1795.

While in the above examples, the optical display system includes red, green, and blue light emitting devices, other colors and combinations are possible. For example, the system need not have only three colors. Additional colors such as yellow may be included and allocated a portion of the duty cycle. Alternately, multiple LEDs having different dominant wavelengths may be optically combined to produce a resulting color. For example, a blue-green LED (e.g., an LED with a dominant wavelength between the wavelength of blue and green) can be combined with a yellow LED to produce 'green' light. In general, the number of LEDs and the color of each LED can be selected as desired. Additional microdisplays can also be included.

It is believed that using multiple LEDs can be used to improve the total white lumens throughput an etendue-limited optical system. It is known to those skilled in the art that combining light of the same wavelength is limited by the etendue, or optical extent, of an optical system. By using different wavelengths, light emitted from the multiple LEDs can be combined into the same etendue. For example, the multiple LEDs can be operated simultaneously rather than sequentially. In addition, the LEDs may be placed on separate heat sinks to allow for separate cooling and improved performance.

In general, the multiple LEDs can be chosen as desired. As an example, since the white lumen output is typically limited by insufficient green lumens, multiple green LEDs (e.g. two, three, four, five, six, etc.) can be used to increase the white lumen output. FIGS. 11 and 12 are graphs that each show a theoretical calculation of lumen increase versus wavelength of separation.

FIG. 11A, for example, shows a graph of the relative lumen output increase versus a wavelength of separation for a two LED system. As shown in FIG. 11B, the two LED system includes two LEDs that emit light of differing wavelengths, $\Sigma_1$ and $\Sigma_2$ that are equally spaced about the central wavelength, $\Sigma_{central}$, by the wavelength of separation, $\Sigma_{separation}$ (plotted on the x-axis in FIG. 11A). When viewed, the viewer's eye combines the light from the two LEDs to "see" light at the central wavelength, $\Sigma_{central}$. The relative lumen output (plotted on the y-axis in FIG. 11A) is a ratio of the lumen output for a system having two LEDs that emit light at wavelengths ($\Sigma_1$ and $\Sigma_2$) equally spaced from the central wavelength ($\Sigma_{central}$) by the wavelength of separation ($\Sigma_{separation}$) to the lumen output of a system having two LEDs that each emit light at a wavelength equal to the central wavelength ($\Sigma_{central}$).

In the example shown in FIG. 11A, a central wavelength of 525 nm was used to calculate the relative lumen output. For example, a two LED system having a central wavelength of 525 nm and a wavelength of separation of 15 nm includes an LED configured to emit light at a wavelength of 510 nm in combination with an LED configured to emit light at a wavelength of 540 nm. The relative lumen output for such a system is calculated by dividing the lumen output of the two LED system that includes LEDs that emit light at a wavelengths of 510 nm and 540 nm to the lumen output of a one LED system that includes one LED configured to emit light at the central wavelength of 525 nm.

FIG. 12A, shows a graph of the relative lumen output increase versus wavelength of separation for an LED system having three LEDs that emit differing wavelengths of light. As shown in FIG. 12B, the three LED system includes a first LED that emits light of a central wavelength ($\Sigma_{central}$), a second LED that emits light of a wavelength $\Sigma_1$ that is less than the central wavelength ($\Sigma_{central}$) by the wavelength of separation ($\Sigma_{separation}$), and a third LED that emits light of a wavelength $\Sigma_1$ that is greater than the central wavelength ($\Sigma_{central}$) by the wavelength of separation ($\Sigma_{separation}$). The relative lumen output (plotted on the y-axis in FIG. 12A) is a ratio of the lumen output for a system having three LEDs that emit light at wavelengths $\Sigma_{central}$, $\Sigma_1$, and $\Sigma_2$ to the lumen output of a system having one LED configured to emit light at a wavelength equal to the central wavelength ($\Sigma_{central}$).

In the example shown in FIG. 12A, a central wavelength of 525 nm was used to calculate the relative lumen output. For example, a three LED system having a central wavelength of 525 nm and a wavelength of separation of 25 nm includes an LED configured to emit light at a wavelength of 500 nm, an LED configured to emit light at a wavelength of 525 nm, and an LED configured to emit light at a wavelength of 550 nm. The relative lumen output for such a system is calculated by dividing the lumen output of the three LED system that includes LEDs that emit light at a wavelengths of 500 nm, 525 nm, and 550 nm to the lumen output of a three LED system that includes three LEDs each configured to emit light at the central wavelength of 525 nm.

In some embodiments, different LEDs can emit light having similar but different wavelengths. For example, the wavelength of light emitted by one LED can be offset from the wavelength of light emitted by another LED by at least about 1 nm (e.g., about 5 nm, about 10 nm, about 20 nm, about 30 nm, about 40 nm, about 50 nm, about 60 nm, about 70 nm, about 80 nm, about 90 nm, about 100 nm).

Figure 13:
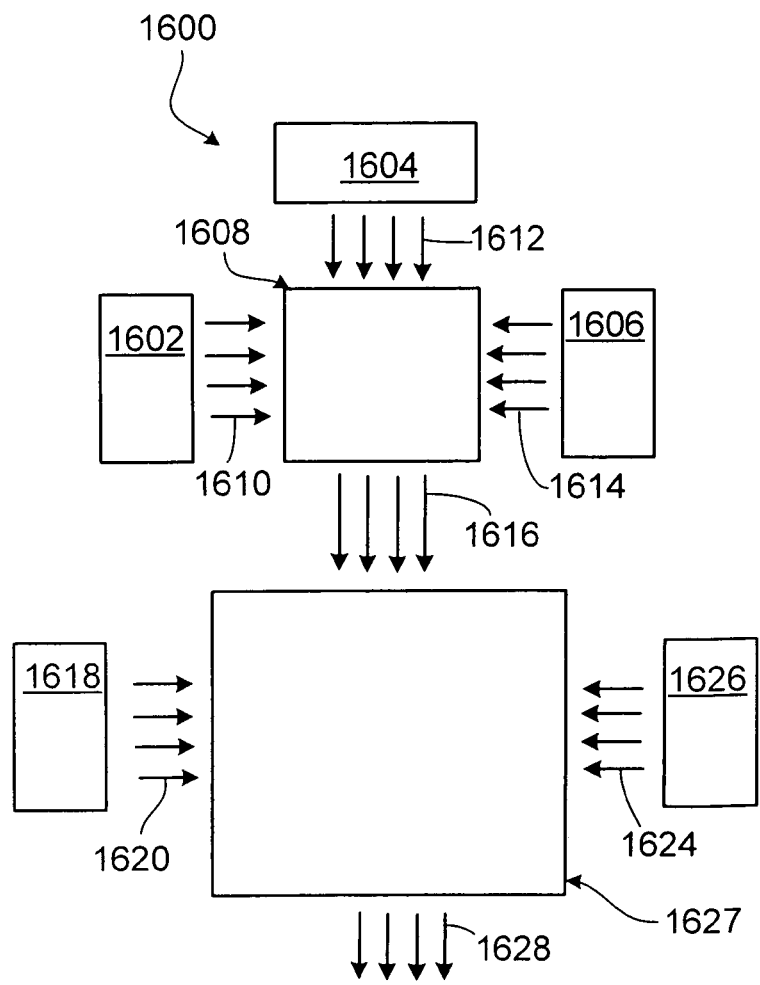
FIG. 13 is a schematic representation of an optical display system.

FIG. 13 shows an optical display system 1600 including green LEDs 1602, 1604 and 1606 (e.g., LEDs with a dominant output wavelengths from about 500 to about 550 nm), a blue LED 1618 (e.g., an LED with a dominant output wavelength from about 450 to about 480 nm), and a red LED 1626 (e.g., an LED with a dominant output wavelength from about 610 to about 650 nm) which are each in optical communication with associated beam aggregation devices 1608 and 1622. Light emitted from LEDs 1602, 1604, and 1606 is collected by beam aggregation device 1608 (e.g., an x-cube) that combines multiple beams of light 1610, 1612, and 1614 emitted by LEDs 1602, 1604, and 1606, respectively, into a single beam 1616 that can be directed to beam aggregation device 1622. It is believed that combining the light generated by multiple LEDs 1602, 1604, and 1606 having similar but different wavelengths can increase the intensity of the output from system 1600. It is also believed that combining the light emitted from multiple LEDs 1602, 1604, and 1606 can compensate for a disparity in efficiency between LEDs of various colors. For example, in some embodiments, a blue LED and/or a red LED may more efficiently emit light than a green LED. Therefore, using multiple green LEDs having similar but different wavelengths can compensate for the difference in efficiency. The light 1616 transmitted by the beam aggregation device 1608 is combined with light from blue LED 1618 and red LED 1626 by beam aggregation device 1622 to generate an output 1628.

In general, the wavelengths of light emitted by green LEDs 1602, 1604, and 1606 can be selected as desired. In some embodiments, the green LEDs emit light having wavelengths selected relative to a average or median wavelength of about 520 nm to about 525 nm. For example, LED 1604 can be selected to emit light having a wavelength about equal to the average wavelength, LED 1602 can emit light having a wavelength at least about 1 nm (e.g., about 5 nm, about 10 nm, about 20 nm, about 30 nm, about 40 nm, about 50 nm) greater than the average wavelength, and LED 1606 can emit light having a wavelength at least about 1 nm (e.g., about 5 nm, about 10 nm, about 20 nm, about 30 nm, about 40 nm, about 50 nm) less than the average wavelength. A viewer's eye generally combines the similar but different wavelengths of light emitted from LEDs 1602, 1604, and 1606 to "see" a color about equal to the color of the average wavelength. In some embodiments, the average wavelength can be about 525 nm and LEDs 1602, 1604, and 1606 can be selected to emit light having wavelengths of about 500 nm, about 525 nm, and about 550 nm, respectively. Other exemplary wavelength combinations for a three LED system are shown in table 1 below.

TABLE 1

| Wavelength 1 | Wavelength 2 | Wavelength 3 |
|---|---|---|
| about 515 nm | about 520 nm | about 525 nm |
| about 510 nm | about 520 nm | about 530 nm |
| about 505 nm | about 520 nm | about 535 nm |

TABLE 1-continued

| Wavelength 1 | Wavelength 2 | Wavelength 3 |
|---|---|---|
| about 500 nm | about 520 nm | about 540 nm |
| about 520 nm | about 525 nm | about 530 nm |
| about 515 nm | about 525 nm | about 535 nm |
| about 510 nm | about 525 nm | about 540 nm |
| about 505 nm | about 525 nm | about 545 nm |
| about 500 nm | about 525 nm | about 550 nm |
| about 515 to | about 520 to | about 525 to |
| about 520 nm | about 525 nm | about 530 nm |
| about 510 to | about 520 to | about 530 to |
| about 515 nm | about 525 nm | about 535 nm |
| about 505 to | about 520 to | about 535 to |
| about 510 nm | about 525 nm | about 540 nm |
| about 500 to | about 520 to | about 540 to |
| about 505 nm | about 525 nm | about 545 nm |
| about 495 to | about 520 to | about 545 to |
| about 500 nm | about 525 nm | about 550 nm |
| about 511 nm | about 513 nm | about 550 nm |
| about 510 nm | about 531 nm | about 532 nm |
| about 495 nm | about 525 nm | about 555 nm |

Figure 14:
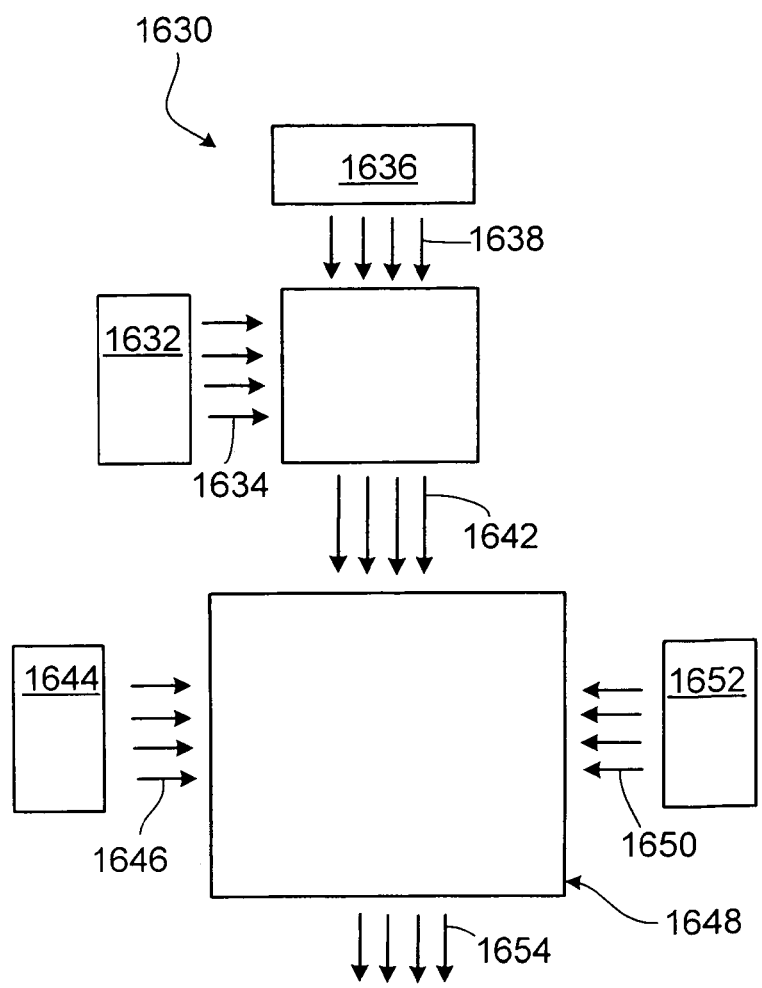
FIG. 14 is a schematic representation of an optical display system.

FIG. 14 shows an optical display system 1630 including two green LEDs 1632 and 1636 (e.g., LEDs with a dominant output wavelengths from about 500 to about 550 nm), a blue LED 1644 (e.g., an LED with a dominant output wavelength from about 450 to about 480 nm), and a red LED 1652 (e.g., an LED with a dominant output wavelength from about 610 to about 650 nm) which are in optical communication with associated beam aggregation devices 1640 and 1654. Light (represented by arrows 1634 and 1638) emitted from LEDs 1632 and 1636 is collected by a device 1640 that combines the beams into a single beam 1642 that can be directed to a second beam aggregation device 1648. The light 1642 transmitted by the beam aggregation device 1640 is combined with light 1646 from blue LED 1644 and light 1650 from red LED 1652 by beam aggregation device 1648 to generate an output beam 1654.

The wavelengths of light emitted by LEDs 1632 and 1636 can be selected as desired. In certain embodiments, LED 1632 can emit light having a wavelength at least about 1 nm (e.g., about 5 nm, about 10 nm, about 20 nm, about 30 nm, about 40 nm, about 50 nm) greater than an average wavelength and LED 1636 can emit light having a wavelength at least about 1 nm (e.g., about 5 nm, about 10 nm, about 20 nm, about 30 nm, about 40 nm, about 50 nm) less than an average wavelength. A viewer's eye generally combines the similar but different wavelengths of LEDs 1632 and 1636 to "see" a color about equal to the color of the average wavelength. In certain embodiments, the average wavelength can be about 525 nm and LEDs 1632 and 1636 can be selected to emit light having wavelengths of about 500 nm and about 550 nm, respectively. Other exemplary wavelength combinations for a two LED system are shown in table 2 below.

TABLE 2

| Wavelength 1 | Wavelength 2 |
|---|---|
| about 515 nm | about 525 nm |
| about 510 nm | about 530 nm |
| about 505 nm | about 535 nm |
| about 500 nm | about 540 nm |
| about 520 nm | about 530 nm |
| about 515 nm | about 535 nm |
| about 510 nm | about 540 nm |
| about 505 nm | about 545 nm |
| about 500 nm | about 550 nm |
| about 515 to about 520 nm | about 525 to about 530 nm |
| about 510 to about 515 nm | about 530 to about 535 nm |

TABLE 2-continued

| Wavelength 1 | Wavelength 2 |
|---|---|
| about 505 to about 510 nm | about 535 to about 540 nm |
| about 500 to about 505 nm | about 540 to about 545 nm |
| about 495 to about 500 nm | about 545 to about 550 nm |

While systems that include multiple green LEDs have been described above, multiple LEDs having different dominant wavelengths may be optically combined to produce other resulting colors (e.g., red, blue, yellow, cyan). In some embodiments, a system can include multiple red LEDs (e.g., three LEDs having wavelengths of about 605 nm, about 625 nm, and about 645 nm, two LEDs having wavelengths of about 610 nm and about 640 nm). In certain embodiments, a system can include multiple blue LEDs (e.g., three LEDs having wavelengths of about 440 nm, about 460 nm, and about 480 nm, two LEDs having wavelengths of about 445 nm and about 475 nm). In certain embodiments, the optical display system includes red, green, and blue light emitting devices as described above. In certain embodiments, other colors and combinations are possible. For example, the system need not have only three colors. Additional colors such as yellow and/or cyan may be included.

The color combination can be accomplished for example using filters (e.g. a dichroic mirror). For example, to minimize optical loss, the transmission of the filter may contain a sharp edge to separate two LED colors. In some embodiments, the sharp edge of the filter is chosen to occur at the intersection of the emission spectra of the two of the multiple LEDs being considered in the optical system. In general, filters can be chosen for each LED being combined into the optical beam path. For example, the LED filter may be chosen such it transmits all previous LED wavelengths but reflect the wavelength being added to the optical beam path.

In some embodiments, the duty cycle for the lesser efficient LED (e.g. green) can be increased by various data compression techniques and algorithms. For example, sending only the difference in image information from the previous image rather than the total information required to reconstruct each image allows an increase in the data rate. Using this method, less data needs to be sent allowing for higher data rates and reduced duty cycles for complementary colors for a given refresh cycle.

In embodiments in which multiple LEDs are used to illuminate a given microdisplay, optical componentry may or may not be present along the light path between one or more of the LEDs and the microdisplay. For example, an x-cube or a set of dichroic mirrors may be used to combine light from the multiple LEDs onto a single microdisplay. In embodiments in which optical componentry is present along the light path, different optical componentry can be used for each LED (e.g. if the surface of the LEDs are of different size or shape), or the same optical componentry can be used for more than one LED.

In some embodiments, differing brightness for a particular color based on the desired chromaticity of an image may be obtained by illuminating the display for a portion of the activation time allocated to the particular LED. For example, to obtain an intense blue, the blue LED can be activated for the entire activation time and for a less intense blue, the blue LED is activated for only a portion of the total allocated activation time. The portion of the activation time used to illuminate the display can be modulated, for example, by a set of mirrors that can be positioned to either pass light to the microdisplay or reflect the light away from the microdisplay.

In certain embodiments, an array of movable microdisplays (e.g., a movable mirror) is actuated to produce a desired intensity. For example, each micromirror can represent a pixel and the intensity of the pixel can be determined by the positioning of the microdisplay. For example, the micromirror can be in an on or an off state and the proportion of the time spent in the on state during the activation time of a particular color of LED determines the intensity of the image.

In general, in embodiments in which multiple LEDs are used, one or more of the LEDs (e.g., each LED) can have the aspect ratio relationship described above with respect to the aspect ratio of microdisplay 1130.

Figure 15:
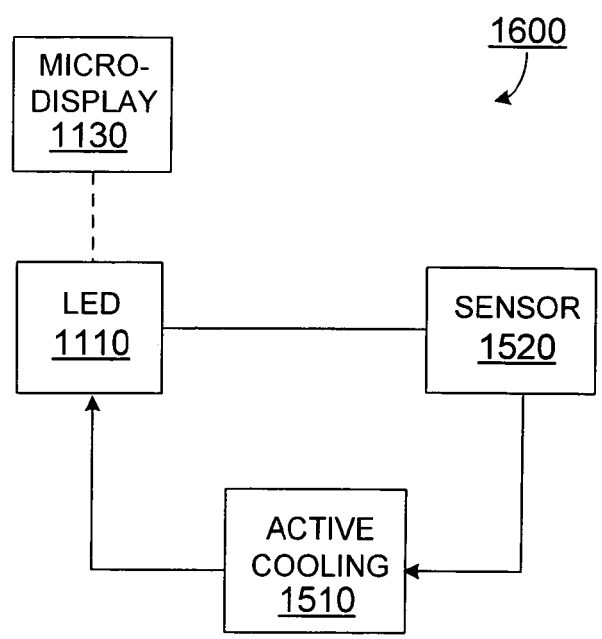
FIG. 15 is a schematic representation of an optical display system.

FIG. 15 shows an optical display system 1600 that includes LED 1110, microdisplay 1130, a cooling system 1510, and a sensor 1520 that is in thermal communication with LED 1110 and electrical communication with cooling system 1510 so that, during use of system 1600, sensor 1520 and cooling system 1510 can be used to regulate the temperature of LED 1110. This can be desirable, for example, when LED 1110 is a relatively large are LED (see discussion below) because such an LED can generate a significant amount of heat. With the arrangement shown in FIG. 11, the amount of power input to LED 1110 can be increased with (primarily, increased operational efficiency at higher drive currents) reduced risk of damaging LED 1110 via the use of sensor 1520 and cooling system 1510 to cool LED 1110. Examples of cooling systems include thermal electric coolers, fans, heat pipes, and liquid cooling systems. Sensor 1520 can be, for example, manually controlled or computer controlled. In some embodiments, the system may not include a sensor (e.g., cooling system 1510 can be permanently on, or can be manually controlled). The use of a cooling system can provide multiple advantages such as reducing the likelihood of damage to the LED resulting from an excess temperature and increasing the efficiency of the LED at higher drive currents. The cooling system may also reduce the shift in wavelength induced by temperature.

In some embodiments, using a non-lambertian LED results in non-uniform angular distribution of light. In such embodiments, the microdisplay can be translated away from the image plane to reduce the appearance of the angular non-uniformity. In certain embodiments, information flow to the microdisplay can be achieved using an electrical or optical connection. In some examples, the rate of information flow can be increased using an optical connection.

In some embodiments, the size of a PLLED or other non-lambertian source can be increased and the light can be collected at a smaller angle. This can increase the brightness of the image on a display.

Figure 16:
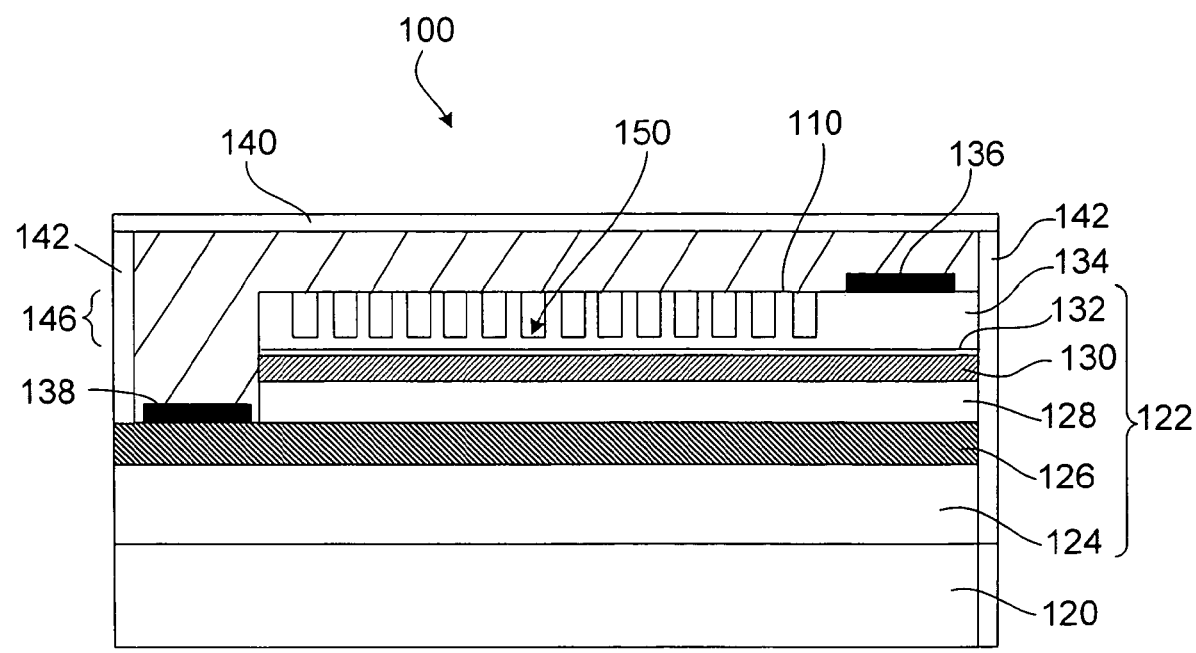
FIG. 16 is a cross-sectional view of an LED with a patterned surface.

FIG. 16 shows a side view of an LED 100 in the form of a packaged die. LED 100 includes a multi-layer stack 122 disposed on a submount 120. Multi-layer stack 122 includes a 320 nm thick silicon doped (n-doped) GaN layer 134 having a pattern of openings 150 in its upper surface 110. Multi-layer stack 122 also includes a bonding layer 124, a 100 nm thick silver layer 126, a 40 nm thick magnesium doped (p-doped) GaN layer 128, a 120 nm thick light-generating region 130 formed of multiple InGaN/GaN quantum wells, and a AlGaN layer 132. An n-side contact pad 136 is disposed on layer 134, and a p-side contact pad 138 is disposed on layer 126. An encapsulant material (epoxy having an index of refraction of 1.5) 144 is present between layer 134 and a cover slip 140 and supports 142. Layer 144 does not extend into openings 150.

Light is generated by LED 100 as follows. P-side contact pad 138 is held at a positive potential relative to n-side contact pad 136, which causes electrical current to be injected into LED 100. As the electrical current passes through light-generating region 130, electrons from n-doped layer 134 combine in region 130 with holes from p-doped layer 128, which causes region 130 to generate light. Light-generating region 130 contains a multitude of point dipole radiation sources that emit light (e.g., isotropically) within the region 130 with a spectrum of wavelengths characteristic of the material from which light-generating region 130 is formed. For InGaN/GaN quantum wells, the spectrum of wavelengths of light generated by region 130 can have a peak wavelength of about 445 nanometers (nm) and a full width at half maximum (FWHM) of about 30 nm.

It is to be noted that the charge carriers in p-doped layer 126 have relatively low mobility compared to the charge carriers in the n-doped semiconductor layer 134. As a result, placing silver layer 126 (which is conductive) along the surface of p-doped layer 128 can enhance the uniformity of charge injection from contact pad 138 into p-doped layer 128 and light-generating region 130. This can also reduce the electrical resistance of device 100 and/or increase the injection efficiency of device 100. Because of the relatively high charge carrier mobility of the n-doped layer 134, electrons can spread relatively quickly from n-side contact pad 136 throughout layers 132 and 134, so that the current density within the light-generating region 130 is substantially uniform across the region 130. It is also to be noted that silver layer 126 has relatively high thermal conductivity, allowing layer 126 to act as a heat sink for LED 100 (to transfer heat vertically from the multi-layer stack 122 to submount 120).

At least some of the light that is generated by region 130 is directed toward silver layer 126. This light can be reflected by layer 126 and emerge from LED 100 via surface 110, or can be reflected by layer 126 and then absorbed within the semiconductor material in LED 100 to produce an electron-hole pair that can combine in region 130, causing region 130 to generate light. Similarly, at least some of the light that is generated by region 130 is directed toward pad 136. The underside of pad 136 is formed of a material (e.g., a Ti/Al/Ni/Au alloy) that can reflect at least some of the light generated by light-generating region 130. Accordingly, the light that is directed to pad 136 can be reflected by pad 136 and subsequently emerge from LED 100 via surface 110 (e.g., by being reflected from silver layer 126), or the light that is directed to pad 136 can be reflected by pad 136 and then absorbed within the semiconductor material in LED 100 to produce an electron-hole pair that can combine in region 130, causing region 130 to generate light (e.g., with or without being reflected by silver layer 126).

Figure 17:
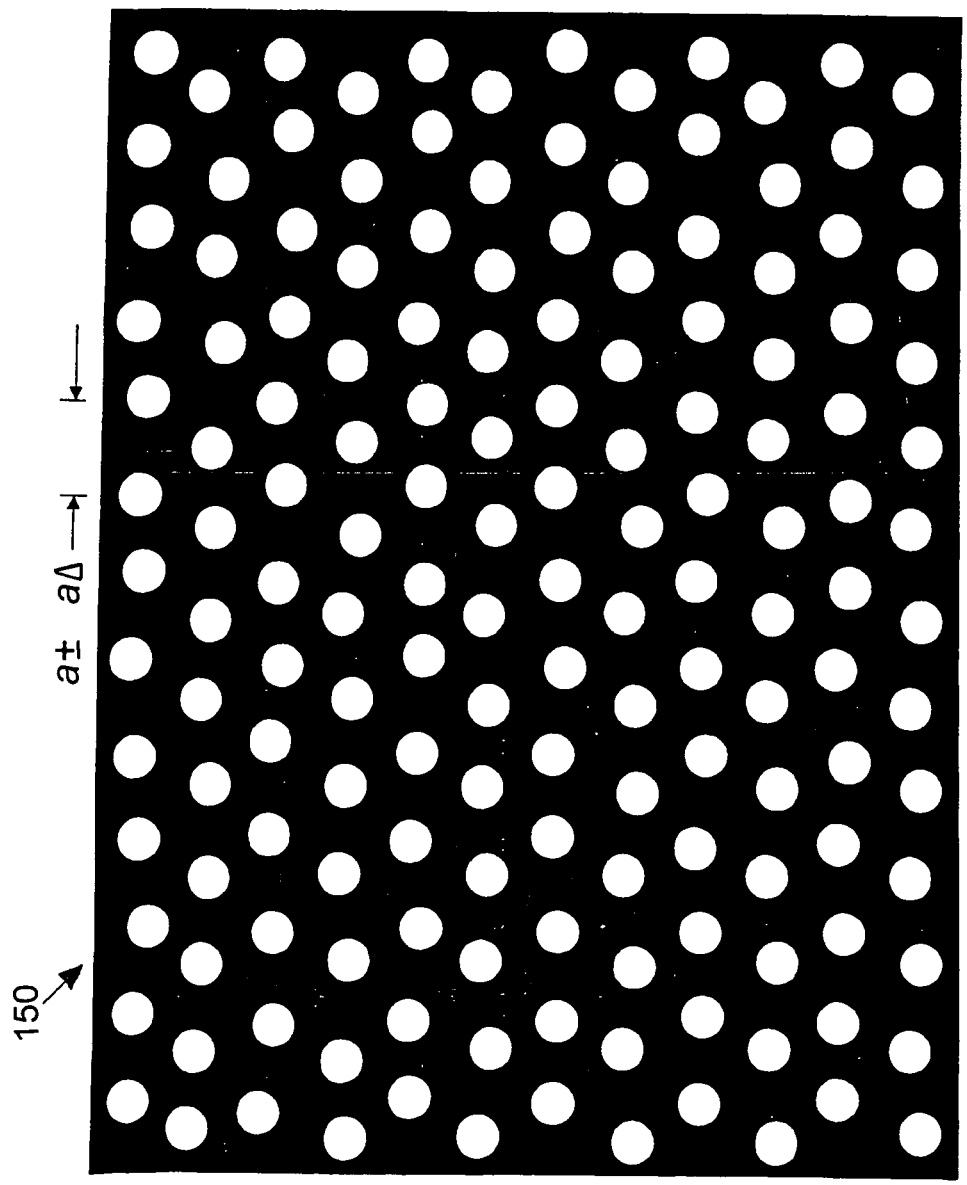
FIG. 17 is a top view the patterned surface of the LED of FIG. 16.

As shown in FIGS. 16 and 17, surface 110 of LED 100 is not flat but consists of a modified triangular pattern of openings 150. In general, various values can be selected for the depth of openings 150, the diameter of openings 150 and the spacing between nearest neighbors in openings 150 can vary. Unless otherwise noted, for purposes of the figures below showing the results of numerical calculations, openings 150 have a depth 146 equal to about 280 nm, a non-zero diameter of about 160 nm, a spacing between nearest neighbors or about 220 nm, and an index of refraction equal to 1.0. The triangular pattern is detuned so that the nearest neighbors in pattern 150 have a center-to-center distance with a value between (a−Δa) and (a+Δa), where "a" is the lattice constant for an ideal triangular pattern and "Δa" is a detuning parameter with dimensions of length and where the detuning can occur in random directions. To enhance light extraction from LED 100 (see discussion below), detuning parameter, Δa, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between (a−Δa) and (a+Δa), such that pattern 150 is substantially randomly detuned.

For the modified triangular pattern of openings 150, it has been found that a non-zero detuning parameter enhances the extraction efficiency of an LED 100. For LED 100 described above, as the detuning parameter Δa increases from zero to about 0.15a, numerical modeling (described below) of the electromagnetic fields in the LED 100 has shown that the extraction efficiency of the device increases from about 0.60 to about 0.70, as shown in FIG. 18.

Figure 18:
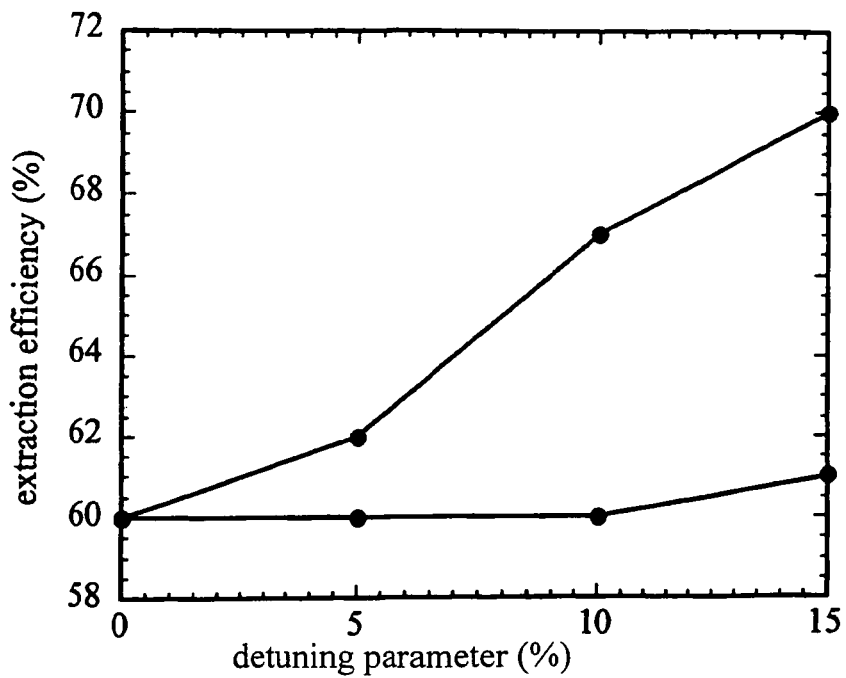
FIG. 18 is a graph of an extraction efficiency of an LED with a patterned surface as function of a detuning parameter.

The extraction efficiency data shown in FIG. 18 are calculated by using a three-dimensional finite-difference time-domain (FDTD) method to approximate solutions to Maxwell's equations for the light within and outside of LED 100. See, for example, K. S. Kunz and R. J. Luebbers, *The Finite-Difference Time-Domain Methods* (CRC, Boca Raton, Fla., 1993); A. Taflove, *Computational Electrodynamics: The Finite-Difference Time-Domain Method* (Artech House, London, 1995), both of which are hereby incorporated by reference. To represent the optical behavior of LED 100 with a particular pattern 150, input parameters in a FDTD calculation include the center frequency and bandwidth of the light emitted by the point dipole radiation sources in light-generating region 130, the dimensions and dielectric properties of the layers within multilayer stack 122, and the diameters, depths, and nearest neighbor distances (NND) between openings in pattern 150.

In certain embodiments, extraction efficiency data for LED 100 are calculated using an FDTD method as follows. The FDTD method is used to solve the full-vector time-dependent Maxwell's equations:

$$\vec{\nabla} \times \vec{E} = -\mu \frac{\partial \vec{H}}{\partial t}, \vec{\nabla} \times \vec{H} = \varepsilon_\infty \frac{\partial \vec{E}}{\partial t} + \frac{\partial \vec{P}}{\partial t},$$

where the polarizability $\vec{P} = \vec{P}_1 + \vec{P}_2 + \ldots + \vec{P}_m$ captures the frequency-dependent response of the quantum well light-generating region 130, the p-contact layer 126 and other layers within LED 100. The individual $\vec{P}_m$ terms are empirically derived values of different contributions to the overall polarizability of a material (e.g., the polarization response for bound electron oscillations, the polarization response for free electron oscillations). In particular, $$\frac{d^2 \vec{P}_m}{dt^2} + \gamma_m \frac{d \vec{P}_m}{dt} + \omega_m^2 \vec{P}_m = \varepsilon(\omega) \vec{E},$$

where the polarization corresponds to a dielectric constant $$\varepsilon(\omega) = \varepsilon_\infty + \sum_m \frac{s_m}{\omega_m^2 - \omega^2 - i\gamma_m \omega}.$$

For purposes of the numerical calculations, the only layers that are considered are encapsulant 144, silver layer 126 and layers between encapsulant 144 and silver layer 126. This approximation is based on the assumption that encapsulant 144 and layer 126 are thick enough so that surrounding layers do not influence the optical performance of LED 100. The relevant structures within LED 100 that are assumed to have a frequency dependent dielectric constant are silver layer 126 and light-generating region 130. The other relevant layers within LED 100 are assumed to not have frequency dependent dielectric constants. It is to be noted that in embodiments in which LED 100 includes additional metal layers between encapsulant 144 and silver layer 126, each of the additional metal layers will have a corresponding frequency dependent dielectric constant. It is also to be noted that silver layer 126 (and any other metal layer in LED 100) has a frequency dependent term for both bound electrons and free electrons, whereas light-generating region 130 has a frequency dependent term for bound electrons but does not have a frequency dependent term for free electrons. In certain embodiments, other terms can be included when modeling the frequency dependence of the dielectric constant. Such terms may include, for example, electron-phonon interactions, atomic polarizations, ionic polarizations and/or molecular polarizations.

The emission of light from the quantum well region of light-generating region 130 is modeled by incorporating a number of randomly-placed, constant-current dipole sources within the light-generating region 130, each emitting short Gaussian pulses of spectral width equal to that of the actual quantum well, each with random initial phase and start-time.

To cope with the pattern of openings 150 in surface 110 of the LED 100, a large supercell in the lateral direction is used, along with periodic boundary conditions. This can assist in simulating relatively large (e.g., greater than 0.01 mm on edge) device sizes. The full evolution equations are solved in time, long after all dipole sources have emitted their energy, until no energy remains in the system. During the simulation, the total energy emitted, the energy flux extracted through top surface 110, and the energy absorbed by the quantum wells and the n-doped layer is monitored. Through Fourier transforms both in time and space, frequency and angle resolved data of the extracted flux are obtained, and therefore an angle- and frequency-resolved extraction efficiency can be calculated. By matching the total energy emitted with the experimentally known luminescence of light-generating region 130, absolute angle-resolved extraction in lumens/per solid angle/per chip area for given electrical input is obtained.

Without wishing to be bound by theory, it is believed that the detuned pattern 150 can enhance the efficiency with which light generated in region 130 emerges from LED 100 via surface 110 because openings 150 create a dielectric function that varies spatially in layer 134 according to pattern 150. It is believed that this alters the density of radiation modes (i.e., light modes that emerge from surface 110) and guided modes (i.e., light modes that are confined within multi-layer stack 122) within LED 100, and that this alteration to the density of radiation modes and guided modes within LED 100 results in some light that would otherwise be emitted into guided modes in the absence of pattern 150 being scattered (e.g., Bragg scattered) into modes that can leak into radiation modes. In certain embodiments, it is believed that pattern 150 (e.g., the pattern discussed above, or one of the patterns discussed below) can eliminate all of the guided modes within LED 100.

It is believed that the effect of detuning of the lattice can be understood by considering Bragg scattering off of a crystal having point scattering sites. For a perfect lattice arranged in lattice planes separated by a distance d, monochromatic light of wavelength $\lambda$ is scattered through an angle $\theta$ according to the Bragg condition, $n\lambda = 2 d \sin \theta$, where n is an integer that gives the order of the scattering. However, it is believed that for a light source having a spectral bandwidth $\Delta\lambda/\lambda$ and emitting into a solid angle $\Delta\Theta$, the Bragg condition can be relaxed by detuning the spacing of between lattice sites by a detuning parameter $\Delta a$. It is believed that detuning the lattice increases the scattering effectiveness and angular acceptance of the pattern over the spectral bandwidth and spatial emission profile of the source.

While a modified triangular pattern 150 having a non-zero detuning parameter $\Delta a$ has been described that can enhance light extraction from LED 100, other patterns can also be used to enhance light extraction from LED 100. When determining whether a given pattern enhances light extraction from LED 100 and/or what pattern of openings may be used to enhance light extraction from LED 100, physical insight may first be used to approximate a basic pattern that can enhance light extraction before conducting such numerical calculations.

Figure 19:
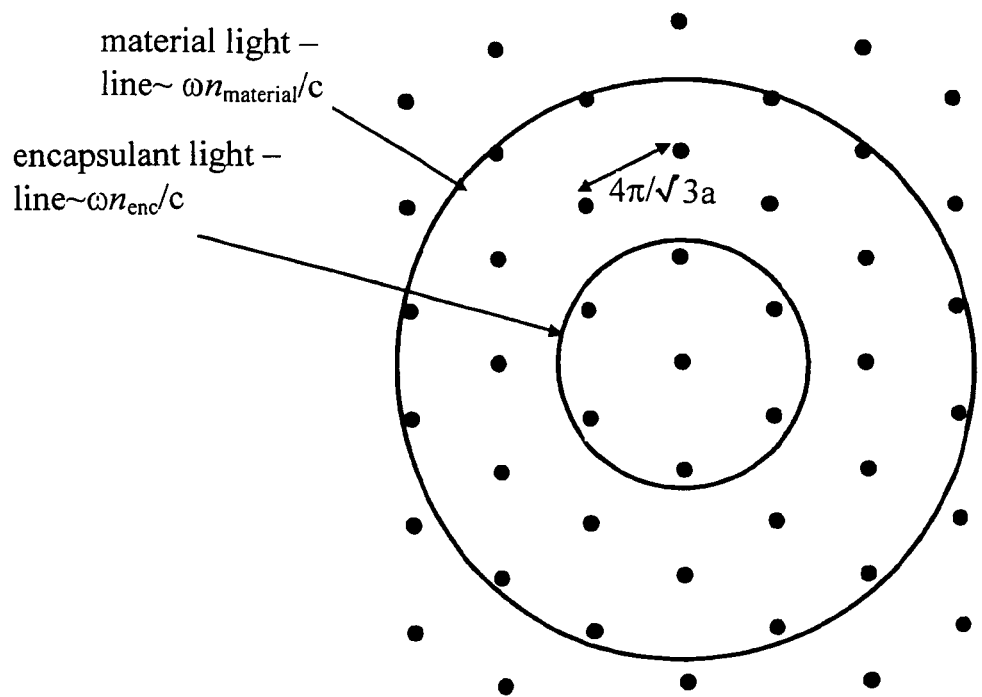
FIG. 19 is a schematic representation of the Fourier transformation of a patterned surface of an LED.

The extraction efficiency of LED 100 can be further understood (e.g., in the weak scattering regime) by considering the Fourier transform of the dielectric function that varies spatially according to pattern 150. FIG. 19 depicts the Fourier transform for an ideal triangular lattice. Extraction of light into a particular direction with in plane wavevector k is related to the source emission $S_{k'}$ into all those modes with in plane wavevector k' (i.e. parallel to pattern 150) that are compatible to k by the addition or subtraction of a reciprocal lattice vector G, i.e $k=k'\pm G$. The extraction efficiency is proportional to the magnitude of the corresponding Fourier component ($F_k$) of the dielectric function $\varepsilon_G$ given by $$F_{\vec{k}} = c_{\vec{k}} \sum_{\vec{G}} \varepsilon_{\vec{G}} S_{\vec{k}-\vec{G}}, \; \varepsilon_{\vec{G}} = \int \varepsilon(\vec{r}) e^{-i\vec{G}\vec{r}} d\vec{r}$$

Since light propagating in the material generally satisfies the equation $k^2(\text{in-plane}) + k^2(\text{normal}) = \varepsilon(\omega/c)^2$, the maximum G to be considered is fixed by the frequency ($\omega$) emitted by the light-generating region and the dielectric constant of the light-generating region. As shown in FIG. 19, this defines a ring in reciprocal space which is often called the light line. The light line will be an annulus due to the finite bandwidth of the light-generating region but for sake of clarity we illustrate the light line of a monochromatic source. Similarly, light propagating within the encapsulant is bounded by a light line (the inner circle in FIG. 19). Therefore, the extraction efficiency is improved by increasing $F_k$ for all directions k that lie within the encapsulant light-line which amounts to increasing the number of G points within the encapsulant light line and increasing the scattering strength $\varepsilon_G$ for G points which lie within the material light line. This physical insight can be used when selecting patterns that can improve extraction efficiency.

Figure 20:
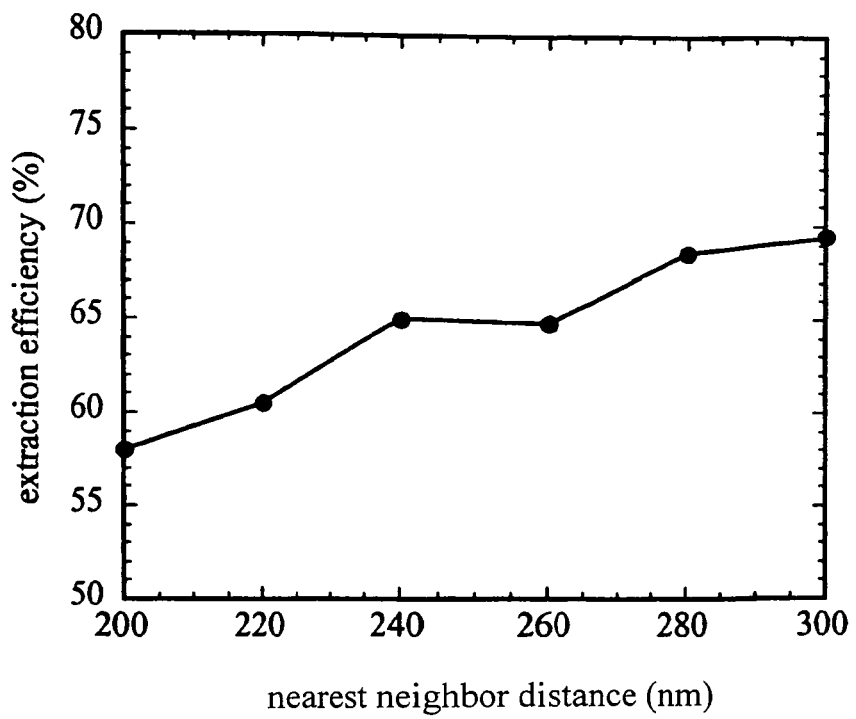
FIG. 20 is a graph of an extraction efficiency of an LED with a patterned surface as function of nearest neighbor distance.

As an example, FIG. 20 shows the effect of increasing lattice constant for an ideal triangular pattern. The data shown in FIG. 20 are calculated using the parameters given for LED 100 shown in FIG. 16, except that the emitted light has a peak wavelength of 450 nm, and the depth of the holes, the diameter of the holes, and the thickness of the n-doped layer 134 scale with the nearest neighbor distance, a, as 1.27a, 0.72a, and 1.27a+40 nm, respectively. Increasing the lattice constant, increases the density of G points within the light-line of the encapsulant. A clear trend in extraction efficiency with NND is observed. It is believed that the maximum extraction efficiency occurs for NND approximately equal to the wavelength of light in vacuum. The reason a maximum is achieved, is that as the NND becomes much larger than the wavelength of light, the scattering effect is reduced because the material becomes more uniform.

Figure 21:
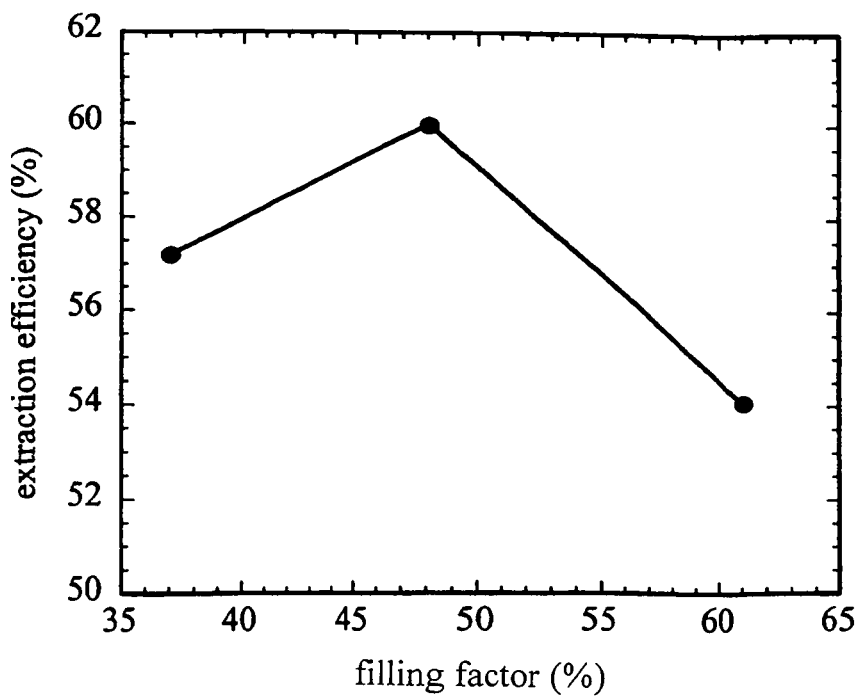
FIG. 21 is a graph of an extraction efficiency of an LED with a patterned surface as function of a filling factor.

As another example, FIG. 21 shows the effect of increasing hole size or filling factor. The filling factor for a triangular pattern is given by $(2\pi/\sqrt{3})*(r/a)^2$, where r is the radius of a hole. The data shown in FIG. 21 are calculated using the parameters given for the LED 100 shown in FIG. 16, except that the diameter of the openings is changed according the filling factor value given on the x-axis of the graph. The extraction efficiency increases with filling factor as the scattering strengths ($\in_G$) increase. A maximum is observed for this particular system at a filling factor of ~48%. In certain embodiments, LED 100 has a filling factor of at least about 10% (e.g., at least about 15%, at least about 20%) and/or at most about 90% (e.g., at most about 80%, at most about 70%, at most about 60%).

Figure 22:
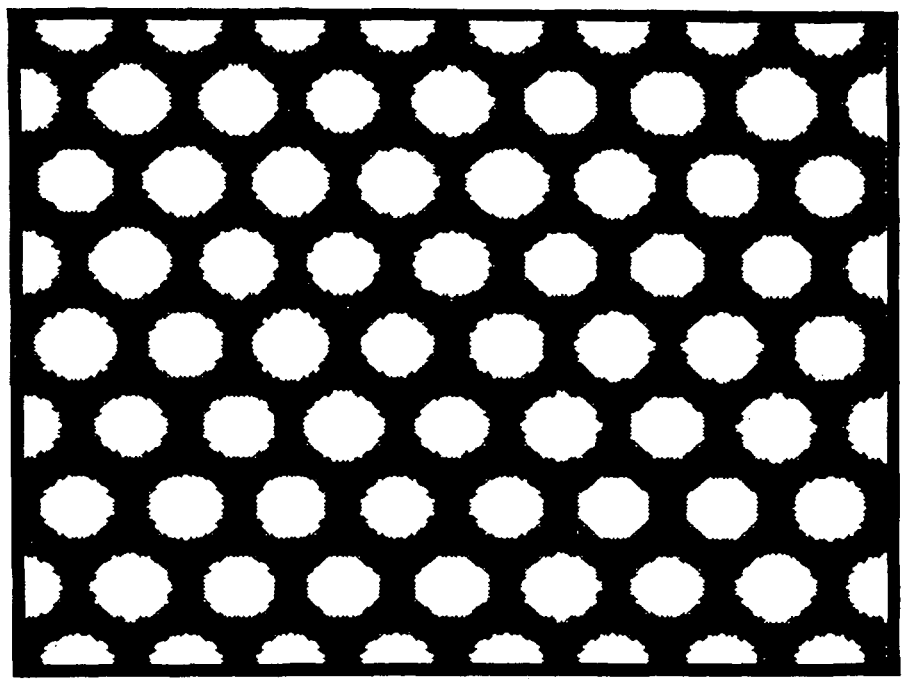
FIG. 22 is a top view a patterned surface of an LED.

While a modified triangular pattern has been described in which a detuning parameter relates to positioning of openings in the pattern from the positions in an ideal triangular lattice, a modified (detuned) triangular pattern may also be achieved by modifying the holes in an ideal triangular pattern while keeping the centers at the positions for an ideal triangular pattern. FIG. 22 shows an embodiment of such a pattern. The enhancement in light extraction, the methodology for conducting the corresponding numerical calculation, and the physical explanation of the enhanced light extraction for a light-emitting device having the pattern shown in FIG. 22 is generally the same as described above. In some embodiments, a modified (detuned) pattern can have openings that are displaced from the ideal locations and openings at the ideal locations but with varying diameters.

In other embodiments, enhanced light extraction from a light-emitting device can be achieved by using different types of patterns, including, for example, complex periodic patterns and nonperiodic patterns. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. As discussed below, in some embodiments, a complex periodic pattern can have certain openings with one diameter and other openings with a smaller diameter. As referred to herein, a nonperiodic pattern is a pattern that has no translational symmetry over a unit cell that has a length that is at least 50 times the peak wavelength of light generated by region 130. Examples of nonperiodic patterns include aperiodic patterns, quasicrystalline patterns, Robinson patterns, and Amman patterns.

Figure 23:
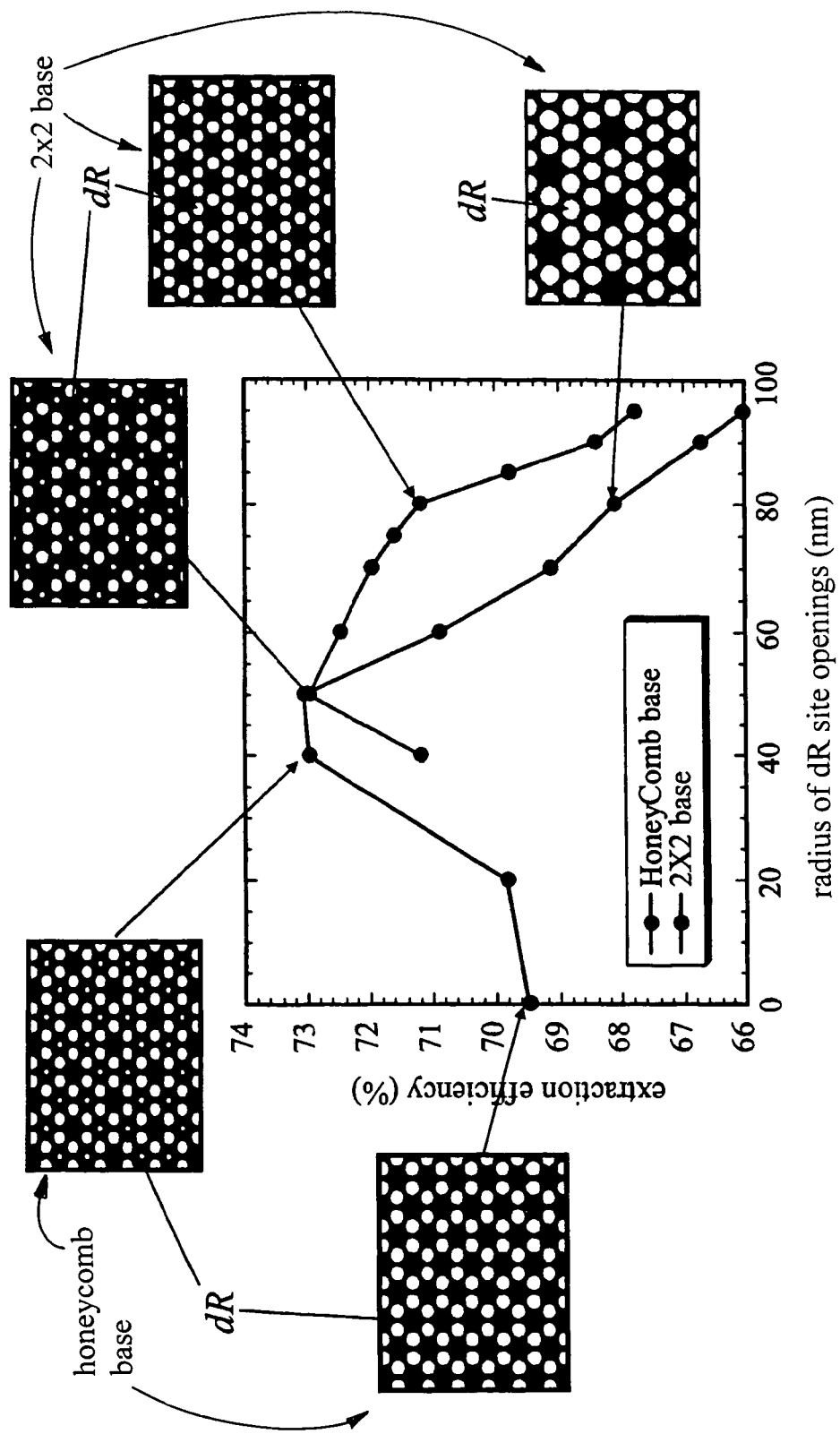
FIG. 23 is a graph of an extraction efficiency of LEDs with different surface patterns.

FIG. 23 shows numerical calculations for LED 100 for two different complex periodic patterns in which certain openings in the patterns have a particular diameter, and other openings in the patterns have smaller diameters. The numerical calculations represented in FIG. 23 show the behavior of the extraction efficiency (larger holes with a diameter of 80 nm) as the diameter of the smaller holes (dR) is varied from zero nm to 95 nm. The data shown in FIG. 21 are calculated using the parameters given for the LED 100 shown in FIG. 16 except that the diameter of the openings is changed according the filling factor value given on the x-axis of the graph. Without wishing to be bound by theory, multiple hole sizes allow scattering from multiple periodicities within the pattern, therefore increasing the angular acceptance and spectral effectiveness of the pattern. The enhancement in light extraction, the methodology for conducting the corresponding numerical calculation, and the physical explanation of the enhanced light extraction for a light-emitting device having the pattern shown in FIG. 23 is generally the same as described above.

FIG. 24 shows numerical calculations for LED 100 having different ring patterns (complex periodic patterns). The number of holes in the first ring surrounding the central hole is different (six, eight or 10) for the different ring patterns. The data shown in FIG. 24 are calculated using the parameters given for the LED 100 shown in FIG. 16, except that the emitted light has a peak wavelength of 450 nm. The numerical calculations represented in FIG. 24 show the extraction efficiency of LED 100 as the number of ring patterns per unit cell that is repeated across a unit cell is varied from two to four. The enhancement in light extraction, the methodology for conducting the corresponding numerical calculation, and the physical explanation of the enhanced light extraction for a light-emitting device having the pattern shown in FIG. 24 is generally the same as described above.

Figure 25:
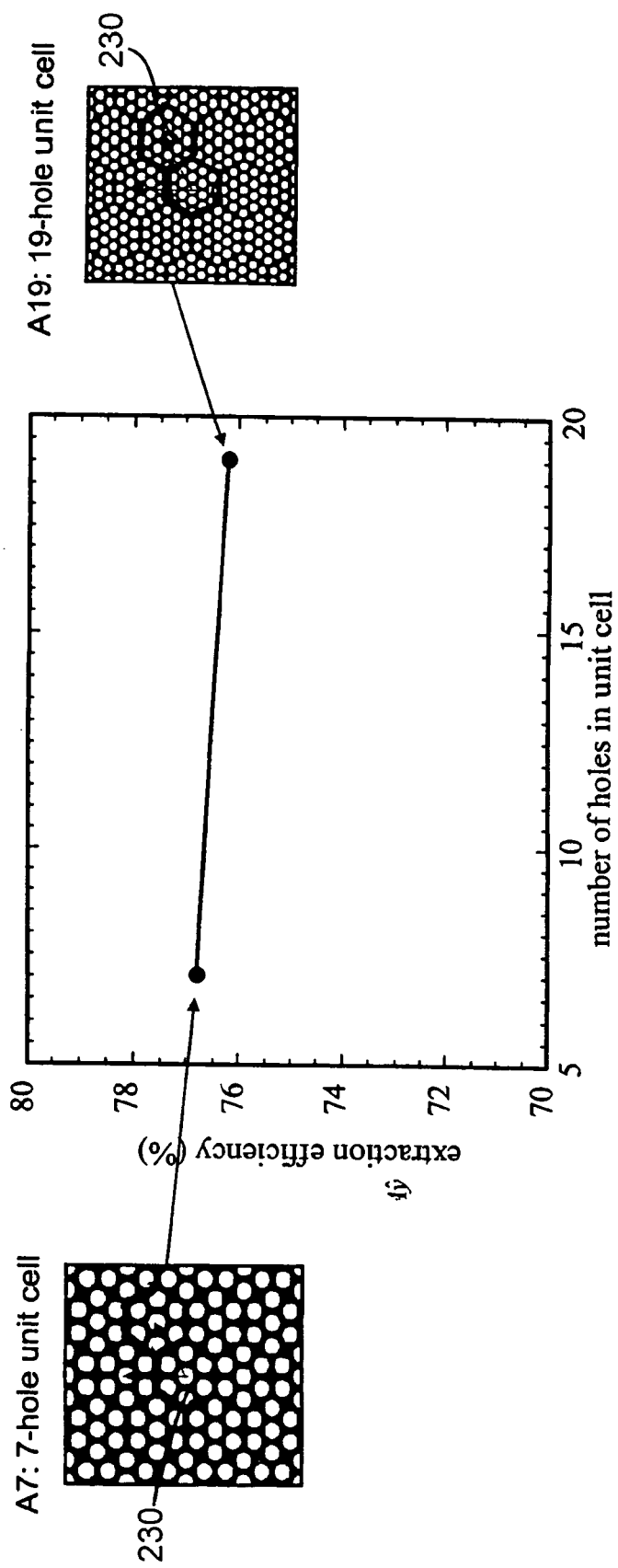
FIG. 25 is a graph of an extraction efficiency of LEDs with different surface patterns.

FIG. 25 shows numerical calculations for LED 100 having an Archimidean pattern. The Archimedean pattern A7 consists of hexagonal unit cells 230 of 7 equally-spaced holes with a nearest neighbor distance of a. Within a unit cell 230, six holes are arranged in the shape of a regular hexagon and the seventh hole is located at the center of the hexagon. The hexagonal unit cells 230 then fit together along their edges with a center-to-center spacing between the unit cells of a'=a* $(1+\sqrt{3})$ to pattern the entire surface of the LED. This is known as an A7 tiling, because 7 holes make up the unit cell. Similarly, the Archimidean tiling A19 consists of 19 equally-spaced holes with a NND of a. The holes are arranged in the form of an inner hexagon of seven holes, and outer hexagon of 12 holes, and a central hole within the inner hexagon. The hexagonal unit cells 230 then fit together along their edges with a center-to-center spacing between the unit cells of a'=a* $(3+\sqrt{3})$ to pattern the entire surface of the LED. The enhancement in light extraction, the methodology for conducting the corresponding numerical calculation, and the physical explanation of the enhanced light extraction for a light-emitting device having the pattern shown in FIG. 25 is generally the same as described above. As shown in FIG. 25 the extraction efficiency for A7 and A19 is about 77%. The data shown in FIG. 25 are calculated using the parameters given for the LED 100 shown in FIG. 16, except that the emitted light has a peak wavelength of 450 and except that the NND is defined as the distance between openings within an individual cell.

Figure 26:
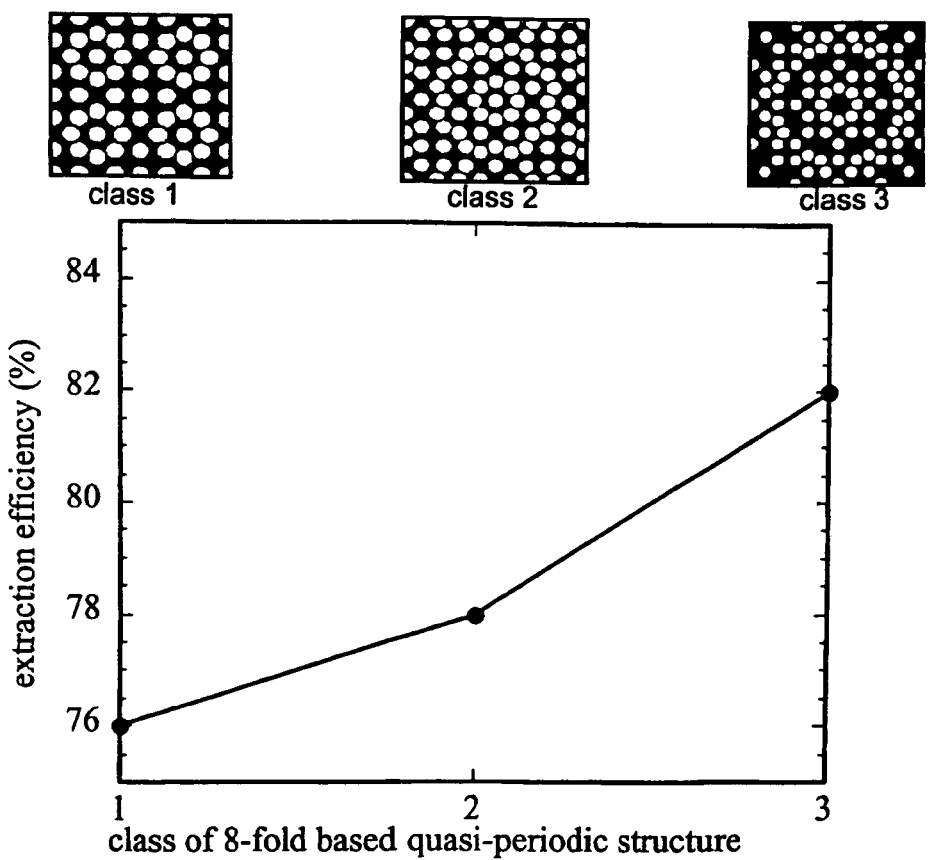
FIG. 26 is a graph of an extraction efficiency of LEDs with different surface patterns.

FIG. 26 shows numerical calculation data for LED 100 having a quasicrystalline pattern. Quasicrystalline patterns are described, for example, in M. Senechal, *Quasicrystals and Geometry* (Cambridge University Press, Cambridge, England 1996), which is hereby incorporated by reference. The numerical calculations show the behavior of the extraction efficiency as the class of 8-fold based quasi-periodic structure is varied. It is believed that quasicrystalline patterns exhibit high extraction efficiency due to high degree of in-plane rotational symmetries allowed by such structures. The enhancement in light extraction, the methodology for conducting the corresponding numerical calculation, and the physical explanation of the enhanced light extraction for a light-emitting device having the pattern shown in FIG. 26 is generally the same as described above. Results from FDTD calculations shown in FIG. 26 indicate that the extraction efficiency of quasicrystalline structures reaches about 82%. The data shown in FIG. 26 are calculated using the parameters given for the LED 100 shown in FIG. 16, except that the emitted light has a peak wavelength of 450 and except that the NND is defined as the distance between openings within an individual cell.

While certain examples of patterns have been described herein, it is believed that other patterns can also enhance the light extraction from LED 100 if the patterns satisfy the basic principles discussed above. For example, it is believed that adding detuning to quasicrystalline or complex periodic structures can increase extraction efficiency.

In some embodiments, at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110.

In certain embodiments, the cross-sectional area of LED 100 can be relatively large, while still exhibiting efficient light extraction from LED 100. For example, one or more edges of LED 100 can be at least about one millimeter (e.g., at least about 1.5 millimeters, at least about two millimeters, at least about 2.5 millimeters, at least about three millimeters), and at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110. This can allow for an LED to have a relatively large cross-section (e.g., at least about one millimeter by at least about one millimeter) while exhibiting good power conversion efficiency.

In some embodiments, the extraction efficiency of an LED having the design of LED 100 is substantially independent of the length of the edge of the LED. For example, the difference between the extraction efficiency of an LED having the design of LED 100 and one or more edges having a length of about 0.25 millimeter and the extraction efficiency of LED having the design of LED 100 and one or more edges having a length of one millimeter can vary by less than about 10% (e.g., less than about 8%, less than about 5%, less than about 3%). As referred to herein, the extraction efficiency of an LED is the ratio of the light emitted by the LED to the amount of light generated by the device (which can be measured in terms of energy or photons). This can allow for an LED to have a relatively large cross-section (e.g., at least about one millimeter by at least about one millimeter) while exhibiting good power conversion efficiency.

In certain embodiments, the quantum efficiency of an LED having the design of LED 100 is substantially independent of the length of the edge of the LED. For example, the difference between the quantum efficiency of an LED having the design of LED 100 and one or more edges having a length of about 0.25 millimeter and the quantum efficiency of LED having the design of LED 100 and one or more edges having a length of one millimeter can vary by less than about 10% (e.g., less than about 8%, less than about 5%, less than about 3%). As referred to herein, the quantum efficiency of an LED is the ratio of the number of photons generated by the LED to the number of electron-hole recombinations that occur in the LED. This can allow for an LED to have a relatively large cross-section (e.g., at least about one millimeter by at least about one millimeter) while exhibiting good performance.

In some embodiments, the wall plug efficiency of an LED having the design of LED 100 is substantially independent of the length of the edge of the LED. For example, the difference between the wall plug efficiency of an LED having the design of LED 100 and one or more edges having a length of about 0.25 millimeter and the wall plug efficiency of LED having the design of LED 100 and one or more edges having a length of one millimeter can vary by less than about 10% (e.g., less than about 8%, less than about 5%, less than about 3%). As referred to herein, the wall plug efficiency of an LED is the product of the injection efficiency of the LED (the ratio of the numbers of carriers injected into the device to the number of carriers that recombine in the light-generating region of the device), the radiative efficiency of the LED (the ratio of electron-hole recombinations that result in a radiative event to the total number of electron-hole recombinations), and the extraction efficiency of the LED (the ratio of photons that are extracted from the LED to the total number of photons created). This can allow for an LED to have a relatively large cross-section (e.g., at least about one millimeter by at least about one millimeter) while exhibiting good performance.

Figure 27:
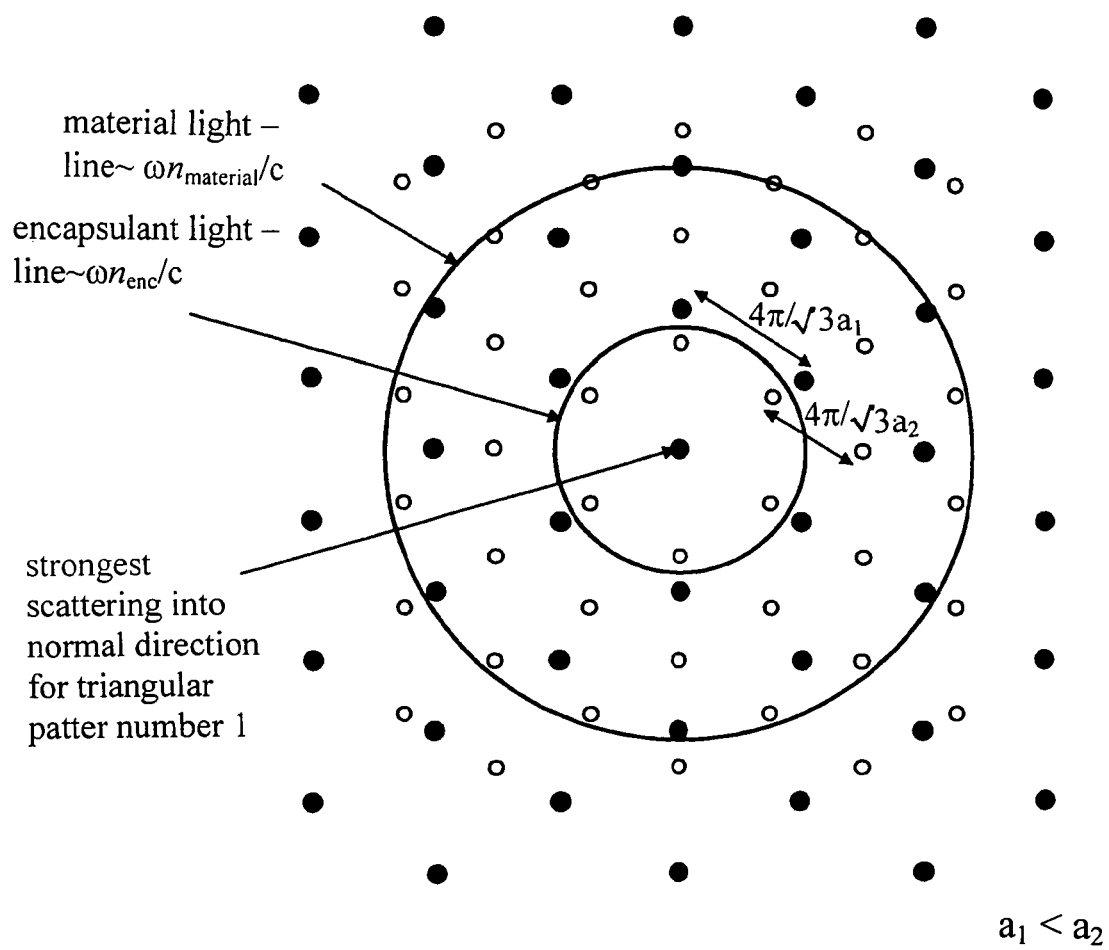
FIG. 27 is a schematic representation of the Fourier transformation two LEDs having different patterned surfaces compared with the radiation emission spectrum of the LEDs.
Figure 28:
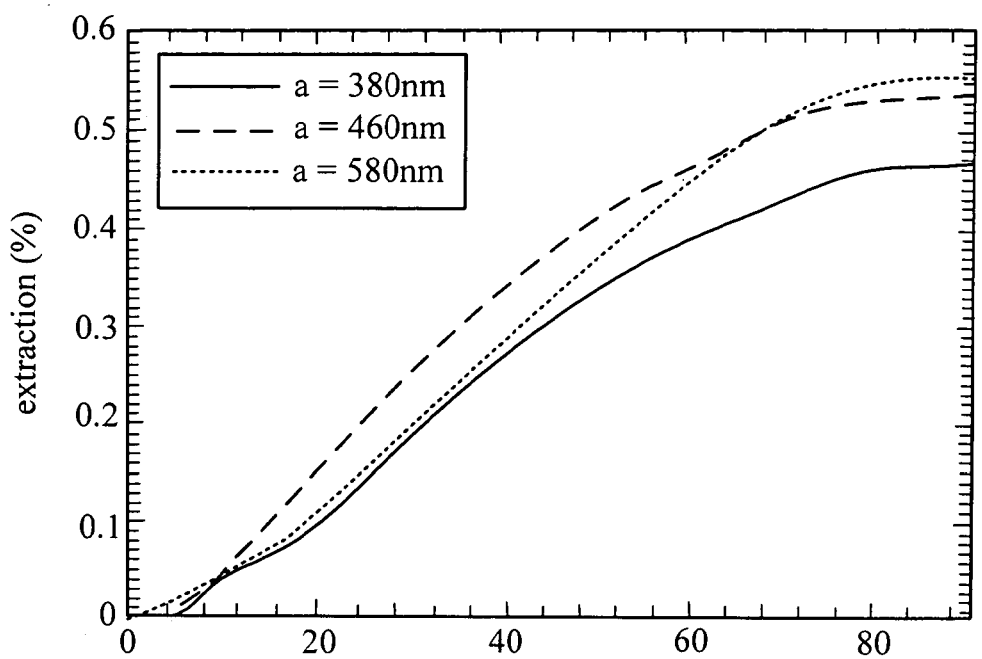
FIG. 28 is a graph of an extraction efficiency of LEDs having different surface patterns as a function of angle.

In some embodiments, it may be desirable to manipulate the angular distribution of light that emerges from LED 100 via surface 110. To increase extraction efficiency into a given solid angle (e.g., into a solid angle around the direction normal to surface 110) we examine the Fourier transform of the dielectric function that varies spatially according to pattern 150 (as described earlier). FIG. 27 shows the Fourier transform construction for two ideal triangular lattices of different lattice constant. To increase the extraction efficiency, we seek to increase the number of G points within the encapsulant light line and scattering strengths of G points ($\in_G$) within the material light line. This would imply increasing the NND so as to achieve the effect depicted in FIG. 20. However, here we are concerned with increasing the extraction efficiency into a solid angle centered around the normal direction. Therefore, we would also like to limit the introduction of higher order G points by reducing the radius of the encapsulant light line, such that the magnitude of $G > (\omega(n_e))/c$. We can see that by decreasing the index of refraction of the encapsulant (the bare minimum of which is removing the encapsulant all together) we allow larger NND and therefore increase the number of G points within the material light line that are available to contribute to extraction in the normal direction ($F_{k=0}$) while simultaneously avoiding diffraction into higher order (oblique angles) in the encapsulant. The above described trends are depicted in FIG. 28 which shows extraction efficiency into a solid angle (given by the collection half-angle in the diagram). The data shown in FIG. 28 are calculated using the parameters given for the LED 100 shown in FIG. 16, except that the emitted light has a peak wavelength of 530 nm and a bandwidth of 34 nm, the index of refraction of the encapsulant was 1.0, the thickness of the p-doped layer was 160 nm, the light generating layer was 30 nm thick, the NND (a) for the three curves is shown on FIG. 28, and the depth, hole diameter, and n-doped layer thickness scaled with a, as 1.27a, 0.72a, and 1.27a+40 nm, respectively. As the lattice constant is increased, the extraction efficiency at narrow angles increases as well as the overall extraction efficiency into all angles. However, for even larger lattice constant, diffraction into higher order modes in the encapsulant limits the extraction efficiency at narrow angles even though the overall extraction efficiency increases into all angles. For a lattice constant of 460 nm, we calculate greater than 25% extraction efficiency into a collection half-angle of 30°. That is, about half of the extracted light is collected within only about 13.4% of the upper hemisphere of solid angle demonstrating the collimation effect of the pattern. It is believed that any pattern that increases the number of G points within the material light line while limiting the number of G points within the encapsulant light line to only the G points at k=0 can improve the extraction efficiency into a solid angle centered around the normal direction.

The approach is especially applicable for reducing the source etendue which is believed to often be proportional to $n^2$, where n is the index of refraction of the surrounding material (e.g., the encapsulant). It is therefore believed that reducing the index of refraction of the encapsulating layer for LED 100 can lead to more collimated emission, a lower source etendue, and therefore to a higher surface brightness (here defined as the total lumens extracted into the etendue of the source). In some embodiments then, using an encapsulant of air will reduce the source etendue while increasing extraction efficiency into a given collection angle centered around the normal direction.

In certain embodiments, when light generated by region 130 emerges from LED 100 via surface 110, the distribution of light is more collimated than a lambertian distribution. For example, in some embodiments, when light generated by region 130 emerges from LED 100 via surface 110, at least about 40% (e.g., at least about 50%, at least about 70%, at least about 90%) of the light emerging via the surface of the dielectric layer emerges within at most about 30° (e.g., at most about 25°, at most about 20°, at most about 15°) of an angle normal to surface 110.

The ability to extract a relatively high percentage of light from a desired angle alone or coupled with a relatively high light extraction can allow for a relatively high density of LEDs to be prepared on a given wafer. For example, in some embodiments, a wafer has at least about five LEDs (e.g., at least about 25 LEDs, at least about 50 LEDs) per square centimeter.

Figure 29:
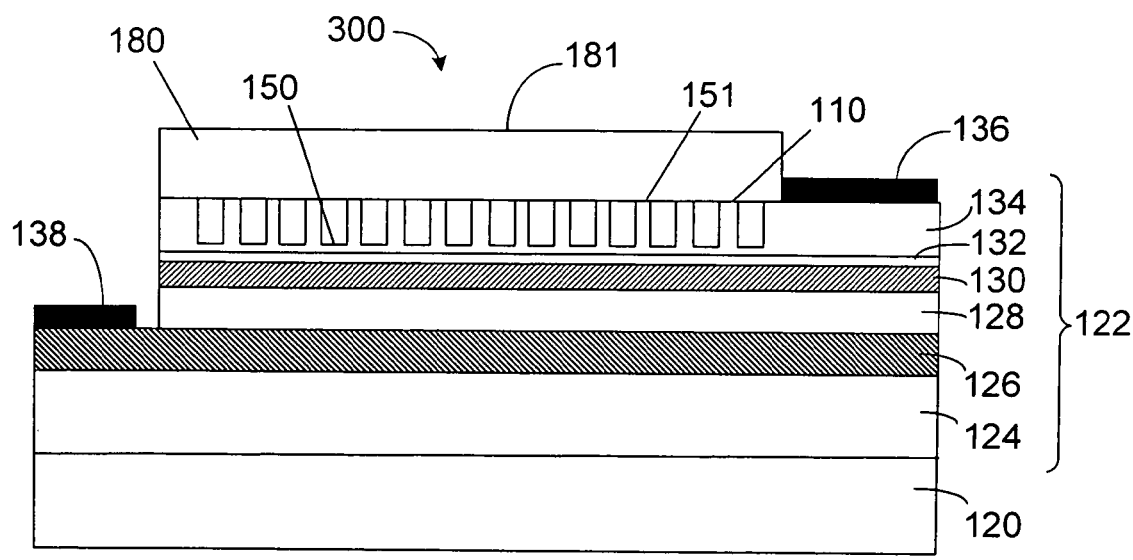
FIG. 29 is a side view of an LED with a patterned surface and a phosphor layer on the patterned surface.

In some embodiments, it may be desirable to modify the wavelength(s) of light that emerge(s) from a packaged LED 100 relative to the wavelength(s) of light generated by light-generating region 130. For example, as shown in FIG. 29, an LED 300 having a layer containing a phosphor material 180 can be disposed on surface 110. The phosphor material can interact with light at the wavelength(s) generated by region 130 to provide light at desired wavelength(s). In some embodiments, it may be desirable for the light that emerges from packaged LED 100 to be substantially white light. In such embodiments, the phosphor material in layer 180 can be formed of, for example, a (Y,Gd)(Al,Ga)G:Ce$^{3+}$ or "YAG" (yttrium, aluminum, garnet) phosphor. When pumped by blue light emitted from the light-generating region 130, the phosphor material in layer 180 can be activated and emit light (e.g., isotropically) with a broad spectrum centered around yellow wavelengths. A viewer of the total light spectrum emerging from packaged LED 100 sees the yellow phosphor broad emission spectrum and the blue InGaN narrow emission spectrum and typically mixes the two spectra to perceive white.

In certain embodiments, layer 180 can be substantially uniformly disposed on surface 110. For example, the distance between the top 151 of pattern 150 and the top 181 of layer 180 can vary by less than about 20% (e.g., less than about 10%, less than about 5%, less than about 2%) across surface 110.

In general, the thickness of layer 180 is small compared to the cross-sectional dimensions of surface 130 of LED 100, which are typically about one millimeter (mm) by one mm. Because layer 180 is substantially uniformly deposited on surface 110, the phosphor material in layer 180 can be substantially uniformly pumped by light emerging via surface 110. The phosphor layer 180 is relatively thin compared to the dimensions of the surface 110 of the LED 100, such that light emitted by the light-generating region 130 is converted into lower wavelength light within the phosphor layer 180 approximately uniformly over the entire surface 110 of LED 100. Thus, the relatively thin, uniform phosphor layer 180 produces a uniform spectrum of white light emitted from the LED 100 as a function of position on surface 110.

In general, LED 100 can be fabricated as desired. Typically, fabrication of LED 100 involves various deposition, laser processing, lithography, and etching steps.

For example, FIG. 30 shows a LED wafer 500 containing an LED layer stack of material deposited on a substrate (e.g., sapphire, compound semiconductor, zinc oxide, silicon carbide, silicon) 502. Such wafers are commercially available. Exemplary commercial suppliers include Epistar Corporation, Arima Optoelectronics Corporation and South Epitaxy Corporation. On substrate 502 are disposed, consecutively, a buffer layer 504 (e.g., a nitride-containing layer, such as a GaN layer, an AlN layer, an AlGaN layer), an n-doped semiconductor layer (e.g., an n-doped Si:GaN) layer 506, a current spreading layer 508 (e.g., an AlGaN/GaN heterojunction or superlattice), a light-emitting region 510 (e.g., an InGaN/GaN multi-quantum well region), and a semiconductor layer 512 (e.g., a p-doped Mg:GaN layer). Wafer 500 generally has a diameter of at least about two inches (e.g., from about two inches to about 12 inches, from about two inches to about six inches, from about two inches to about four inches, from about two inches to about three inches).

FIG. 31 shows a multi-layer stack 550 including layers 502, 504, 506, 508, 510 and 512, as well as layers 520, 522, 524 and 526, which are generally formed of materials capable of being pressure and/or heat bonded as described below. For example, layer 520 can be a nickel layer (e.g., electron-beam evaporated), layer 522 can be a silver layer (e.g., electron-beam evaporated), layer 524 can be a nickel layer (e.g., electron-beam evaporated), and layer 526 can be a gold layer (e.g., electron-beam evaporated). In some embodiments, layer 520 can be a relatively thin layer, and layer 524 can be a relatively thick layer. Layer 524 can act, for example, as diffusion barrier to reduce the diffusion of contaminants (e.g., gold) into layers 520, 522 and/or 524 itself. After deposition of layers 520, 522, 524 and 526, multi-layer stack 550 can be treated to achieve an ohmic contact. For example, stack 550 can be annealed (e.g., at a temperature of from about 400° C. to about 600° C.) for a period of time (e.g., from about 30 seconds to about 300 seconds) in an appropriate gas environment (e.g., nitrogen, oxygen, air, forming gas).

FIG. 32 shows a multi-layer stack 600 that includes a submount (e.g., germanium (such as polycrystalline germanium), silicon (such as polycrystalline silicon), silicon-carbide, copper, copper-tungsten, diamond, nickel-cobalt) 602 having layers 604, 606, 608 and 610 deposited thereon. Submount 602 can be formed, for example, by sputtering or electroforming. Layer 604 is a contact layer and can be formed, for example, from aluminum (e.g., electron evaporated). Layer 606 is a diffusion barrier and can be formed, for example, from Ni (e.g. electron evaporated). Layer 608 can be a gold layer (e.g., electron-beam evaporated), and layer 610 can be a AuSn bonding layer (e.g., thermal evaporated, sputtered) onto layer 608. After deposition of layers 604, 606, 608 and 610, multi-layer stack 600 can be treated to achieve an ohmic contact. For example, stack 600 can be annealed (e.g., at a temperature of from about 350° C. to about 500° C.) for a period of time (e.g., from about 30 seconds to about 300 seconds) in an appropriate gas environment (e.g., nitrogen, oxygen, air, forming gas).

FIG. 33 shows a multi-layer stack 650 formed by bonding together layers 526 and 610 (e.g., using a solder bond, using a eutectic bond, using a peritectic bond). Layers 526 and 610 can be bonded, for example, using thermal-mechanical pressing. As an example, after contacting layers 526 and 610, multi-layer stack 650 can be put in a press and pressurized (e.g., using a pressure of up to about 5 MPa, up to about 2 MPa) heated (e.g., to a temperature of from about 200° C. to about 400° C.). Stack 650 can then be cooled (e.g., to room temperature) and removed from the press.

Figure 34:
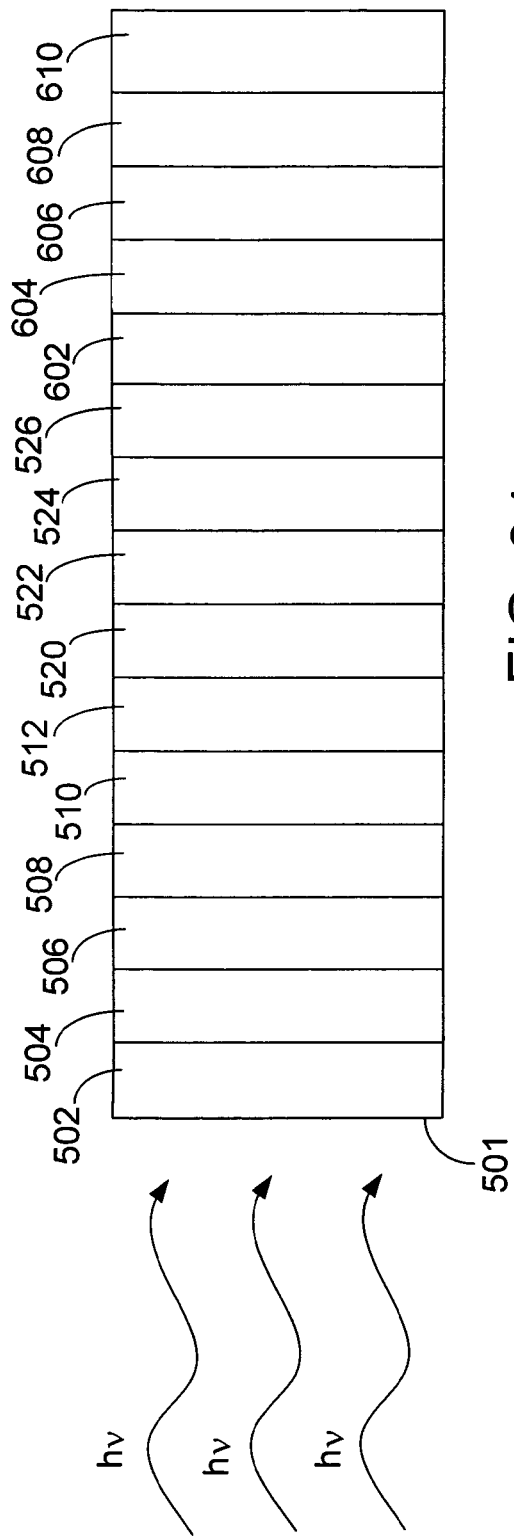
FIG. 34 depicts a side view of a substrate removal process.

Substrate 502 and buffer layer 504 are then at least partially removed from stack 650. In general, this can be achieved using any desired methods. For example, as shown in FIG. 34, in some embodiments, substrate 502 is removed by exposing stack 650 (e.g., through surface 501 of substrate 502) to electromagnetic radiation at an appropriate wavelength to partially decompose layer 504. It is believed that this results in local heating of layer 504, resulting in the partial decomposition of the material of layer 504 adjacent the interface of layer 504 and substrate 502, thereby allowing for the removal of substrate 502 from stack 650 (see discussion below). For example, in embodiments in which layer 504 is formed of gallium nitride, it is believed that constituents including gallium and gaseous nitrogen are formed. In some embodiments, stack 650 can be heated during exposure of surface 501 to the electromagnetic radiation (e.g., to reduce strain within stack 650). Stack 650 can be heated, for example, by placing stack 650 on a hot plate and/or by exposing stack 650 to an additional laser source (e.g. a $CO_2$ laser). Heating stack 650 during exposure of surface 501 to electromagnetic radiation can, for example, reduce (e.g., prevent) liquid gallium from re-solidifying. This can reduce the build up of strain within stack 650 which can occur upon the re-solidification of the gallium In certain embodiments, after exposure to the electromagnetic radiation, residual gallium is present and keeps substrate 502 bonded in stack 650. In such embodiments, stack 650 can be heated to above the melting temperature of gallium to allow substrate 502 to be removed from the stack. In certain embodiments, stack 650 may be exposed to an etchant (e.g., a chemical etchant, such as HCl) to etch the residual gallium and remove substrate 502. Other methods of removing the residual gallium (e.g., physical methods) may also be used.

As an example, in certain embodiments, surface 501 is exposed to laser radiation including the absorption wavelength of layer 504 (e.g., about 248 nanometers, about 355 nanometers). Laser radiation processes are disclosed, for example, in U.S. Pat. Nos. 6,420,242 and 6,071,795, which are hereby incorporated by reference. The multi-layer stack is then heated to above the melting point of gallium, at which point substrate 502 and buffer layer 504 are removed from the stack by applying a lateral force to substrate 502 (e.g., using a cotton swab).

In some embodiments, multiple portions of surface 501 are simultaneously exposed to the electromagnetic radiation. In certain embodiments, multiple portions of surface 501 are sequentially exposed to electromagnetic radiation. Combinations of simultaneous and sequential exposure can be used. Further, the electromagnetic radiation can be exposed on surface 501 in the form of a pattern (e.g., a serpentine pattern, a circular pattern, a spiral pattern, a grid, a grating, a triangular pattern, an elementary pattern, a random pattern, a complex pattern, a periodic pattern, a nonperiodic pattern). In some embodiments, the electromagnetic radiation can be rastered across one or more portions of surface 501. In certain embodiments, surface 501 is exposed to overlapping fields of electromagnetic radiation.

In some embodiments, the electromagnetic radiation passes through a mask before reaching surface 501. As an example, the electromagnetic radiation can pass through an optical system that includes a mask (e.g., a high thermal conductivity mask, such as a molybdenum mask, a copper-beryllium mask) before reaching surface 501. In some embodiments, the mask is an aperture (e.g., for truncating or shaping the beam). The optical system can include, for example, at least two lenses having the mask disposed there between. As another example, the mask can be formed as a pattern of material on surface 501, with the mask leaving certain portions of surface 501 exposed and some portions of surface 501 unexposed. Such a mask can be formed, for example, via a lithography process. In some embodiments, the electromagnetic radiation can be rastered across one or more portions of the mask.

Without wishing to be bound by theory, it is believed that reducing at least one dimension of the region on surface 501 exposed to electromagnetic radiation within a given area of surface 501 can limit undesired crack propagation, such as crack propagation into layer 504, layer 506 or other layers of stack 650 during removal of substrate 502, while still allowing for crack propagation at the interface between substrate 502 and buffer layer 504. It is believed that, if the size of the feature of the electromagnetic radiation on surface 501 is too large, then a gaseous bubble (e.g., a nitrogen bubble) may form that can create a localized pressure that can cause undesired cracking For example, in embodiments in which surface 501 is exposed to laser radiation that forms a spot or a line on surface 501, at least one dimension of the spot or line can be a maximum of at most about one millimeter (e.g., at most about 500 microns, at most about 100 microns, at most about 25 microns, at most about 10 microns). In some embodiments, the spot size is from about five microns to about one millimeter (e.g., from about five microns to about 100 microns, from about five microns to about 25 microns, from about five microns to about 10 microns).

In certain embodiments, stack 650 is vibrated while surface 501 is exposed to the electromagnetic radiation. Without wishing to be bound by theory, it is believed that vibrating stack 650 while exposing stack 650 to the electromagnetic radiation can enhance crack propagation along the interface between layer 504 and substrate 502. Generally, the conditions are selected to limit the propagation of cracks into layer 504 (e.g., so that substantially no cracks propagate into layer 504, 506, and the rest of stack 650).

After removal of substrate 502, a portion of buffer layer 504 typically remains on at least a portion of the surface of layer 506. A residue of material from substrate 502 (e.g., containing aluminum and/or oxygen) can also be present on the remaining portion of buffer layer 504 and/or on the surface of layer 506. It is generally desirable to remove the remaining portions of buffer layer 504 and any residue from substrate 502, to expose the surface of layer 506, and to clean the exposed surface of layer 506 because layer 506 (which is typically formed of an n-doped semiconductor material) can exhibit good electrical properties (e.g., desirable contact resistance) for subsequent formation of an electrical contact. One or more process steps are usually used to remove any residue and/or remaining portion of buffer layer 504 present, and to clean the surface of layer 506 (e.g., to remove impurities, such as organics and/or particles). The process(es) can be performed using a variety of techniques and/or combinations of techniques. Examples include chemical-mechanical polishing, mechanical polishing, reactive ion etching (e.g., with a substantially chemically etching component), physical etching, and wet etching. Such methods are disclosed, for example, in Ghandhi, S., *VLSI Fabrication Principles: Silicon & Gallium Arsenide* (1994), which is hereby incorporated by reference. In certain embodiments, buffer layer 504 is not completely removed. Instead, in such embodiments, these processes can be used to remove only on portions of buffer layer 504 that correspond to locations where electrical leads will subsequently be disposed (e.g., by using a self-aligned process).

Often, when substrate 502 is removed, the amount of strain in stack 650 (e.g., due to the lattice mismatch and/or thermal mismatch between the layers in stack 650) can change. For example, if the amount of strain in stack 650 is decreased, the peak output wavelength of region 510 can change (e.g., increase). As another example, if the amount of strain in stack 650 is increased, the peak output wavelength of region 510 can change (e.g., decrease).

To limit undesired cracking during removal of substrate 502, in some embodiments, consideration is given to the coefficient of thermal expansion of both substrate 502, the coefficient of thermal expansion of submount 602, the combined thickness of layers 504, 506, 508, 510, and 512, and/or the coefficient of thermal expansion of one or more of layers 504, 506, 508, 510, and 512. As an example, in some embodiments, substrate 502 and submount 602 are selected so that the coefficient of thermal expansion of submount 602 differs from a coefficient of thermal expansion of substrate 502 by less than about 15% (e.g., less than about 10%, less than about 5%). As another example, in certain embodiments, substrate 502 and submount 602 are selected so that the thickness of submount 602 is substantially greater than the thickness of substrate 502. As an additional example, in some embodiments, semiconductor layers 504, 506, 508, 510, 512 and submount 602 are selected so that the coefficient of thermal expansion of submount 602 differs from a coefficient of thermal expansion of one or more of layers 504, 506, 608, 510, and 512 by less than about 15% (e.g., less than about 10%, less than about 5%).

In general, substrate 502 and submount 602 can have any desired thickness. In some embodiments, substrate 502 is at most about five millimeters (e.g., at most about three millimeters, at most about one millimeter, about 0.5 millimeter) thick. In certain embodiments, submount 602 is at most about 10 millimeters (e.g., at most about five millimeters, at most about one millimeter, about 0.5 millimeter) thick. In some embodiments, submount 602 is thicker than substrate 502, and, in certain embodiments, substrate 502 is thicker than submount 602.

After removal of buffer layer 504 and exposing/cleaning the surface of layer 506, the thickness of layer 506 can be reduced to a desired final thickness for use in the light-emitting device. This can be achieved, for example, using a mechanical etching process, alone or in combination with an etching process. In some embodiments, after etching/cleaning the exposed surface of layer 506, the surface of layer 506 has a relatively high degree of flatness (e.g., a relatively high degree of flatness on the scale of the lithography reticle to be used). As an example, in some embodiments, after etching/cleaning the exposed surface of layer 506, the surface of layer 506 has a flatness of at most about 10 microns per 6.25 square centimeters (e.g., at most about five microns per 6.25 square centimeters, at most about one micron per 6.25 square centimeters). As another example, in certain embodiments, after etching/cleaning the exposed surface of layer 506, the surface of layer 506 has a flatness of at most about 10 microns per square centimeter (e.g., at most about five microns per square centimeter, at most about one microns per square centimeter). In certain embodiments, after etching/cleaning the exposed surface of layer 506, the surface of layer 506 has an RMS roughness of at most about 50 nanometers (e.g., at most about 25 nanometers, at most about 10 nanometers, at most about five nanometers, at most about one nanometer).

Figure 35:
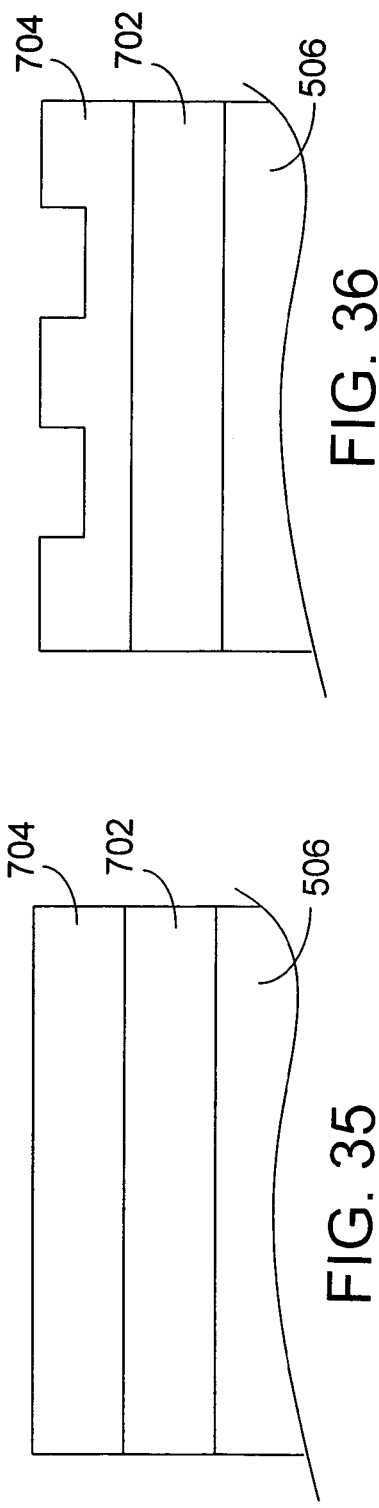
FIG. 35 is a partial cross-sectional view of a multi-layer stack.

In some embodiments, prior to forming the dielectric function that varies spatially according to a pattern in the surface of layer 506, the exposed surface of layer 506 may be too rough and/or insufficiently flat to use nano lithography to form the pattern with sufficient accuracy and/or reproducibility. To enhance the ability to accurately and/or reproducibly form the pattern in the surface of layer 506, the nano lithography process may include depositing a planarization layer on the surface of layer 506 and a lithography layer on the surface of the planarization layer. For example, FIG. 35 shows an embodiment in which a planarization layer 702 is disposed on the surface of layer 506, and a lithography layer 704 is disposed on the surface of layer 702, an exposed surface 505 of layer 506 may be relatively rough (e.g., RMS roughness of about 10 nanometers or more) after cleaning/etching layer 506. In some embodiments, planarization layer 702 is formed of multiple layers (e.g., of the same material) that are sequentially deposited.

Examples of materials from which planarization layer 702 can be selected include polymers (e.g., DUV-30J from Brewer Sciences, anti-reflection coatings, high viscosity formable polymers), and examples of materials from which lithography layer 704 can be selected include UV-curable polymers (e.g., low viscosity MonoMat™ available from Molecular Imprints, Inc.). Layers 702 and 704 can be formed using any desired technique, such as, for example, spin coating, vapor deposition, and the like.

Layer 702 can be, for example, at least about 100 nanometers thick (e.g., at least about 500 nanometers thick) and/or at most about five microns thick (e.g., at most about one micron thick). Layer 704 can be, for example, at least about one nanometer thick (e.g., at least about 10 nanometers thick) and/or at most about one micron thick (e.g., at most about 0.5 micron thick).

Figure 36:
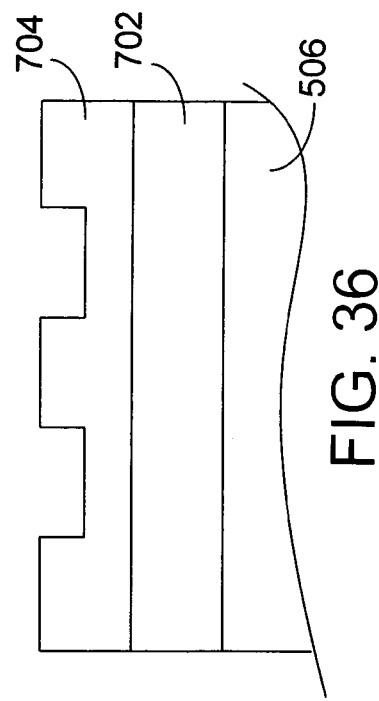
FIG. 36 is a partial cross-sectional view of a multi-layer stack.
Figure 37:
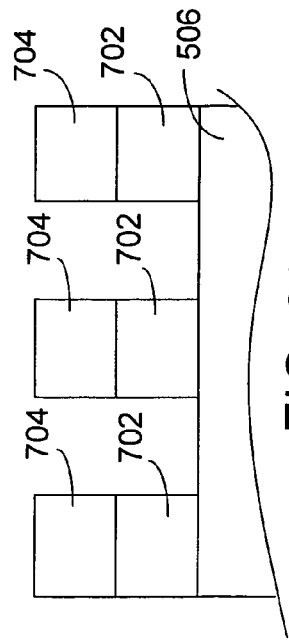
FIG. 37 is a partial cross-sectional view of a multi-layer stack.

A mold that defines a portion of the desired pattern is then pressed into lithography layer and (typically with heating or UV-curing of the mold and/or layer 704), and stepped across the surface of layer 704 in a portion-by-portion manner to form indentions in layer 704 (FIG. 36) that correspond to the desired pattern in the surface of layer 506. In some embodiments, a single step covers the entire wafer (e.g., full wafer nano lithography techniques). Layer 704 is then etched (e.g., using reactive ion etching, wet etching) to expose portions of the surface of layer 702 corresponding to what were the indented portions of layer 704 (FIG. 37). Examples of such imprint/etch processes are disclosed, for example, in U.S. Pat. No. 5,722,905, and Zhang et al., *Applied Physics Letters*, Vol. 83, No. 8, pp. 1632-34, both of which are hereby incorporated by reference. Typically, the pattern in layer 704 also leaves regions for depositing n-contacts later on in the process flow. In alternate embodiments, other techniques (e.g., x-ray lithography, deep ultraviolet lithography, extreme ultraviolet lithography, immersion lithography, interference lithography, electron beam lithography, photolithography, microcontact printing, self-assembly techniques) may be used to create the pattern in layer 704.

Figure 38:
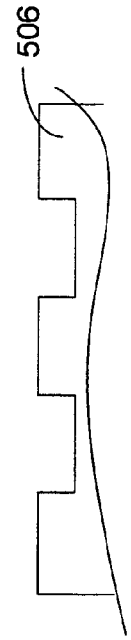
FIG. 38 is a partial cross-sectional view of a multi-layer stack.
Figure 39:
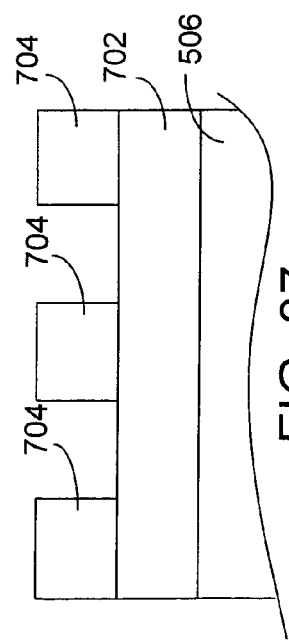
FIG. 39 is a partial cross-sectional view of a multi-layer stack.
Figure 40:
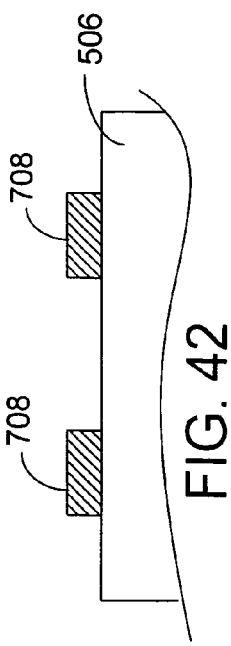
FIG. 40 is a partial cross-sectional view of a multi-layer stack.

As shown in FIG. 38, patterned layer 704 is used as a mask to transfer the pattern into the planarization layer 702 (e.g., dry etching, wet etching). An example of a dry etching method is reactive ion etching. Referring to FIG. 39, layers 702 and 704 are subsequently used as a mask to transfer the pattern into the surface of layer 506 (e.g., using dry etching, wet etching). As shown in FIG. 40, following etching of layer 506, the layers 702 and 704 are removed (e.g., using an oxygen-based reactive ion etch, a wet solvent etch).

Figure 41:
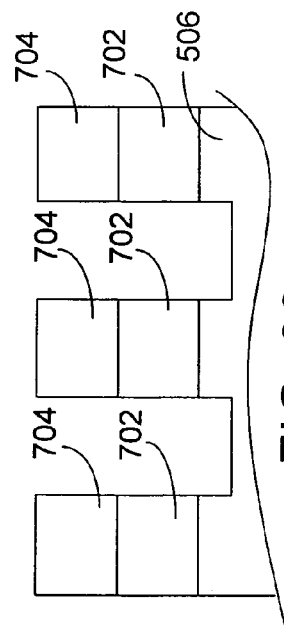
FIG. 41 is a partial cross-sectional view of a multi-layer stack.
Figure 42:
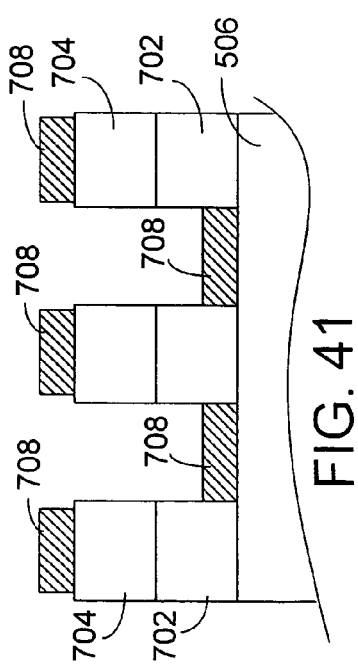
FIG. 42 is a partial cross-sectional view of a multi-layer stack.
Figure 43:
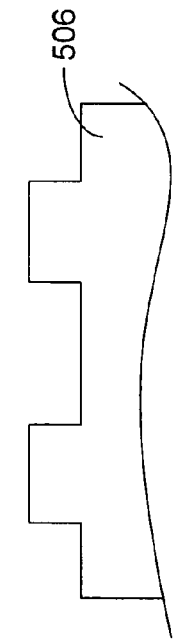
FIG. 43 is a partial cross-sectional view of a multi-layer stack.
Figure 44:
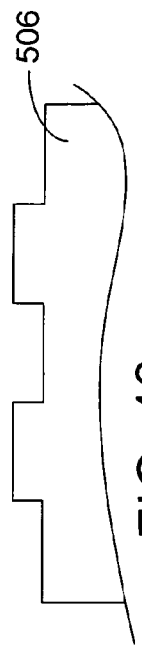
FIG. 44 is a partial cross-sectional view of a multi-layer stack.

Referring to FIG. 41, in some embodiments, the process can include, disposing a material 708 (e.g., a metal, such as aluminum, nickel, titanium, tungsten) in the etched portions of layers 702 and 704 (e.g., by evaporation) and on the surface of layer 704. As shown in FIG. 42, layers 702 and 704 are then etched (e.g., using reactive ion etching, wet etching), leaving behind etch-resistant material 708 on the surface of layer 506, which can serve as a mask for etching the pattern into the surface of layer 506 (FIG. 43). Referring to FIG. 44, etch resistant material 708 can then be removed (e.g., using dry etching, wet etching).

Figure 45:
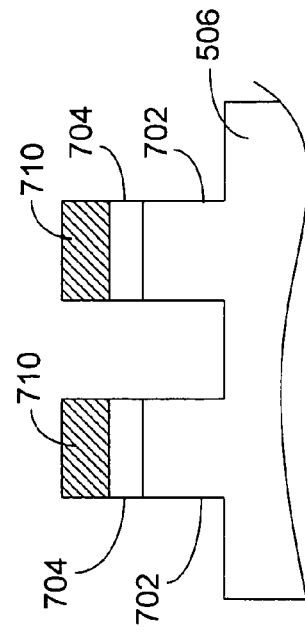
FIG. 45 is a partial cross-sectional view of a multi-layer stack.
Figure 46:
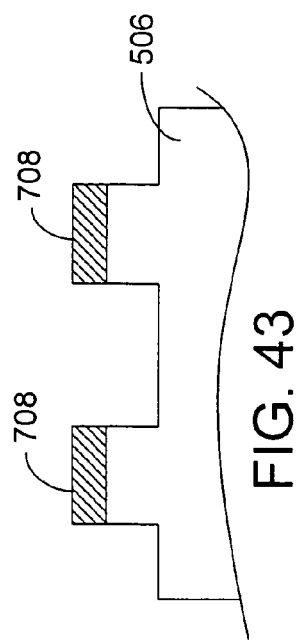
FIG. 46 is a partial cross-sectional view of a multi-layer stack.
Figure 47:
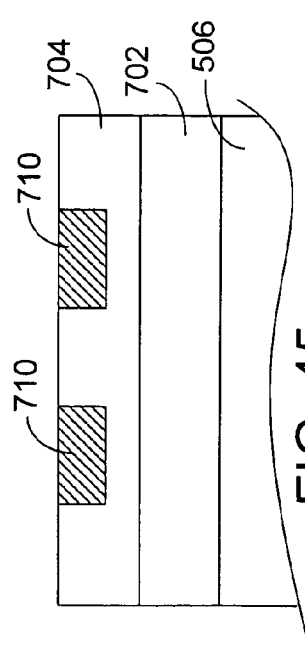
FIG. 47 is a partial cross-sectional view of a multi-layer stack.
Figure 48:
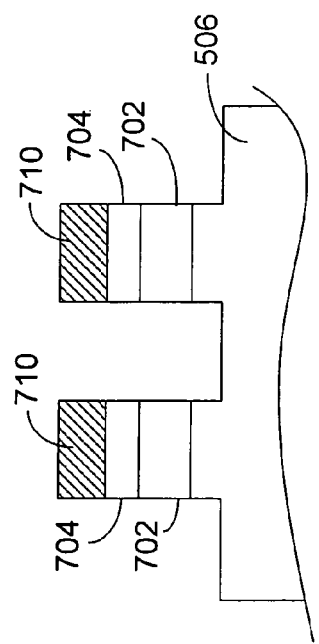
FIG. 48 is a partial cross-sectional view of a multi-layer stack.

In some embodiments, the process can include, after forming the indents in layer 704, disposing (e.g., spin coating) an etch resistant material (e.g., a Si-doped polymer) 710 on the surface of layer 704 and in the indents in layer 704, and material 710 is then etched back (e.g., using dry etching) so that to expose the surface of layer 704 while maintaining the etch-resistant material in the indents in layer 704 (FIG. 45). As shown in FIG. 46, portions of layers 702 and 704 are then etched (e.g., using reactive ion etching, dry etching, wet etching), leaving behind etch-resistant material 708 and the portions of layers 702 and 704 under material 708, which serve as a mask for etching the pattern into the surface of layer 506 (FIG. 47). Referring to FIG. 48, the remaining portions of layers 702 and 704, as well as etch resistant material 708, can then be removed (e.g., using reactive ion etching, dry etching, wet etching). In some embodiments, removing layer 708 can involve the use of a plasma process (e.g., a fluorine plasma process).

After the pattern has been transferred to n-doped layer 506, a layer of phosphor material can optionally be disposed (e.g., spin-coated) onto the patterned surface of n-doped layer 506. In some embodiments, the phosphor can conformally coat the patterned surface (coat with substantially no voids present along the bottoms and sidewalls of the openings in the patterned surface). Alternatively, a layer of encapsulant material can be disposed on the surface of patterned n-doped layer 506 (e.g. by CVD, sputtering, suspension by liquid binder that is subsequently evaporated). In some embodiments, the encapsulant can contain one or more phosphor materials. In some embodiments, the phosphor can be compressed to achieve thickness uniformity less than about 20%, less than about 15%, less than about 10%, less than about 5%, or less than about 2% of the average thickness of the phosphor. In some embodiments, the phosphor-containing encapsulant can conformally coat the patterned surface.

After the dielectric function pattern has been created in the n-doped layer 506, individual LED dice can be cut from the wafer. Once wafer processing and wafer testing is complete, individual LED dice are separated and prepared for packaging and testing. A sidewall passivation step and/or a pre-separation deep mesa etching step may be used to reduce potential damage to the electrical and/or optical properties of the patterned LED incurred during wafer cutting. The individual LEDs can be any size up to the size of the wafer itself, but individual LEDs are typically square or rectangular, with sides having a length between about 0.5 mm to 5 mm. To create the dice, standard photolithography is used to define the location of contact pads on the wafer for energizing the device, and ohmic contacts are evaporated (e.g. using electron beam evaporation) onto the desired locations.

Figure 49A:
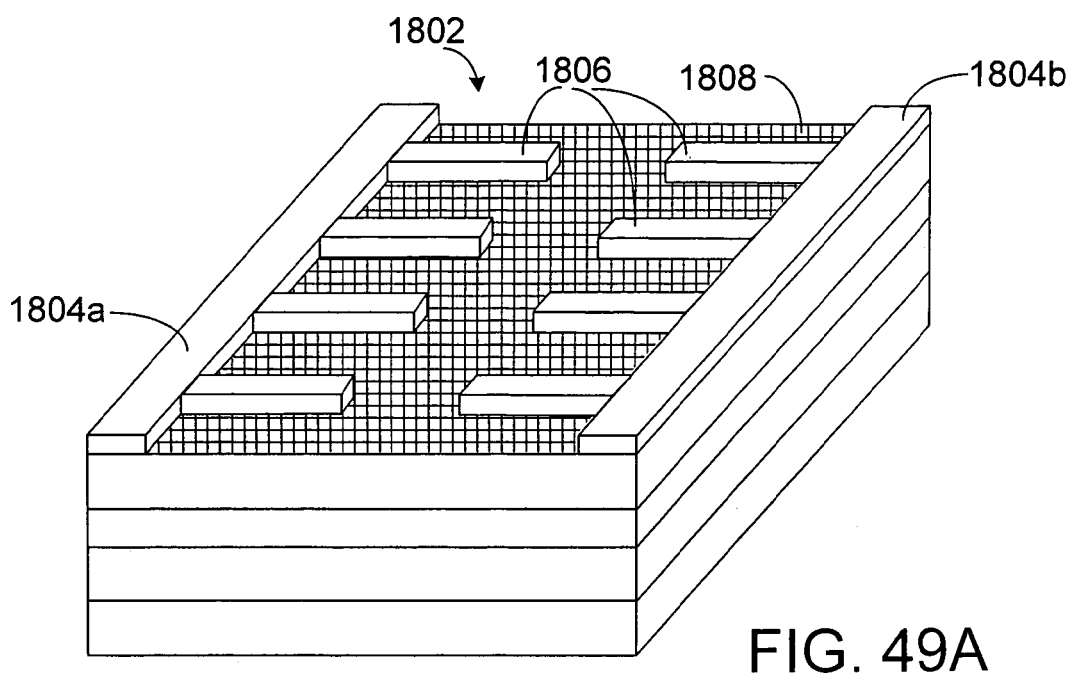
FIG. 49A is a perspective view of an LED.

In some embodiments, as shown in FIG. 49A, a contact layout for an LED 1802 includes two conductive pads 1804a and 1804b and conductive bars (or fingers) 1806 extending from conductive pads 1804a and 1804b toward a central area of LED 1802. Wire bonds (not shown) connected to conductive pads 1804a and 1804b provide current and voltage to LED 1802. Conductive bars 1806 spread the current from the conductive pads 1804a and 1804b to a top surface 1808 of LED 1802. Bars 1806 allow the current to be spread sufficiently across top surface 1808 while limiting the amount of surface 1808 covered by the contacts.

Figure 49B:
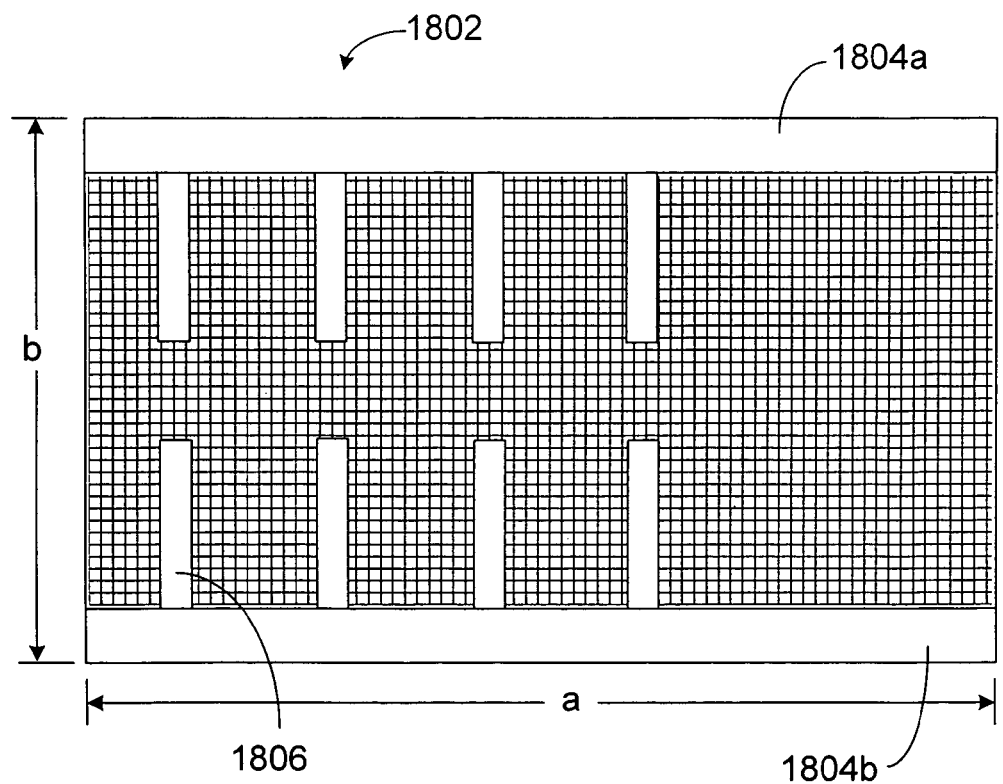
FIG. 49B is a top view of an LED.

FIG. 49B shows a top view of LED 1802 including conductive pads 1804a and 1804b and conductive bars 1806. In some embodiments, the width of conductive pads 1804a and 1804b can be larger than the width of conductive bars 1806. The larger width of pads 1804a and 1804b can allow pads 1804a and 1804b to function as power busses and spread a relatively large amount of power down the bus to bars 1806. The width of pads 1804a and 1804b and bars 1806 can be relative to the size of LED 1802 and/or can be based on other factors such as lithography and processing parameters.

For example, an LED may range in size from about 0.5 mm to about 1 cm on a side. As described above, the aspect ratio of LED 1802 can also vary. The width of conductive pads 1804a and 1804b can be, for example, about 50 um to about 500 um and the width of bars 1806 can be, for example, about 1 um to about 50 um. The height of conductive pads 1804a and 1804b and bars 1806 can vary based on, for example, current and power to be supplied to the LED or based on deposition and processing parameters. For example, conductive pads 1804a and 1804b and bars 1806 can be about 0.1 um to about 10 um in height.

In general, bars 1806 can vary as desired in both length and shape. As shown in FIG. 49B, bars 1806 can be rectangular and extend from conductive pads 1804a and 1804b toward a central region of LED 1802. Alternatively, bars 1806 could have a different shape such as square, triangular, or trapezoidal.

Figure 50A:
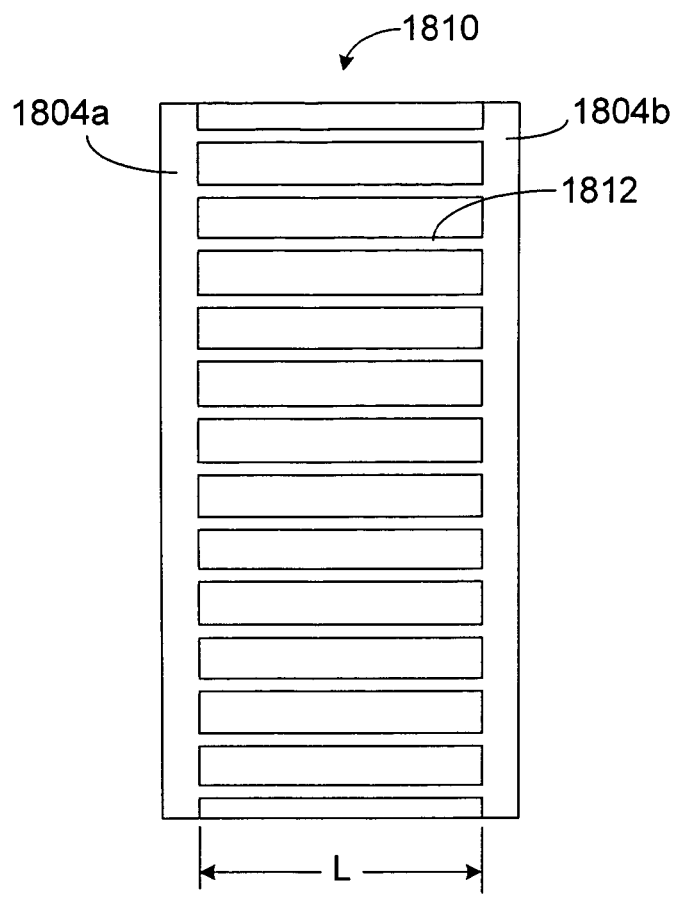
FIG. 50A is a top view of an LED.
Figure 50B:
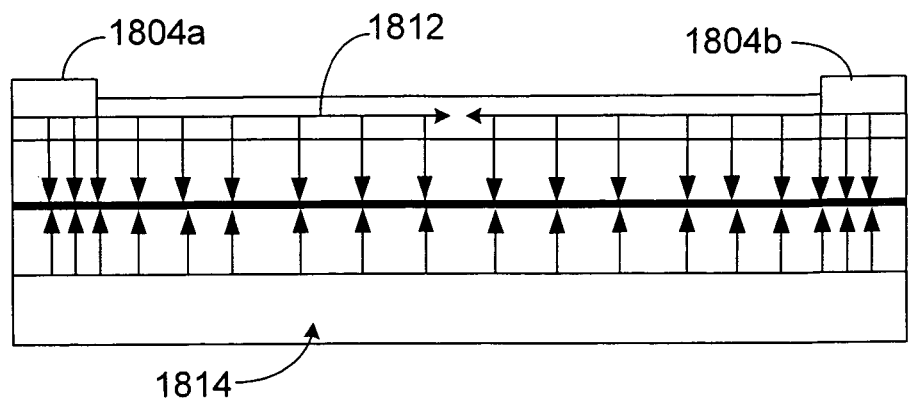
FIG. 50B is a partial cross-sectional view of an LED.
Figure 50C:
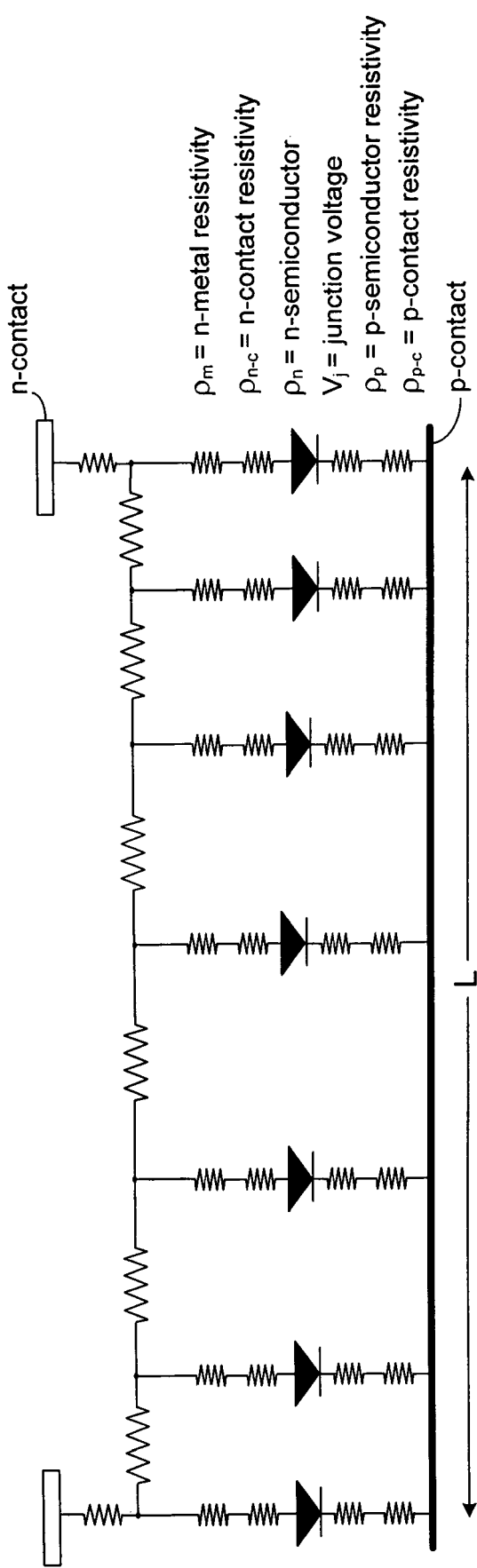
FIG. 50C is an equivalent circuit diagram.

FIGS. 50A to 50C show another example of a contact structure. In this example, multiple bars 1812 extend across the entire length of LED 1810, connecting conductive pad 1804a to conductive pad 1804b. Contact bars 1812 have an associated resistivity $r_m$, thickness $t_b$, and a length l. Current distribution properties for LED 1810 based on conductive pads 1804a and 1804b and contact bars 1812 can be estimated by simplifying the structure into an equivalent circuit model as shown in FIG. 50C.

The aspect ratio of LED 1810 can influence the current dissipation of the system. The aspect ratio 'L' of LED 1810 can be calculated according to the following equation as shown below:

$$L=\sqrt{Ab/a}$$

where A is the die's surface area (e.g., length multiplied by width) and a and b are the aspect ratios of the die. For example for an LED with a 16×9 aspect ratio, a=16 and b=9.

As described above, in order to allow light generated in the LED to be emitted through the surface, contact bars 1812 do not cover the entire surface of LED 1810. Since the contacts cover only a portion of the surface of LED 1810, the contact resistance is divided by the surface coverage ratio f, as shown in the following equation $$\rho_{n-c} \rightarrow \rho_{n-c}/f$$

The current density across the junction can be estimated according to the following equation as shown below:

$$J=J_0(e^{eV_j/KT}-1),$$

where $J_0$ is the junction saturation current and T the absolute temperature. The above estimates neglect the contribution of the n-type material in lateral current spreading. However, in general the current spreading is predominantly occurring in the metal contact because the conductivity of the contact is much greater than the conductivity of the n-type material. For example, the ratio of the contact conductivity to the n-type material conductivity can be in the range of from about 100 to about 500.

In a similar system (but with infinite separation between the pads), if the calculation is performed in a forward bias (e.g., $V_j \gg kT/e$) and if the voltage drop across the series resistance is much larger than kT/e (e.g., $(\rho_{p-c}+\rho_{n-c}/f+\rho_p t_p+$ $\rho_n t_n) J_0 e^{eV_j/kT} \gg kT/e$), then a linear approximation of the current density distribution at the junction can be estimated according to the following equation $$J(x) = J_1(e^{-x/L_s} + e^{-(L-x)/L_s})$$

where $J_1$ is the current density beneath a pad, x is the distance from a pad, and $L_s$ is the current spreading length as shown in the following equation $$L_s = \sqrt{(\rho_{p-c} + \rho_{n-c}/f + \rho_p t_p + \rho_n t_n) t_m / \rho_m}$$

This estimation assumes an infinite separation between the pads. However, for a linear approximation with non-infinite separation, the solutions for individual pads can be added together. The procedure described above introduces an error close to the die center, but is not believed to significantly alter the physical trends.

The minimum current density can appear at the center of the device x=L/2 and can be estimated according to the following equation $$J_{min} = 2J_1 e^{-L/2L_s}$$

where the uniformity factor is estimated as shown in equation $$U = \frac{J(L/2)}{J(0)} = \frac{2e^{-L/2L_s}}{1 + e^{-L/L_s}}.$$

For a die with the same surface area, switching from a square shape into a rectangular shape with aspect ratios a,b where the contact bars are along the small side, the minimum current density increases and the uniformity factor is modified as shown in the following equations $$J'_{min} = 2J_1 e^{-\frac{\sqrt{Ab/a}}{2L_s}}$$

$$U' = \frac{J(L'/2)}{J(0)} = \frac{2e^{-\sqrt{Ab/a}/2L_s}}{1 + e^{-\sqrt{Ab/a}/L_s}}$$

Thus, a uniformity increase factor can be estimated as shown in equation $$S = U'/U = \frac{1 + e^{-\sqrt{A}/L_s}}{1 + e^{-\sqrt{Ab/a}/L_s}} e^{\frac{\sqrt{A}}{2L_s}(1-\sqrt{b/a})}$$

For example, the uniformity increase factor 'S' has a minimum value S=1 for the square case (e.g., a=b). For a 16×9 rectangle, assuming the following values: $\rho_m = 2.2 \cdot 10^{-6}$ Ωcm (gold), $\rho_{p-c} = 1.0 \cdot 10^{-3}$ Ωcm$^2$, $\rho_p = 5.0$ Ωcm, $\rho_{n-c} = 1.0 \cdot 10^{-4}$ Ωcm$^2$, $\rho_n = 5.0 \cdot 10^{-3}$ Ωcm, n-contact surface coverage 10%, and thicknesses for p-, n-, and metal 0.3 µm, 3.0 µm and 2 µm (at a 10% coverage). Then $L_s$ equals 1.4 mm. If the die has a surface area of A=25 mm$^2$. In the square case U=0.325, while in the 16×9 case U'=0.5, or a uniformity increase factor S=1.54, i.e. a 54% increase of current uniformity.

Figure 51A:
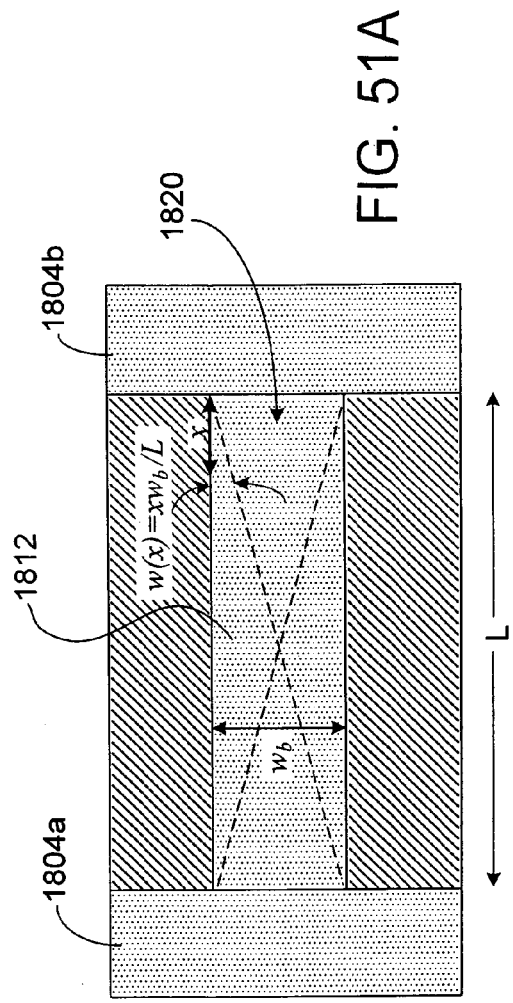
FIG. 51A is a top view of an LED.
Figure 51B:
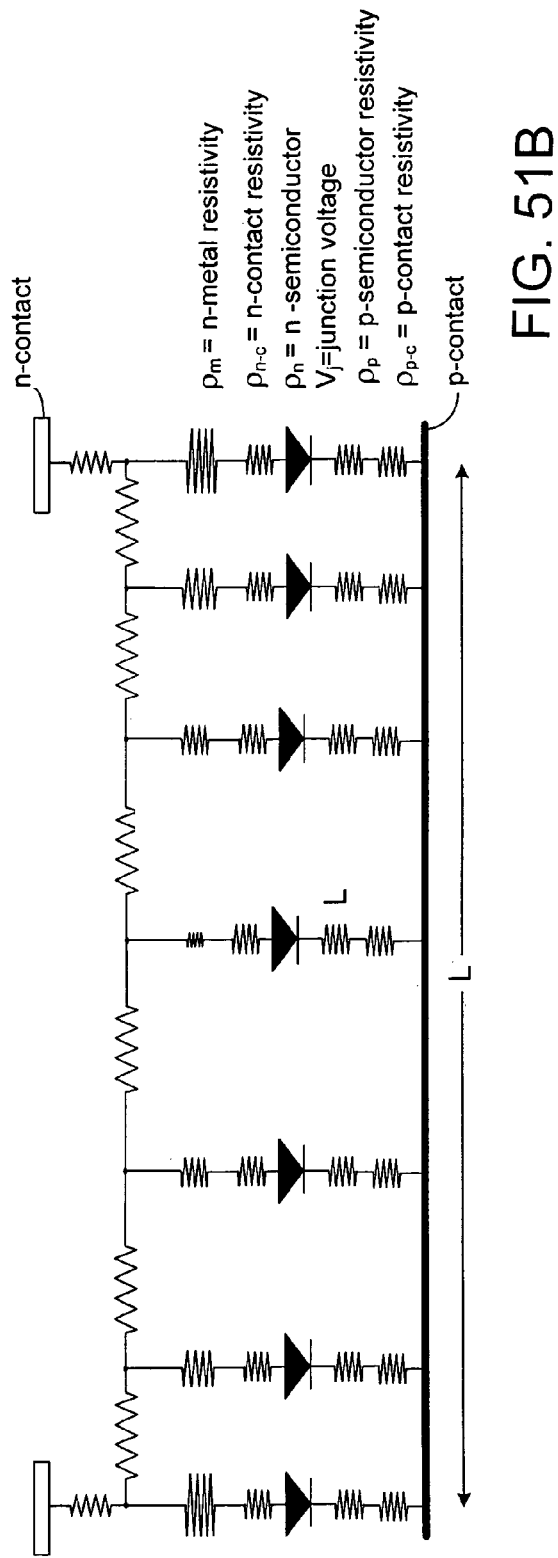
FIG. 51B is an equivalent circuit diagram.

Thus, without wishing to be bound by theory, it is believed that using a rectangular shape for an LED can provide benefits in the current spreading. The contact resistivity can alternatively or additionally be altered to enhance the current spreading by including an insulating layer 1820 (e.g., an oxide layer, FIG. 51A) underneath a portion of the contact. As shown in FIGS. 51A and 51B, insulating layer 1820 (indicated by dashed lines) is included under a portion of bar 1812. Insulating layer 1820 has a greater width at the top of the bar (e.g., close to pads 1804) and gets thinner towards the central area of the die. An equivalent circuit diagram is shown in FIG. 51B.

Contact resistivity is generally proportional to the contact area. For example, the contact resistivity increases as the contact area decreases as shown in the following equation $$\rho_{n-c}^{eff} = \frac{\rho_{n-c}}{f_{eff}} = \frac{\rho_{n-c} W}{2w} = \frac{\rho_{n-c} WL}{2xw_b} = \frac{\rho_{n-c}}{f} \frac{L}{2x}$$

where W is the repetition rate of the bars (e.g., the number of bars per unit area). Due to underlying insulating layer 1820, the area of the contact is smaller at the edge of the contact closest to pads 1804a and 1804b and increases as the distance from pads 1804a and 1804b increases. Due to the difference in contact area, the contact resistivity is higher close to pads 1804a and 1804b and decreases gradually towards the center of the LED. The difference in contact resistivity can force the current to travel further, reducing current crowding, increasing uniformity of light emission through the surface, and reducing performance degradation. The current spreading length can be estimated according to the following equation $$L_s(x) = \sqrt{(\rho_{p-c} + (\rho_{n-c}/f)(L/2x) + \rho_p t_p + \rho_n t_n) t_m / \rho_m}.$$

The junction current density along the die can be estimated by the following equation $$J(x) = J_1 e^{-\int_0^x dx/L_s(x)} + J_1 e^{-\int_x^L dx/L_s(L-x)}$$

and the minimum current is at the center of the device (e.g., at x=L/2) can be estimated according to the following equation $$J_{min} = 2J_1 e^{-\int_0^{L/2} dx/L_s(x)}$$

The current uniformity factor for the structure shown in FIG. 51B can be estimated according to the following equation $$U = \frac{J(L/2)}{J(0)} = \frac{2e^{-\int_0^{L/2} dx/2L_s(x)}}{1 + e^{-\int_0^L dx/2L_s(x)}}.$$

As described above, oxide layer 1820 can force current towards the ends of the contacts (e.g., toward the central area of the die) increasing the current spreading. Oxide layer 1820 can also reduce the light generation underneath the light absorbing contacts allowing greater percentage of the generated light to emerge from the surface of the LED.

Figure 52A:
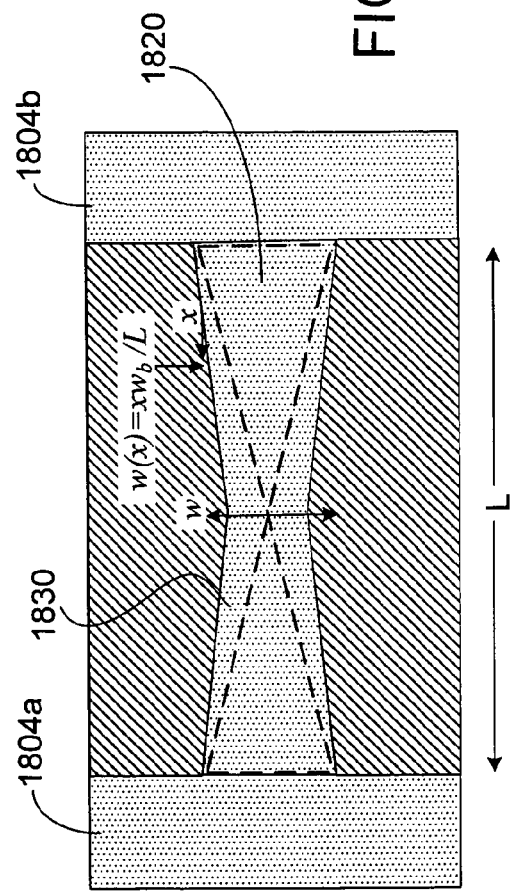
FIG. 52A is a top view of an LED.
Figure 52B:
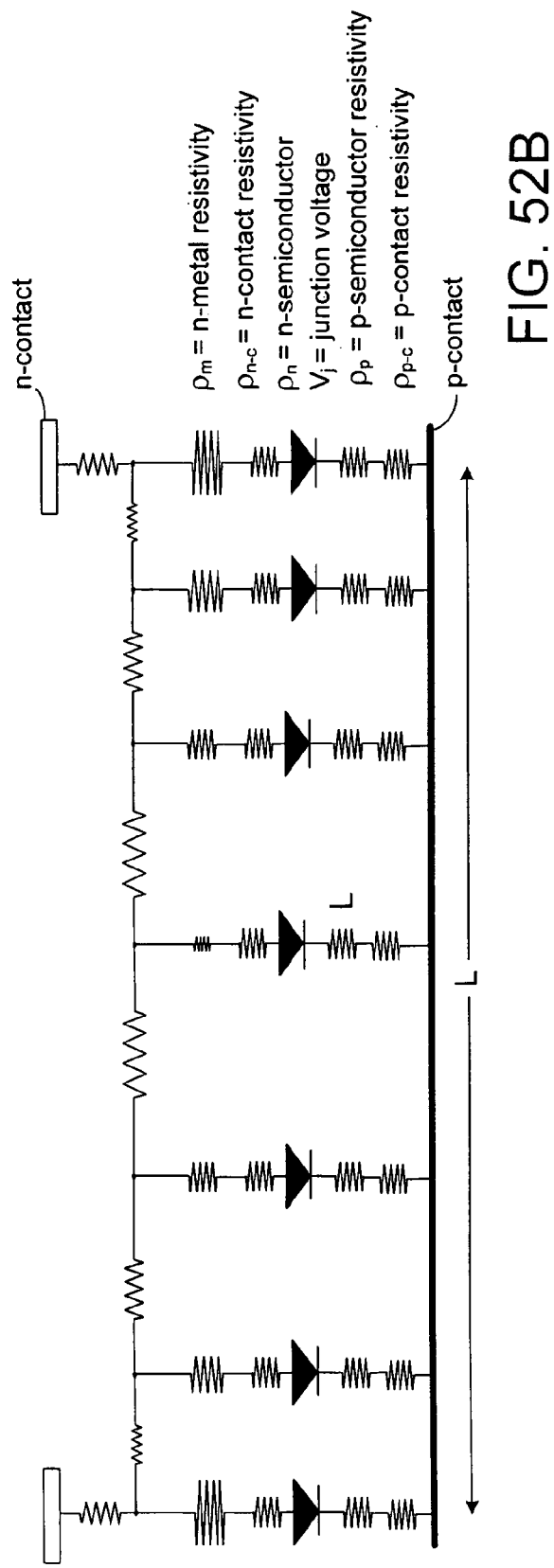
FIG. 52B is an equivalent circuit diagram.

FIGS. 52A and 52B show a further configuration of pads 1804a and 1804b, contact 1830, and oxide layer 1820 (indicated by dashed lines and disposed under a portion of contact 1830). Here, contacts 1830 are also tapered. While shown in FIG. 52A as being linearly tapered, other tapering could be used. The linear tapering maintains a similar total contact area to the contact area of contact 1812 shown in FIG. 51A, with the contact width at the die center being approximately half of the width of bars 1812 (FIG. 51A), while the contact width at the pads is 3 times larger than the width shown in FIG. 51A.

The oxide can be tapered at higher angle so that the contact resistance is maximum at the pad and minimum at the die center. The contact resistance decreases towards the die center, and the bar resistance decreases closer to the pad. The tapering of both the contact and the insulating layer contribute to forcing the current towards the die center. The local spreading length can be estimated according to the following equation $$L_s(x) = \sqrt{(\rho_{p-c} + (\rho_{n-c}/f)(L/x) + \rho_p t_p + \rho_n t_n)t_m/(2\rho_m(3-4x/L))}.$$

Similar integration formulas for the current distribution as described above can be used to estimate the current distribution for the structure shown in FIGS. 52A and 52B.

FIG. 53A shows a top view and FIGS. 53B and 53C show cross-sectional views of an additional contact structure 1801. Conductive contacts 1836 extend toward the center of the die, but do not continuously cover the upper surface of the LED between bars 1804a and 1804b. An insulating layer 1834 is located between the top of the LED and metal contact 1836 in an interior portion of the contact. Both the contact 1836 and the insulating layer 1834 are tapered. Arrows 1837 represent the current spreading from the metal contact 1836 into the surface of the die.

Figure 54:
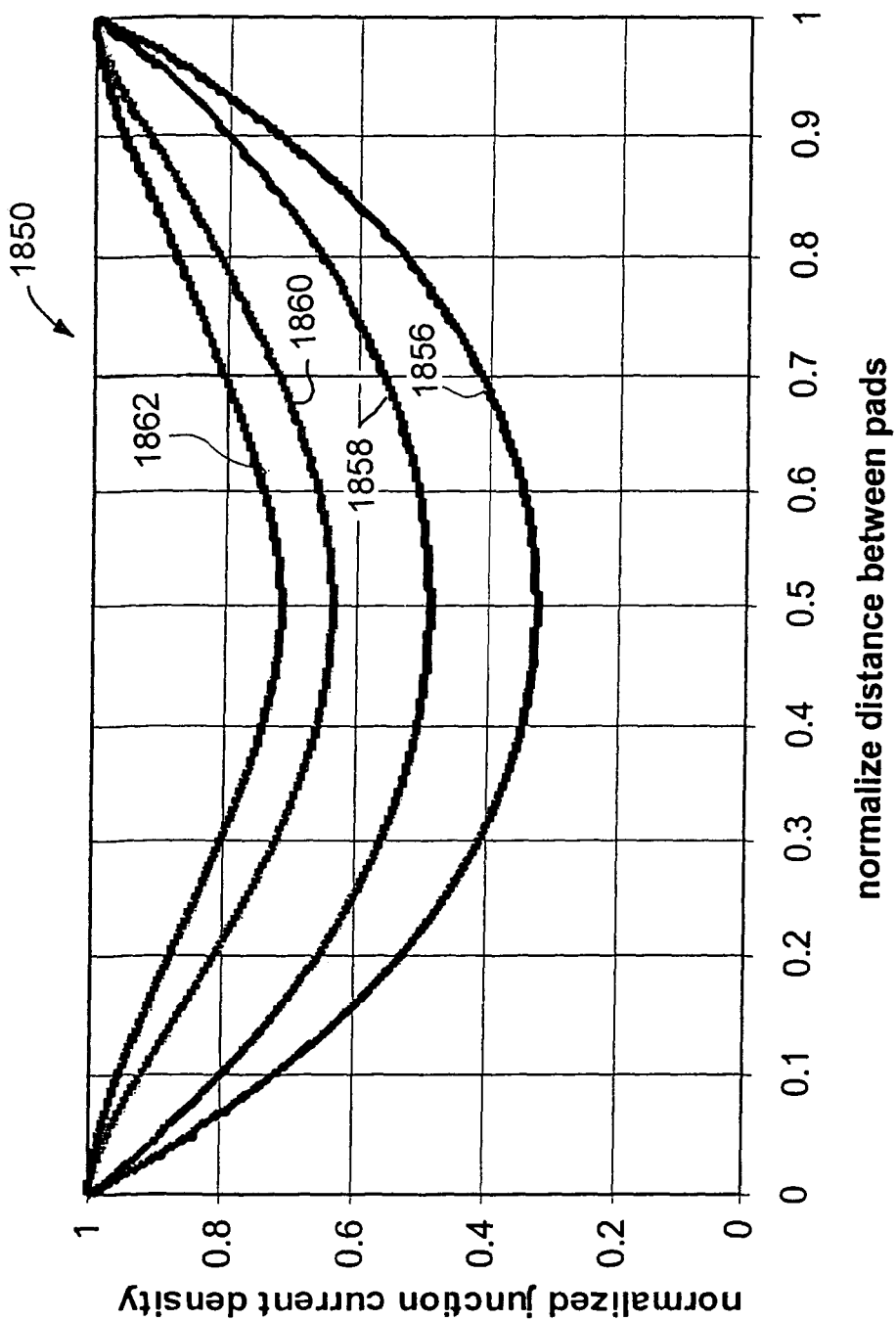
FIG. 54 is a graph of junction current density.

FIG. 54 shows a graph 1850 of estimated normalized junction current density as a function of the normalized distance between bars 1804a and 1804b for various contact and die configurations based on the forgoing equations. Line 1856 represents the current density for square die with rectangular bars and no oxide, line 1858 represents the current density for rectangular die with rectangular bars and no oxide, line 1860 represents the current density for a rectangular die with rectangular bars and tapered oxide, and line 1862 represents the current density for rectangular die with tapered bars and tapered oxide. Graph 1850 shows the improvement in the current density distribution for both a rectangular chip and an oxide layer under a portion of the contact.

FIG. 55A shows a top view and FIG. 55B shows a cross-sectional view of an additional contact structure 1803. Insulating layers 1805a and 1805b are located between the top of the LED and metal pads 1804a and 1804b, respectively. Insulating layers 1805a and 1805b are located under a portion of metal pads 1804a and 1804b, respectively, toward the edge of the die such that a portion of metal pads 1804a and 1804b are supported by insulating layers 1805a and 1805b, respectively, and a portion of metal pads 1804a and 1804b are supported by the top surface of the light emitting diode. Oxide layers 1805a and 1805b reduce the light generation underneath the light absorbing metal pads 1804a and 1804b allowing greater percentage of the generated light to emerge from the surface of the LED.

While embodiments described above include a single set of contacts extending from metal pads 1804a and 1804b, multiple sets of contacts could be used. For example, a second set of contacts could extend from the set of contacts connected to metal pads 1804 and so forth. Further, while oxide layers have been described, most generally, the layers can be formed of any appropriate electronically insulating material (e.g., nitride).

Figure 56:
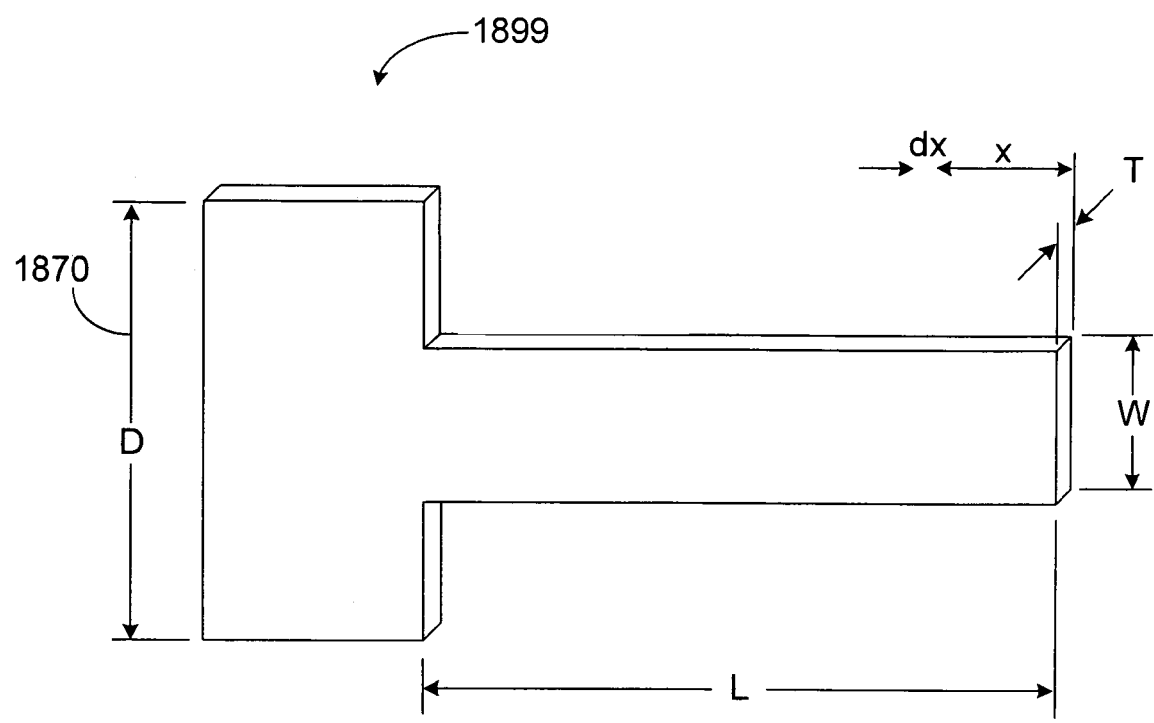
FIG. 56 is a view of a contact.

FIG. 56 shows the dimensions of an example of a contact 1899 and can be used to estimate electrical transport inside the n-contact. It is assumed contact 1899 distributes a uniform current density $J_0$ within contact period D 1870. The total current to be carried by the contact can be estimated as shown in the following equation $$I_{max} = J_0 DL.$$

This maximum current is flowing at the top of the contact (at the pad) corresponding to a current density that can be estimated as shown in the following equation $$J_{max} = \frac{J_0 D}{WT} L$$

At any distance x from the bar's end, the current density can be estimated as shown in the following equation $$J = \frac{J_0 D}{WT} x$$

The voltage drop per unit length can be estimated as shown in the following equation $$\frac{dV_c}{dx} = \frac{J_0 DRx}{WT}$$

and the heat generated per unit length can be estimated as shown in the following equation $$\frac{dQ_c}{dx} = \frac{2J_0^2 D^2 Rx^2}{WT}$$

Integrating the above equation the total voltage drop can be estimated as shown in the following equation $$V_c = \frac{J_0 DRL^2}{2WT}$$

and the total heat generated in the bar can be estimated as shown in the following equation $$Q_c = \frac{2J_0^2 D^2 RL^3}{3WT}$$

When the total heat generated becomes significant, uniform current assumption can break down, as can the device's performance (e.g., the device overheats). Therefore, it can be desirable to minimize the maximum current density (current density generally scales linearly with length), the voltage drop (voltage drop generally scales with the square length), and/or the heat generated (heat generated generally scales with the cube of the length). Based on the above relationships, a rectangular 9×16 die having more but shorter bars has a, b and c reduced by a factor of 3/4, 9/16, and 27/64 respectively. Since the number of bars is increased by a factor of 4/3, it is believed that the total heat generated can be reduced by a factor of 9/16.

Figure 57:
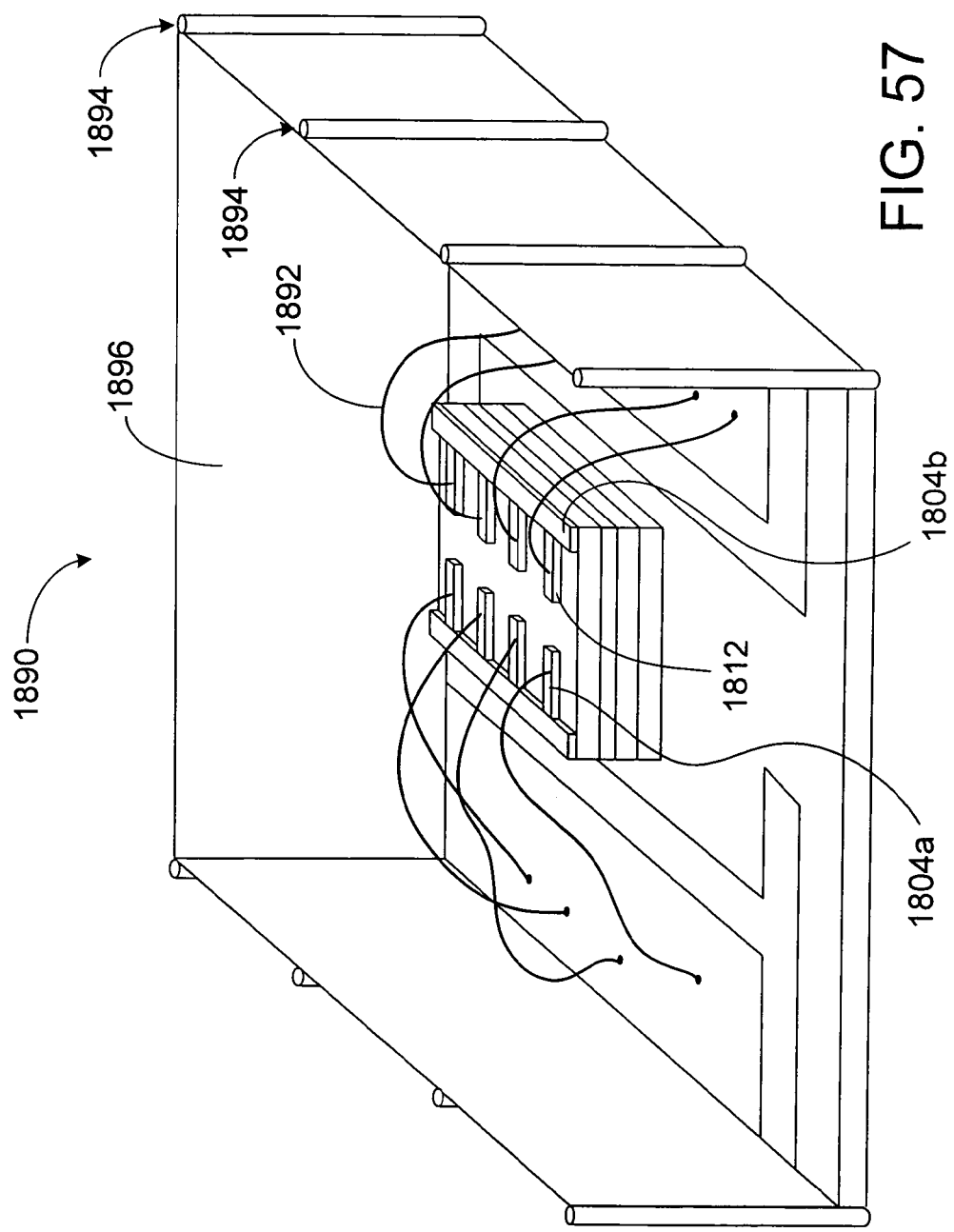
FIG. 57 is a diagram of a packaged LED.

FIG. 57 shows a packaged LED device 1890. In general, the package should be capable of facilitating light collection while also providing mechanical and environmental protection of the die and allowing heat generated in the die to be dissipated. As described above, LED 1890 includes conductive pads 1804a and 1804b that allow current to be spread to multiple contact fingers 1812 and dissipated to the LED surface. Multiple wire bonds 1892 provide an electrical current path between the LED and the package. Wire bonds 1892 can be made of various conductive materials such as gold, aluminum, silver, platinum, copper, and other metals or metal alloys. The package also includes multiple castellations 1894 to transport current from a bottom surface of the package to a top surface of the package to facilitate surface mounting on a circuit board. Castellations 1894 include a central region and a plating layer. The central region can be composed of a refractory metal, for example, tungsten and can be relatively thick (e.g., about 100 um to about 1 mm). The central region can be plated with an electrically conductive material such as gold. The plating can range in thickness from about 0.5 um to about 10 um and provides a current path that supports relatively high power levels. In addition, the package includes a transparent cover 1896 packaged on the LED die to protect the patterned surface 506 (FIG. 40) when an encapsulant is not used. The transparent cover 1896 is attached to the package, for example, using a glassy frit that is melted in a furnace. Alternatively, cover 1896 can be connected using a cap weld or an epoxy for example. The transparent cover 1896 can be further coated with one or more anti-reflection coatings to increase light transmission. Without wishing to be bound by theory, it is believed that the absence of an encapsulant layer allows higher tolerable power loads per unit area in the patterned surface LED 100. Degradation of the encapsulant can be a common failure mechanism for standard LEDs and is avoided not using an encapsulant layer. Packaged device 1890 can be mounted on a circuit board, on another device, or directly on a heat sink.

Figure 58:
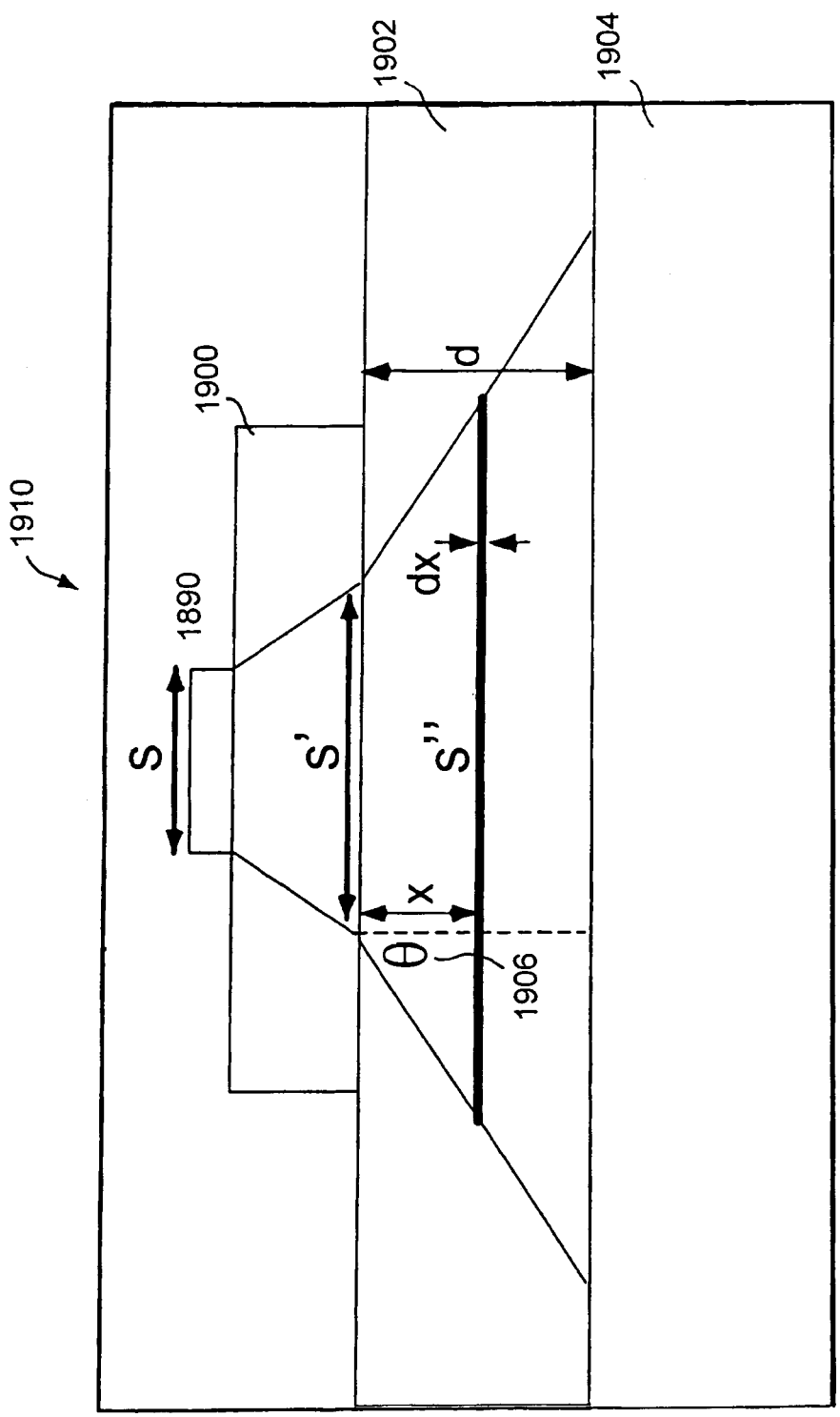
FIG. 58 is a diagram of a packaged LED and a heat sink.

FIG. 58 shows a model of the heat dissipation for a packaged device 1890 placed on a heat sink device. The packaged device 1890 is supported by a core board 1900 that includes insulating and electrically conductive regions (e.g., conductive regions using metals such as Al or Cu) attached to the heat sink. For example, packaged device 1890 can be attached to core board 1900 using solder (examples of solder include AuSn solder, PbSn solder, NiSn solder, InSn solder, InAgSn solder, and PbSnAg solder) or using an electrically conductive epoxy (e.g., silver filled epoxy). Core board 1900 is supported by a layer of heat sink metal 1902 and heat sink fins 1904. For example, core board 1900 can be attached to heat sink metal 1902 using solder (examples of solder include AuSn solder, PbSn solder, NiSn solder, InSn solder, InAgSn solder, and PbSnAg solder) or using epoxy (e.g., silver filled epoxy). In this model it is assumed that heat spreads from packaged device 1890 as the heat dissipates towards the heat sink. Spreading angle 1906 represents the angle at which heat dissipates out of packaged device 1890. Spreading angle 1906 generally varies depending on the material properties and the vertical layout of the system. Spreading angle 1906 can vary for different layers in the heat sink. The thermal resistance of a slice with thickness $d_x$ can be estimated according to the following equation $$dR_{th} = \frac{dx}{K_0} \frac{1}{S_x''^2} = \frac{dx}{K_0} \frac{1}{(S' + 2x\tan\theta)^2}$$

where $K_0$ is the thermal conductivity and $S'$ is the dimensions of the heat front at the top of the element. Integrating produces the following equation for resistivity $$R = \frac{d}{K_0} \frac{1}{S'(S' + 2d\tan\theta)}$$

Figure 59:
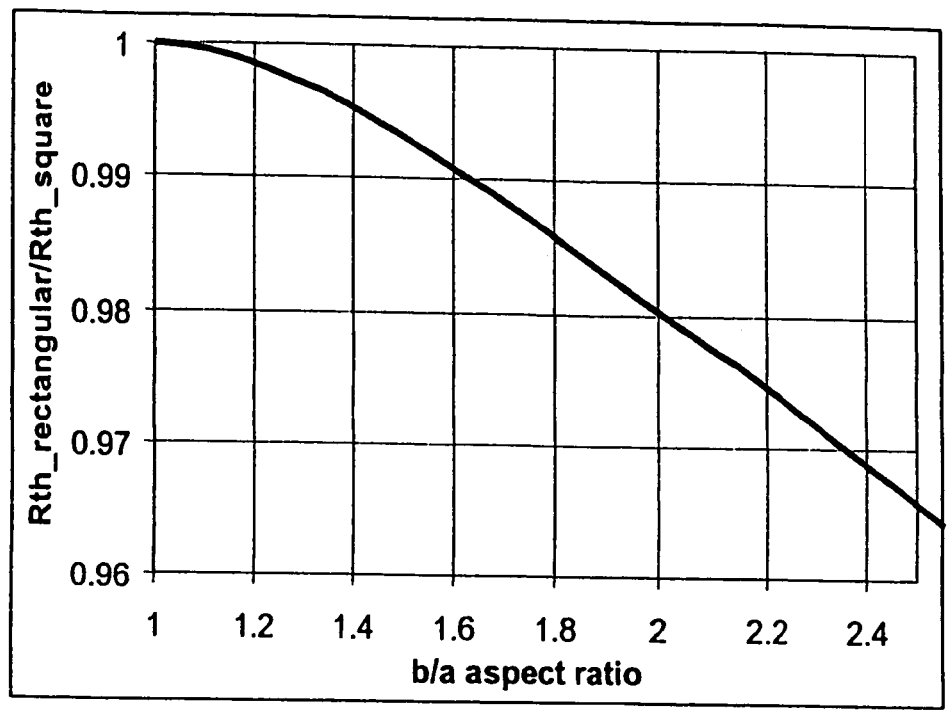
FIG. 59 is a graph of resistance.
Figure 60:
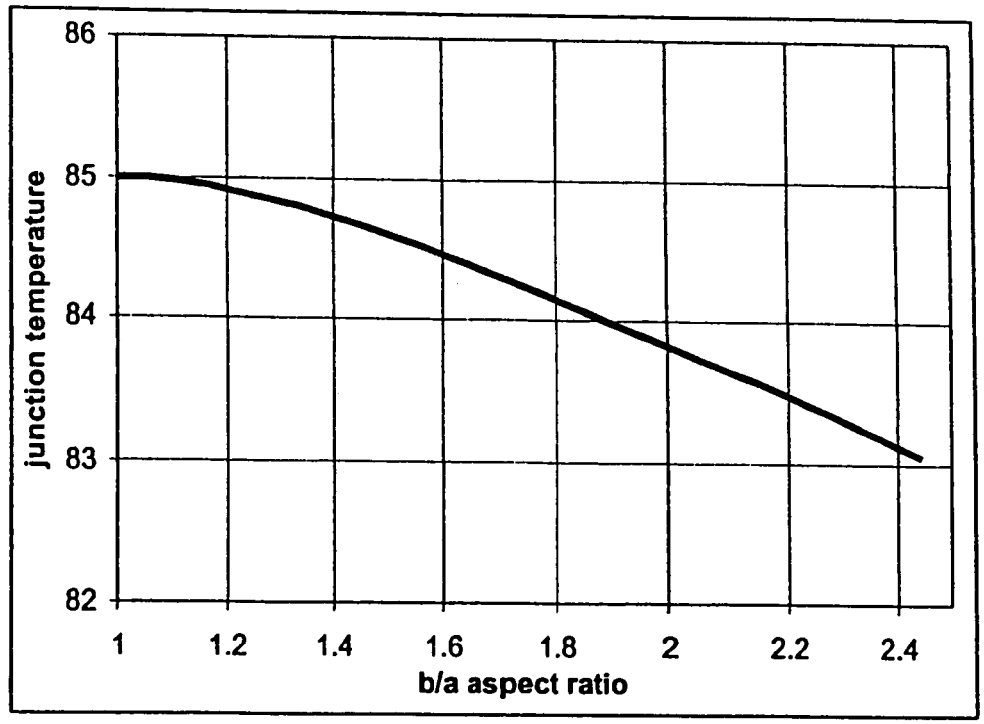
FIG. 60 is a graph of junction temperature.

In the case of a rectangle, this resistivity can be calculated generating the results shown in FIG. 59. FIG. 59 shows a calculated ratio of $R_{th\_rectangle}/R_{th\_square}$ (where Rth is the thermal resistance) for a system of large thickness and spreading angle of 45°. As the aspect ratio increases, the thermal resistance can drop. For example, if a square die system has a thermal resistance of 20° C./W and it is desired to dissipate 3 W of power, then the junction temperature (assuming an ambient temperature of 25° C.) can be 25+20*3=85° C. A rectangular die of the same area and same dissipated heat, however, will typically have a lower junction temperature. FIG. 60 shows a graph of junction temperature as a function of aspect ratio. It is believed that a lower junction temperature is desirable for reduced wavelength shift and higher device efficiency.

As described above, using a rectangular shape for an LED (compared, for example, to a square) can provide certain advantages. The advantages can include one or more of the following. The rectangular LED can allow a greater number of wire bonds per unit area increasing the power that can be input into the LED. The rectangular shape can be chosen to match a particular aspect ratio of a pixel or microdisplay, thus, eliminating the need for complex beam shaping optics. The rectangular shape can also improve heat dissipation from the LED and reduce the likelihood of failure due to the device overheating.

Because the cross section of an individual LEDs cut from a wafer is only slightly larger than the light-emitting surface area of the LED, many individual, and separately addressable LEDs can be packed closely together in an array. If one LED does not function (e.g., due to a large defect), then it does not significant diminish the performance of the array because the individual devices are closely packed.

While certain embodiments have been described, other embodiments are possible.

As an example, while certain thickness for a light-emitting device and associated layers are discussed above, other thicknesses are also possible. In general, the light-emitting device can have any desired thickness, and the individual layers within the light-emitting device can have any desired thickness. Typically, the thicknesses of the layers within multi-layer stack 122 are chosen so as to increase the spatial overlap of the optical modes with light-generating region 130, to increase the output from light generated in region 130. Exemplary thicknesses for certain layers in a light-emitting device include the following. In some embodiments, layer 134 can have a thickness of at least about 100 nm (e.g., at least about 200 nm, at least about 300 nm, at least about 400 nm, at least about 500 nm) and/or at most about 10 microns (e.g., at most about five microns, at most about three microns, at most about one micron). In certain embodiments, layer 128 has a thickness of at least about 10 nm (e.g., at least about 25 nm, at least about 40 nm) and/or at most about one micron (e.g., at most about 500 nm, at most about 100 nm). In some embodiments, layer 126 has a thickness of at least about 10 nm (e.g., at least about 50 nm, at least about 100 nm) and/or at most about one micron (e.g., at most about 500 nm, at most about 250 nm). In certain embodiments, light-generating region 130 has a thickness of at least about 10 nm (e.g., at least about 25 nm, at least about 50 nm, at least about 100 nm) and/or at most about 500 nm (e.g., at most about 250 nm, at most about 150 nm).

As an example, while a light-emitting diode has been described, other light-emitting devices having the above-described features (e.g., patterns, processes) can be used. Such light-emitting devices include lasers and optical amplifiers.

As another example, while current spreading layer 132 has been described as a separate layer from n-doped layer 134, in some embodiments, a current spreading layer can be integral with (e.g., a portion of) layer 134. In such embodiments, the current spreading layer can be a relatively highly n-doped portion of layer 134 or a heterojunction between (e.g. AlGaN/GaN) to form a 2D electron gas.

As a further example, while certain semiconductor materials have been described, other semiconductor materials can also be used. In general, any semiconductor materials (e.g., III-V semiconductor materials, organic semiconductor materials, silicon) can be used that can be used in a light-emitting device. Examples of other light-generating materials include InGaAsP, AlInGaN, AlGaAs, InGaAlP. Organic light-emitting materials include small molecules such as aluminum tris-8-hydroxyquinoline ($Alq_3$) and conjugated polymers such as poly[2-methoxy-5-(2-ethylhexyloxy)-1,4-vinylenephenylene] or MEH-PPV.

As an additional example, while large area LEDs have been described, the LEDs can also be small area LEDs (e.g., LEDs smaller than the standard about 300 microns on edge).

As another example, while a dielectric function that varies spatially according to a pattern has been described in which the pattern is formed of holes, the pattern can also be formed in other ways. For example, a pattern can be formed continuous veins and/or discontinuous veins in the appropriate layer. Further, the pattern in varying dielectric function can be achieved without using holes or veins. For example, materials having different dielectric functions can be patterned in the appropriate layer. Combinations of such patterns can also be used.

As a further example, while layer 126 has been described as being formed of silver, other materials can also be used. In some embodiments, layer 126 is formed of a material that can reflect at least about 50% of light generated by the light-generating region that impinges on the layer of reflective material, the layer of reflective material being between the support and the multi-layer stack of materials. Examples of such materials include distributed Bragg reflector stacks and various metals and alloys, such as aluminum and aluminum-containing alloys.

As another example, support 120 can be formed of a variety of materials. Examples of materials from which support 120 can be formed include copper, copper-tungsten, aluminum nitride, silicon carbide, beryllium-oxide, diamonds, TEC, and aluminum.

As an additional example, while layer 126 has been described as being formed of a heat sink material, in some embodiments, a light-emitting device can include a separate layer (e.g., disposed between layer 126 and submount 120) that serves as a heat sink. In such embodiments, layer 126 may or may not be formed of a material that can serve as a heat sink.

As a further example, while the varying pattern in dielectric function has been described as extending into n-doped layer 134 only (which can substantially reduce the likelihood of surface recombination carrier losses) in addition to making use of the entire light-generating region, in some embodiments, the varying pattern in dielectric function can extend beyond n-doped layer (e.g., into current spreading layer 132, light-generating region 130, and/or p-doped layer 128).

As another example, while embodiments have been described in which air can be disposed between surface 110 can cover slip 140, in some embodiments materials other than, or in an addition to, air can be disposed between surface 110 and cover slip 140. Generally, such materials have an index of refraction of at least about one and less than about 1.5 (e.g., less than about 1.4, less than about 1.3, less than about 1.2, less than about 1.1). Examples of such materials include nitrogen, air, or some higher thermal conductivity gas. In such embodiments, surface 110 may or may not be patterned. For example, surface 110 may be non-patterned but may be roughened (i.e., having randomly distributed features of various sizes and shapes less than $\lambda/5$).

As another example, while embodiments involving the deposition and etching of planarization and lithography layers have been described, in some embodiments, a pre-patterned etch mask can be laid down on the surface of the n-doped semiconductor layer.

As a further example, in some embodiments, an etch mask layer can be disposed between the n-doped semiconductor layer and the planarization layer. In such embodiments, the method can include removing at least a portion of the etch mask layer (e.g., to form a pattern in the etch stop layer corresponding to the pattern in the n-doped semiconductor layer).

As an additional example, while embodiments, have been disclosed in which surface 110 is patterned and smooth, in some embodiments, surface 110 may be patterned and rough (i.e., having randomly distributed features of various sizes and shapes less than $\lambda/5$, less than $\lambda/2$, less than $\lambda$). Further, in certain embodiments, the sidewalls of openings 150 can be rough (i.e., having randomly distributed features of various sizes and shapes less than $\lambda/5$, less than $\lambda/2$, less than $\lambda$), with or without surface 110 being rough. Moreover, in some embodiments, the bottom surface of openings 150 can be rough (i.e., having randomly distributed features of various sizes and shapes less than $\lambda/5$, less than $\lambda/2$, less than $\lambda$). Surface 110, the sidewalls of openings 150, and/or the bottom surfaces of openings 150 can be roughened, for example, by etching (e.g., wet etching, dry etching, reactive ion etching). Without wishing to be bound by theory, it is believed that roughening surface 110 and/or the sidewalls of openings 150 may increase the probability, with respect to a atomically smooth surface, that a light ray will eventually strike at an angle that less than the critical angle given by Snell's law and will be extracted.

As another example, in some embodiments, the submount can be machined to include spring-like structures. Without wishing to be bound by theory, it is believed that such spring-like structures may reduce cracking during removal of the substrate.

As a further example, in some embodiments, the submount can be supported by an acoustically absorbing platform (e.g., a polymer, a metallic foam). Without wishing to be bound by theory, it is believed that such acoustically absorbing structures may reduce cracking during removal of the substrate.

As an additional example, in some embodiments, the substrate is treated (e.g., etched, ground, sandblasted) before being removed. In certain embodiments, the substrate may be patterned before it is removed. In some embodiments, the thickness of the layers is selected so that, before removing the substrate and buffer layers, the neutral mechanical axis of the multi-layer stack is located substantially close (e.g., less than about 500 microns, less than about 100 microns, less than about 10 microns, less than about five microns) to the interface between the p-doped semiconductor layer and a bonding layer. In certain embodiments, portions of the substrate are separately removed (e.g., to reduce the likelihood of cracking).

As another example, while embodiments have been described in which a buffer layer is separate from an n-doped semiconductor layer (e.g., a buffer layer grown on the substrate, with an n-doped semiconductor layer separately grown on the buffer), in some embodiments, there can be a single layer instead. For example, the single layer can be formed by first depositing a relatively low doped (e.g., undoped) semiconductor material on the substrate, followed by (in one process) depositing a relatively high doped (n-doped) semiconductor material.

As a further example, while embodiments have been described in which a substrate is removed by a process that includes exposing a surface of the substrate to electromagnetic radiation (e.g., laser light), in some embodiments other methods can be used to remove the substrate. For example, removal of the substrate can involve etching and/or lapping the substrate. In certain embodiments, the substrate can be etched and/or lapped, and then subsequently exposed to electromagnetic radiation (e.g., laser light).

As an additional example, in some embodiments, after depositing the planarization layer but before depositing the lithography layer, the upper surface of the planarization layer can be flattened. For example, a flat object, such as an optical flat, can be placed on the upper surface of the planarization layer while heating the planarization layer (e.g., with a hot plate). In some embodiments, a pressure can be applied (e.g., using a physical weight or press) to assist with the flattening process.

As another example, in some embodiments the substrate can be treated before being removed. For example, the substrate can be exposed to one or more processes selected from etching, polishing, grinding, and sandblasting. In certain embodiments, treating the substrate can include patterning the substrate. In some embodiments, treating the substrate includes depositing an antireflective coating on the substrate. Such an antireflective coating can, for example, allow relatively large regions of the substrate to be removed when using a substrate removal process that involves exposing the substrate to electromagnetic radiation because the coating can reduce reflection of the electromagnetic radiation. In certain embodiments, a pattern on the surface of the substrate can also be used to achieve an anti-reflection effect.

In some embodiments, a light-emitting device can include a layer of a phosphor material coated on surface 110, cover layer 140 and supports 142.

In certain embodiments, a light-emitting device can include a cover layer 140 that has a phosphor material disposed therein. In such embodiments, surface 110 may or may not be patterned.

In general, the LED die discussed previously can be assembled into a package as desired. In some embodiments, a die attach material is used to connect the LED die to the surface of a package. Examples of die attach materials include solders (e.g. InAg solder, InSn solder, NiSn solder, AgSn solder, InAgSn solder, AuSn solder, PbSnAg solder, PbSn solder, and the like) and epoxies (e.g. metal-filled epoxies, such as a Ag-filled epoxy). In some embodiments, a spacer is introduced so that the thickness of the die attach material is greater than about 1 micron (e.g., greater than about 5 microns, greater than about 10 microns, greater than about 20 microns, greater than about 30 microns, greater than about 40 microns, greater than about 50 microns, greater than about 100 microns). Without wishing to be bound by theory, it is believed that thicknesses of the die attach material below a minimum thickness can reduce, modify, or affect the performance (e.g., the thermal performance, the electrical performance) of the LED die.

In some embodiments, it is also believed that a spacer may be included between the die and the package to improve uniformity of the die attach thickness between the package and the die. For example, the uniformity may be improved by choosing a spacer material with a reflow temperature greater than the reflow temperature of the solder to make the spacer layer more mechanically rigid during the die-attach process (e.g. an elevated temperature die attach process).

In some embodiments, the spacer layout can additionally make the die more parallel to the surface of the package simplifying further system integration (e.g. integration in an optical system or in a light engine) and alignment (e.g. with a lens, with a microdisplay). For example, a set of parallel spacers can provide support and control the distance of separation between the die and the package such that near the parallel spacers the distance of separation is about the same or is otherwise controlled. Layouts of spacers other than parallel lines may also be used.

In some embodiments, the spacer consists of multiple pieces (e.g. lines or dots). In other embodiments, the spacer is formed into a shape (e.g. a "z" shape, a rectangular shape). Complex shapes, especially those that cause kinks or crossings of the wire, can result in thickness nonuniformity in the die attach between the die and the package. While such nonuniformity may be undesirable in certain instances, in some instances such nonuniformity may be desirable. For example, the additional thickness could be used to provide a thicker spacer such that if a force is exerted that compresses the first spacer layer (in regions of overlap) a second layer helps to control further compression. In other embodiments, the overlap may exist outside the region to which the die is attached and not affect the attachment.

The spacer may be formed for instance of an electrically conductive material, such as a metallic wire (e.g., Au wire, Al wire, Ag wire). The wire diameter can vary based on the desired separation between the die and the package. Examples of wire diameters include about 0.1 mil, about 0.5 mil, about 1 mil, about 2 mils, about 5 mils, about 10 mils. The metallic wire can be attached to the surface of the package prior to attaching the die to the package, for example by mechanically pressing the wire into the surface of the package. In other embodiments, the die attach material is used to hold the spacer in place during the die attach process. Alternatively or additionally, a spacer can be attached to the die and the die can subsequently be attached to the package.

In some embodiments, the spacer is made of a material which dissolves, decomposes, or reflows during post processing of the die attach (i.e. during curing steps). In some embodiments, the spacer is made of a material which matches the thermal expansion and contraction of the die attach material during curing. In some embodiments, the spacer is made of the same material used for die attach.

Figure 61:
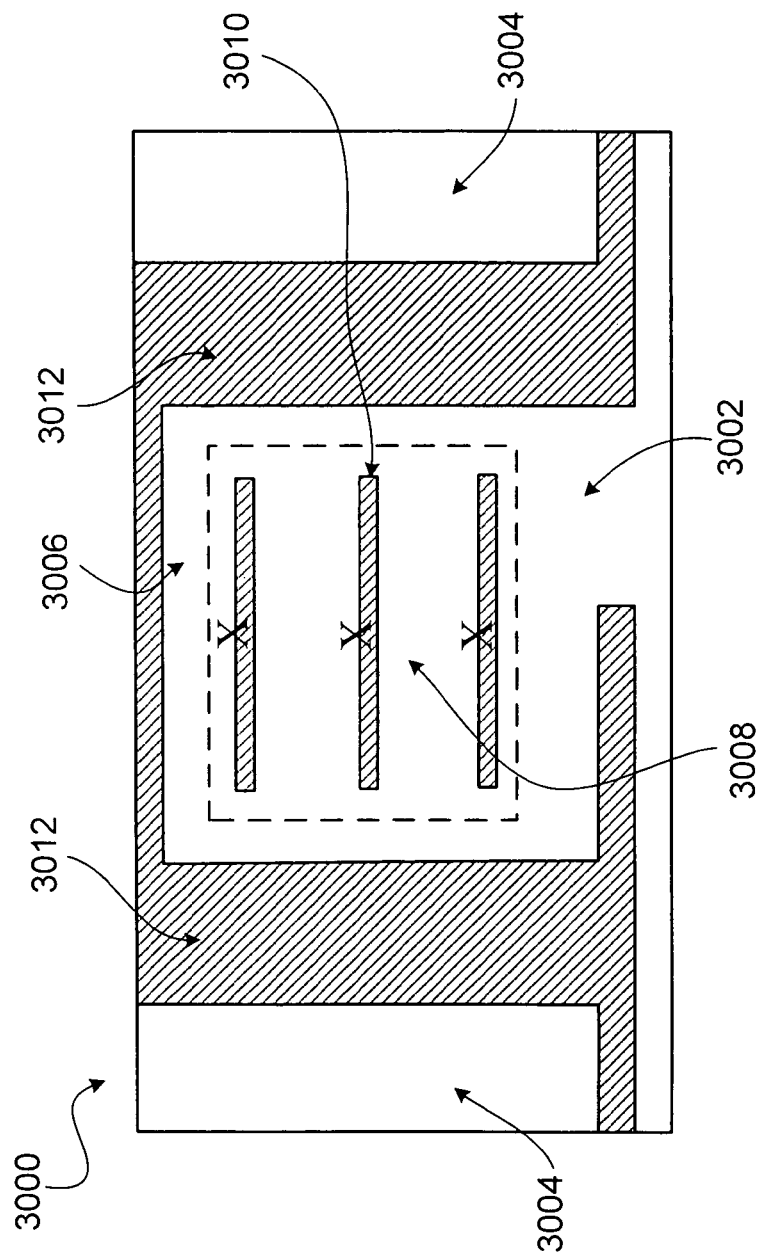
FIG. 61 is a diagram of a package.
Like reference symbols in the various drawings indicate like elements.

FIG. 61 shows a package 3000 that includes a first contact pad 3002, second contact pads 3004, a die outline 3006, dispense regions 3008, wire bonds 3010 and electrical isolation regions 3012. The die attach process includes wire bonding wire bonds 3010 on the surface of first contact pad 3002 of package 3000, dispensing die attach material at regions 3008, mechanically compressing the die and package, and thermally cycling the system. Wire bonds can additionally be made from second contact pads 3004 to the die.

Without wishing to be bound by theory, it is believed that using wire bonding for the spacer may lead to a manufacturing process with higher throughput, greater accuracy, higher yield, and/or an overall lower cost of packaging. In addition, since wire bonding may be used to create electrical connections between various components (e.g., to connect the terminal on the die to a terminal on the package) the use of additional equipment can be avoided when generating a wire bond spacer.

While in the embodiments described above, the die is attached to a package, similar embodiments exist for die attach directly to a core board, a printed circuit board, or a heat sink.

In an alternative implementation, the light emitted by the light-generating region 130 is UV (or violet, or blue) and the phosphor layer 180 includes a mixture of a red phosphor material (e.g., $L_2O_2S:Eu^{3+}$), a green phosphor material (e.g, ZnS:Cu,Al,Mn), and blue phosphor material (e.g, $(Sr,Ca,Ba,Mg)_{10}(PO_4)_6Cl:Eu^2$).

Other embodiments are in the claims.

What is claimed is:

1. A system comprising:
a light emitting device including:
a multi-layer stack of materials including a light generating region, and a first layer supported by the light generating region, a surface of the first layer being configured so that light generated by the light generating region can emerge from the light emitting device via a surface of the first layer, a shape of a surface of the multi-layer stack being rectangular and the surface of the first layer having a dielectric function that varies spatially according to a pattern; and
at least one electrical contact pad disposed along an edge of the surface of the first layer; and
a package having a first surface and a second surface opposite the first surface, the package including:
a plurality of plated regions for providing electrical contact to the light emitting device; and
a plurality of wire bonds connected between the plated regions and the at least one electrical contact pad.

2. The system of claim 1, wherein the plurality of wire bonds includes at least about 5 wire bonds.

3. The system of claim 1, wherein the plurality of wire bonds includes at least about 10 wire bonds.

4. The system of claim 1, wherein the plurality of wire bonds includes at least about 25 wire bonds.

5. The system of claim 1, wherein the plurality of wire bonds includes at least about 50 wire bonds.

6. The system of claim 1, wherein an aspect ratio of the surface of the multi-layer stack is about 4×3.

7. The system of claim 1, wherein the aspect ratio of the surface of the multi-layer stack is about 16×9.

8. The system of claim 1, wherein the package further comprises a light emitting panel.

9. The system of claim 1, wherein the package is mounted on a heat sink device.

10. The system of claim 1, wherein the package is mounted on a core board.

11. The device of claim 1, wherein the light emitting device is a light emitting diode.

12. The device of claim 1, wherein the light emitting device is a surface emitting laser.

13. The system of claim 11, wherein an aspect ratio of the surface of the first layer is about 4×3.

14. The system of claim 11, wherein an aspect ratio of the surface of the first layer is about 16×9.

15. The device of claim 1, wherein the package further comprises a plurality of castellations to provide electrical contact from the first surface of the package to the second surface of the package.

16. The device of claim 11, wherein the light emitting diode is a photonic lattice light emitting diode.

17. The system of claim 16, wherein an aspect ratio of the surface of the first layer is about 4×3.

18. The system of claim 16, wherein an aspect ratio of the surface of the first layer is about 16×9.

* * * * *